United States Patent
Song et al.

(10) Patent No.: US 10,115,797 B2
(45) Date of Patent: Oct. 30, 2018

(54) FINFET SEMICONDUCTOR DEVICE AND METHOD OF MANUFACTURING THE SAME

(71) Applicant: Samsung Electronics Co., Ltd., Suwon-si (KR)

(72) Inventors: Jae-yeol Song, Seoul (KR); Wan-don Kim, Yongin-si (KR); Sang-Jin Hyun, Suwon-si (KR); Jin-wook Lee, Seoul (KR); Kee-sang Kwon, Hwaseong-si (KR); Ki-hyung Ko, Yongin-si (KR); Sung-woo Myung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/059,673

(22) Filed: Mar. 3, 2016

(65) Prior Publication Data

US 2016/0308012 A1    Oct. 20, 2016

(30) Foreign Application Priority Data

Apr. 17, 2015 (KR) .......................... 10-2015-0054494

(51) Int. Cl.
| | | |
|---|---|---|
| H01L 27/092 | (2006.01) | |
| H01L 29/423 | (2006.01) | |
| H01L 29/78 | (2006.01) | |
| H01L 27/088 | (2006.01) | |
| H01L 29/66 | (2006.01) | |

(Continued)

(52) U.S. Cl.
CPC .. *H01L 29/42376* (2013.01); *H01L 21/28088* (2013.01); *H01L 21/823431* (2013.01); *H01L 21/823456* (2013.01); *H01L 27/0886* (2013.01); *H01L 27/0924* (2013.01); *H01L 29/66545* (2013.01); *H01L 29/66795* (2013.01); *H01L 29/785* (2013.01)

(58) Field of Classification Search
CPC ............. H01L 27/0924; H01L 27/0886; H01L 27/10879; H01L 29/66795
See application file for complete search history.

(56) References Cited

U.S. PATENT DOCUMENTS 6,753,215 B2 * 6/2004 Kasuya ............. H01L 21/76897
257/E21.507
6,784,472 B2 * 8/2004 Iriyama ............. H01L 21/76895
257/288

(Continued)

FOREIGN PATENT DOCUMENTS

| KR | 1019980005646 | 3/1998 |
| KR | 101332104 | 11/2013 |
| KR | 101459198 | 11/2014 |

*Primary Examiner* — Phat X Cao
(74) *Attorney, Agent, or Firm* — Onello & Mello, LLP.

(57) ABSTRACT

In a semiconductor device including a gate line having a relatively narrow width and a relatively smaller pitch and a method of manufacturing the semiconductor device, the semiconductor device includes a substrate having a fin-type active region, a gate insulating layer that covers an upper surface and sides of the fin-type active region, and a gate line that extends and intersects the fin-type active region while covering the upper surface and the both sides of the fin-type active region, the gate line being on the gate insulating layer, wherein a central portion of an upper surface of the gate line in a cross-section perpendicular to an extending direction of the gate line has a concave shape.

16 Claims, 67 Drawing Sheets

(51) Int. Cl.
*H01L 21/8234* (2006.01)
*H01L 21/28* (2006.01)

(56) References Cited

U.S. PATENT DOCUMENTS

| | | | |
|---|---|---|---|
| 7,544,621 | B2 | 6/2009 | Chen et al. |
| 7,808,019 | B2 | 10/2010 | Lai |
| 8,193,641 | B2 | 6/2012 | Rachmady et al. |
| 8,377,771 | B2 | 2/2013 | Rachmady et al. |
| 8,436,404 | B2 | 5/2013 | Bohr et al. |
| 8,507,979 | B1 | 8/2013 | Huang et al. |
| 8,580,628 | B2 | 11/2013 | Labonte et al. |
| 8,685,817 | B1 | 4/2014 | Cai et al. |
| 8,741,757 | B2 | 6/2014 | Jagannathan et al. |
| 8,836,046 | B2 | 9/2014 | Maeda et al. |
| 9,054,178 | B2 | 6/2015 | Bohr et al. |
| 9,093,513 | B2 | 7/2015 | Bohr et al. |
| 2005/0048732 | A1 | 3/2005 | Park et al. |
| 2013/0244392 | A1* | 9/2013 | Oh .................... H01L 29/66477 438/299 |
| 2014/0103403 | A1 | 4/2014 | Kim et al. |
| 2014/0213048 | A1* | 7/2014 | Sun ....................... H01L 29/401 438/592 |
| 2014/0252496 | A1* | 9/2014 | Liu ................... H01L 21/28587 257/401 |
| 2015/0021694 | A1* | 1/2015 | Trevino .......... H01L 21/823821 257/368 |
| 2015/0228793 | A1* | 8/2015 | Chen ................. H01L 29/7851 257/401 |
| 2016/0104704 | A1* | 4/2016 | Fang .................. H01L 29/4966 257/392 |
| 2016/0155837 | A1* | 6/2016 | Lee .................... H01L 29/1608 257/288 |

\* cited by examiner

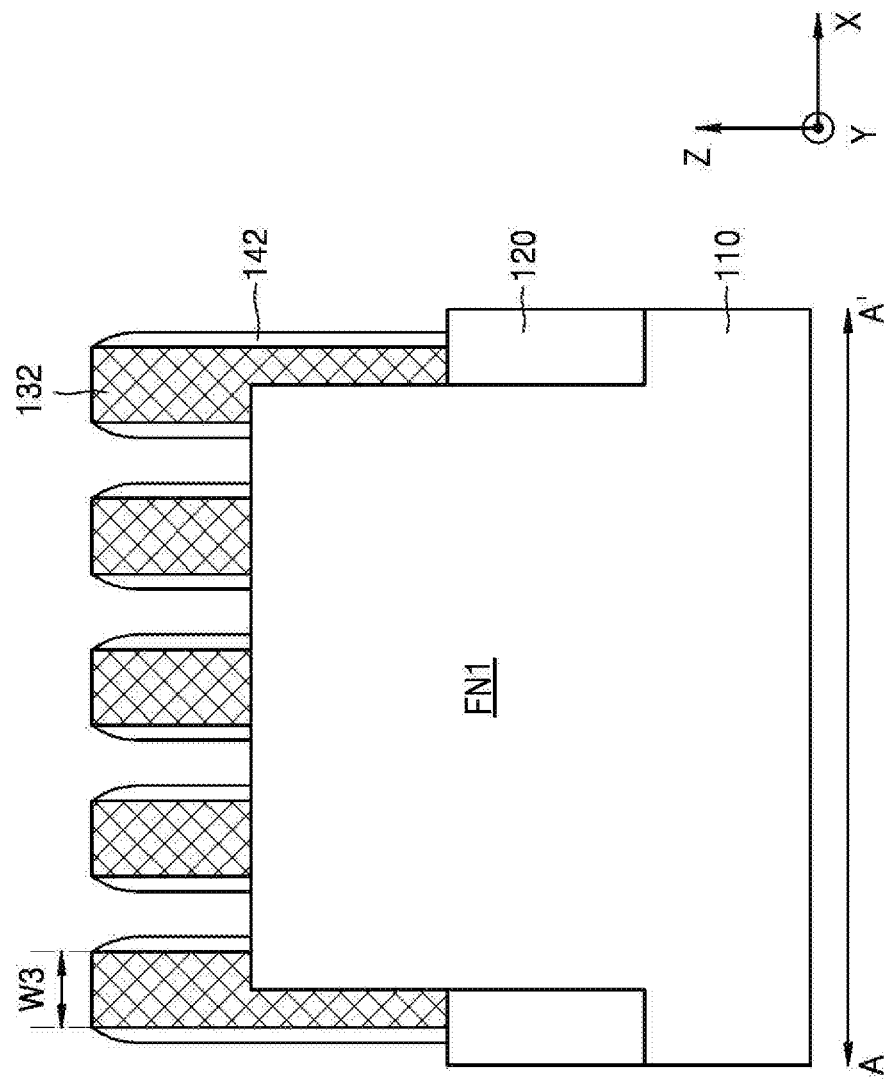

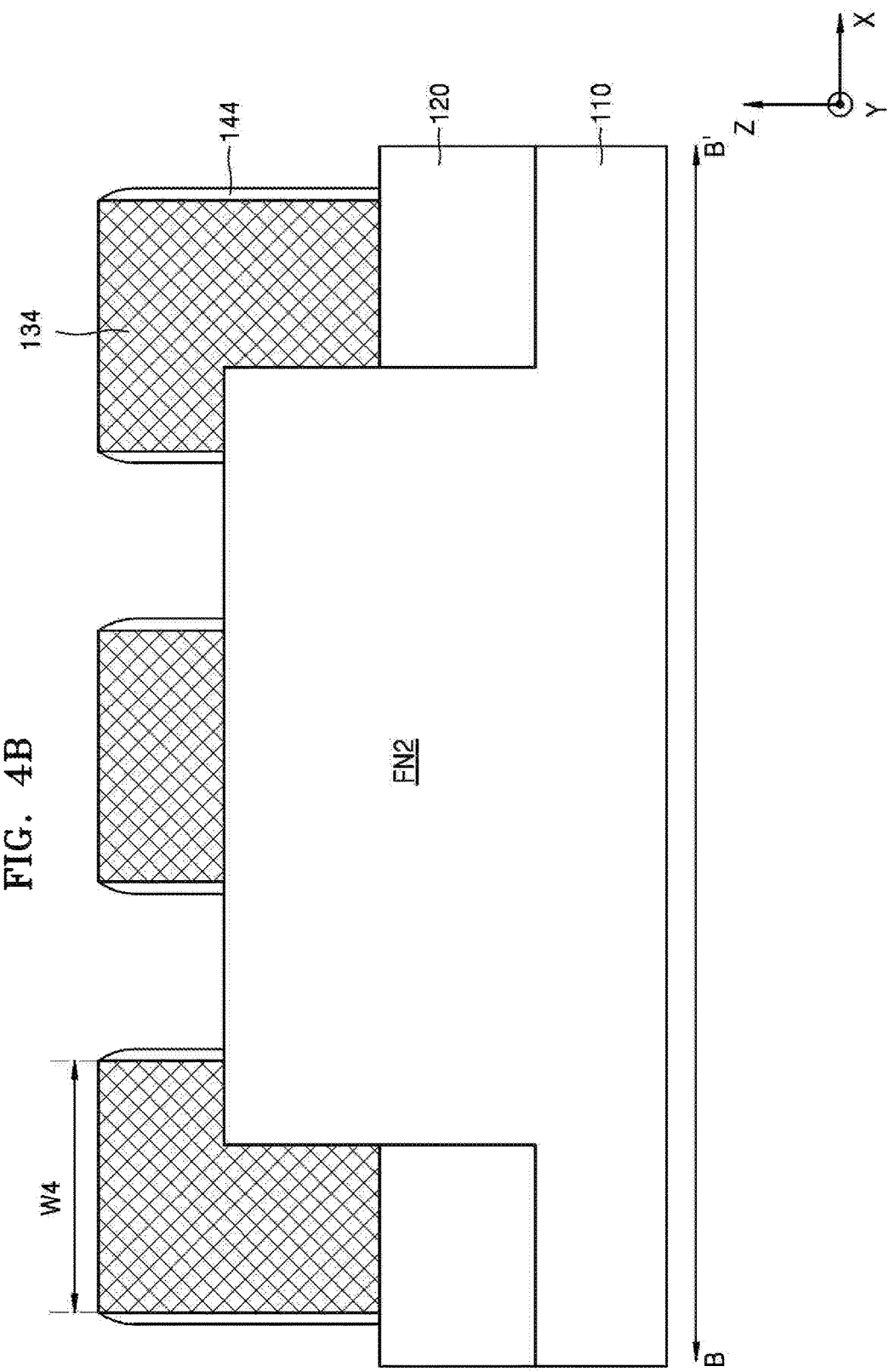

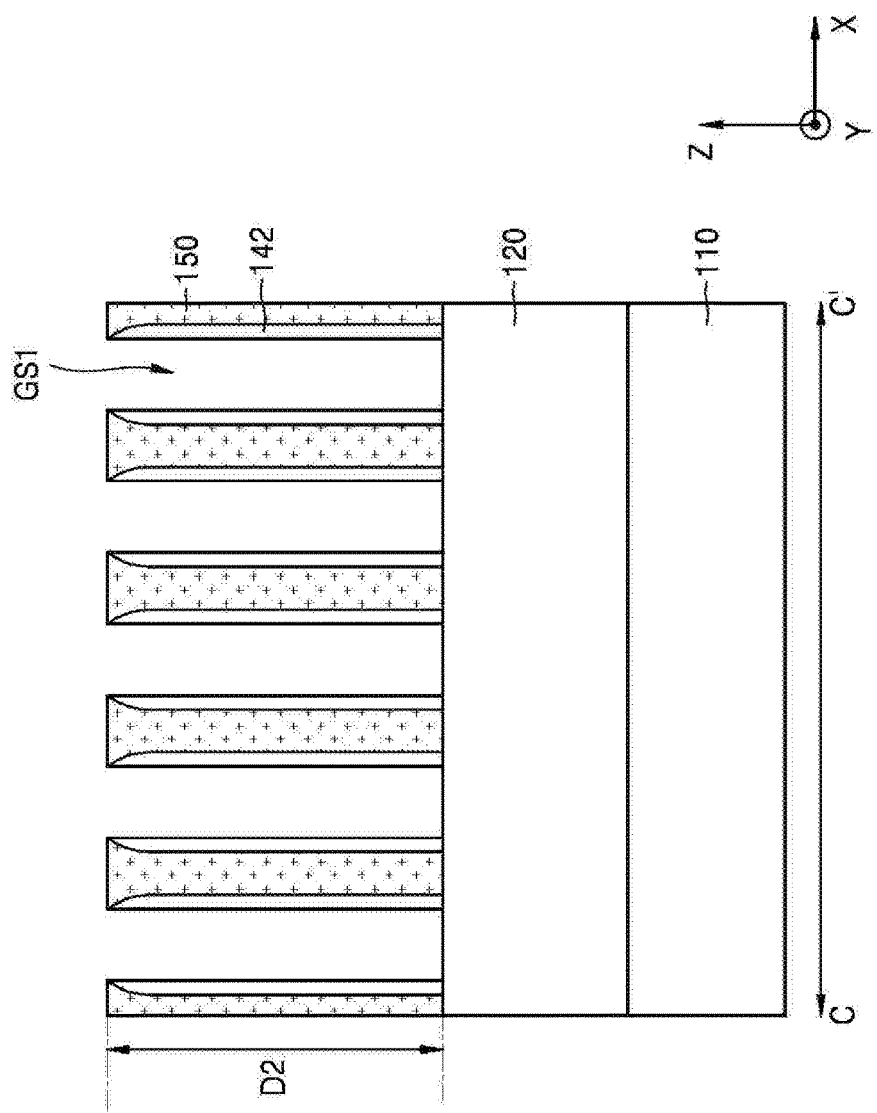

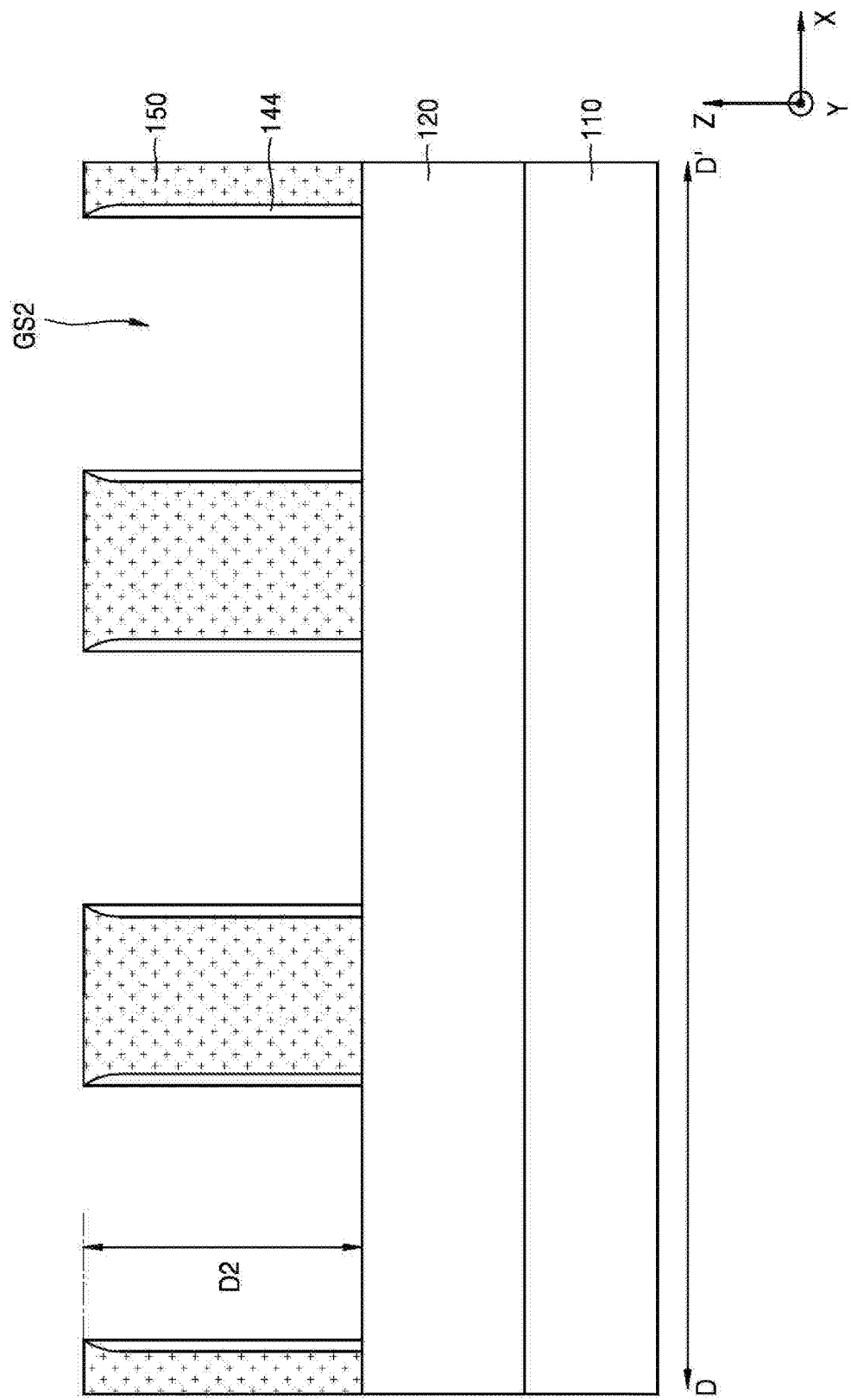

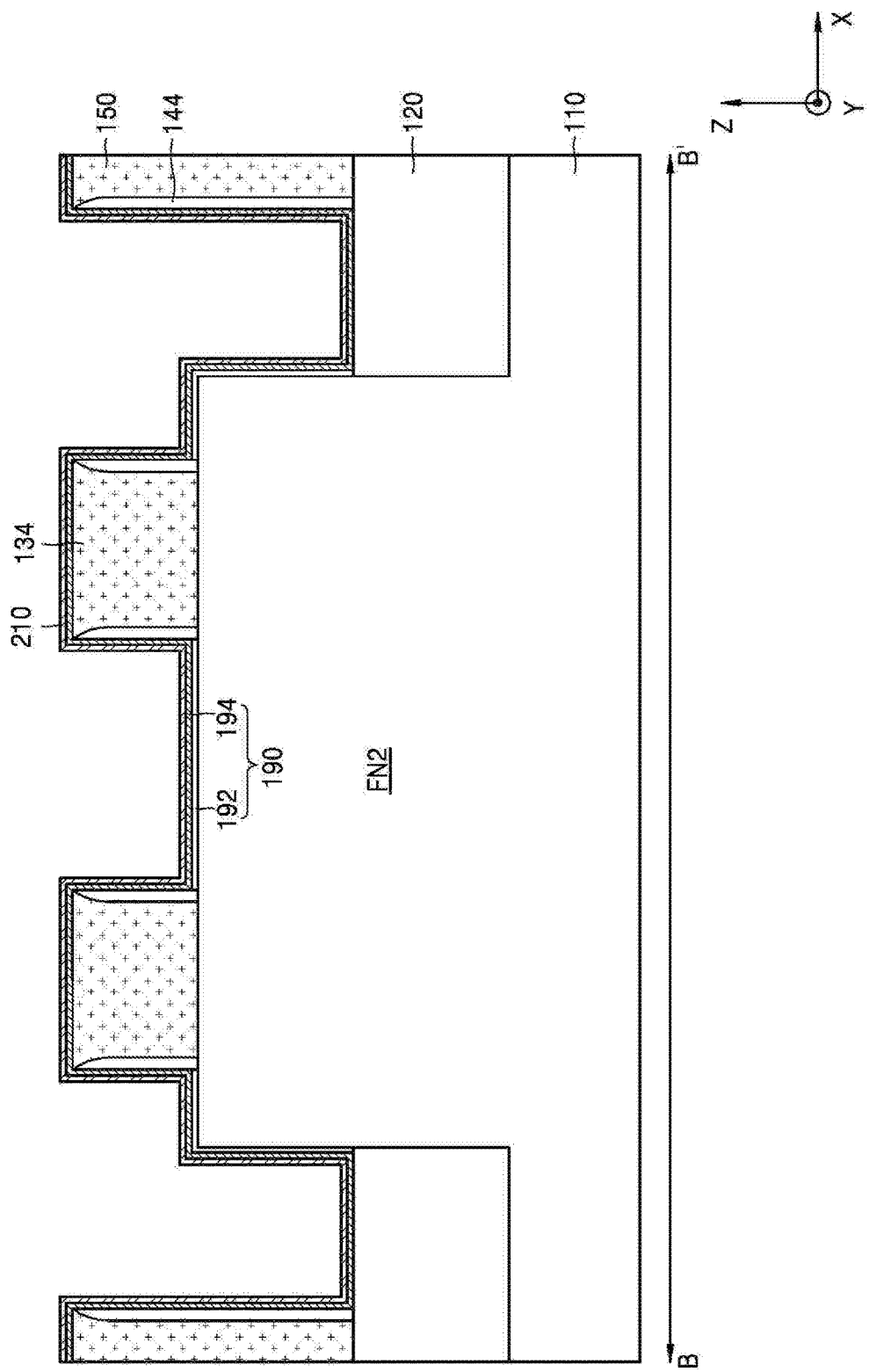

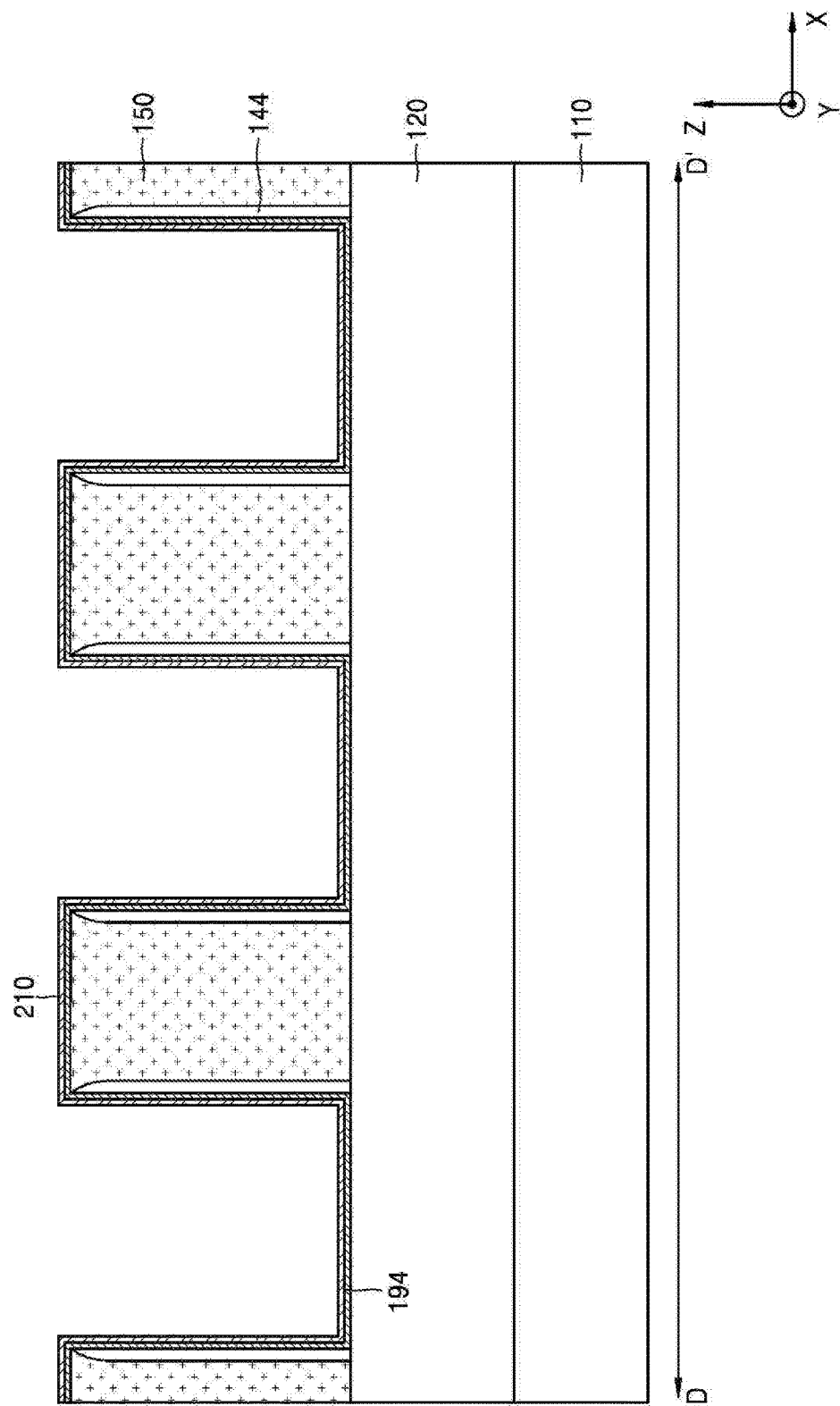

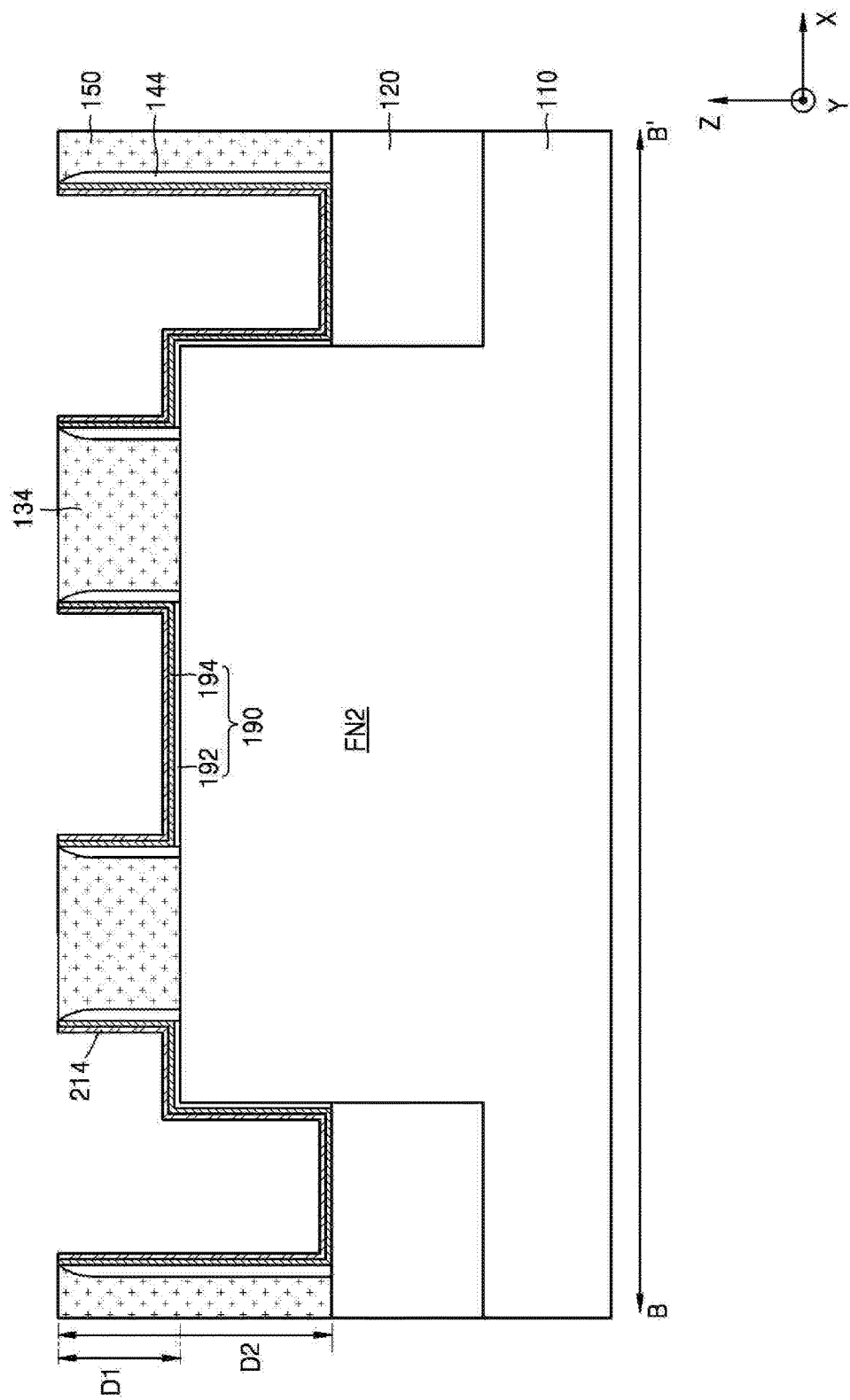

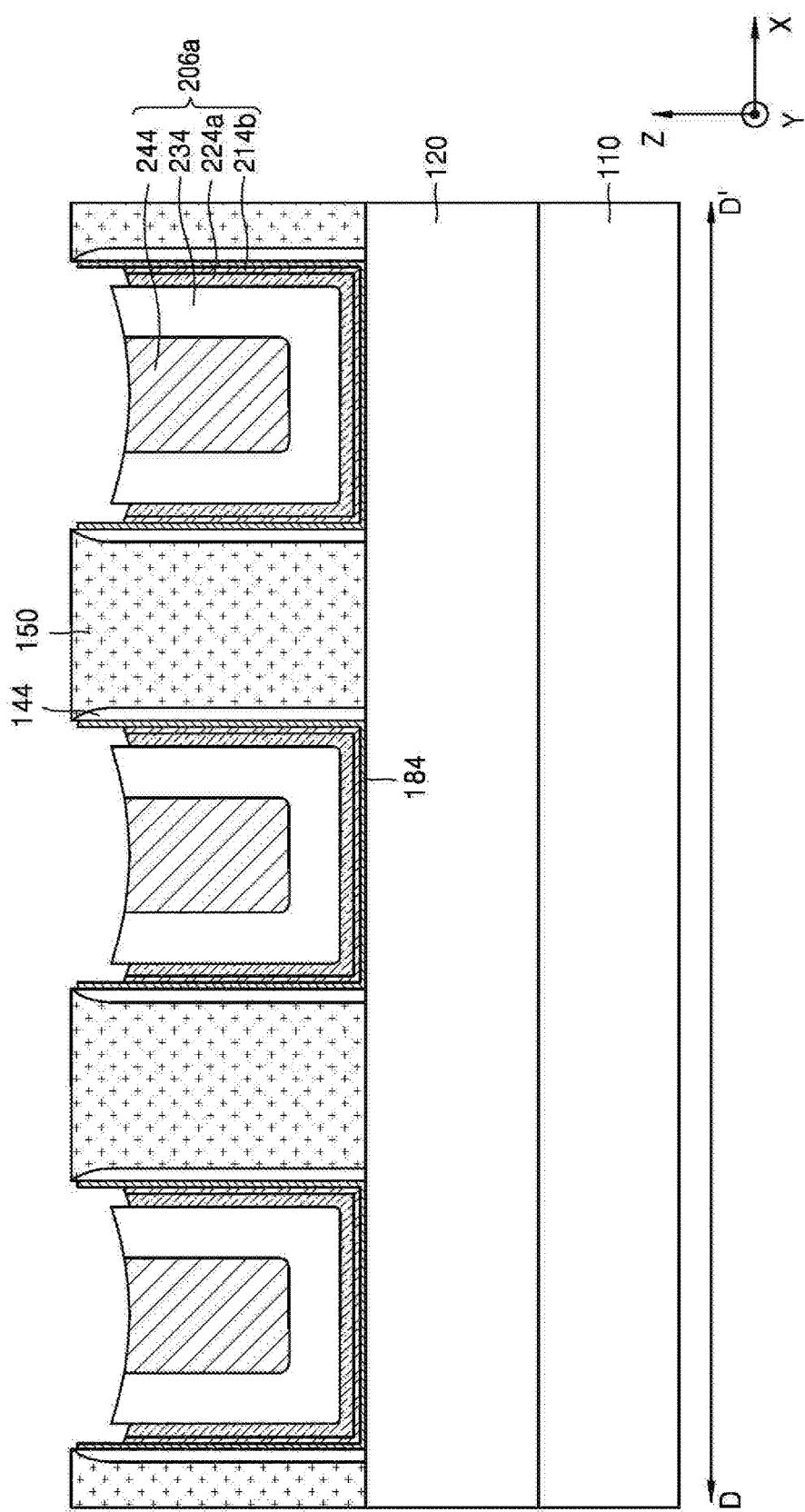

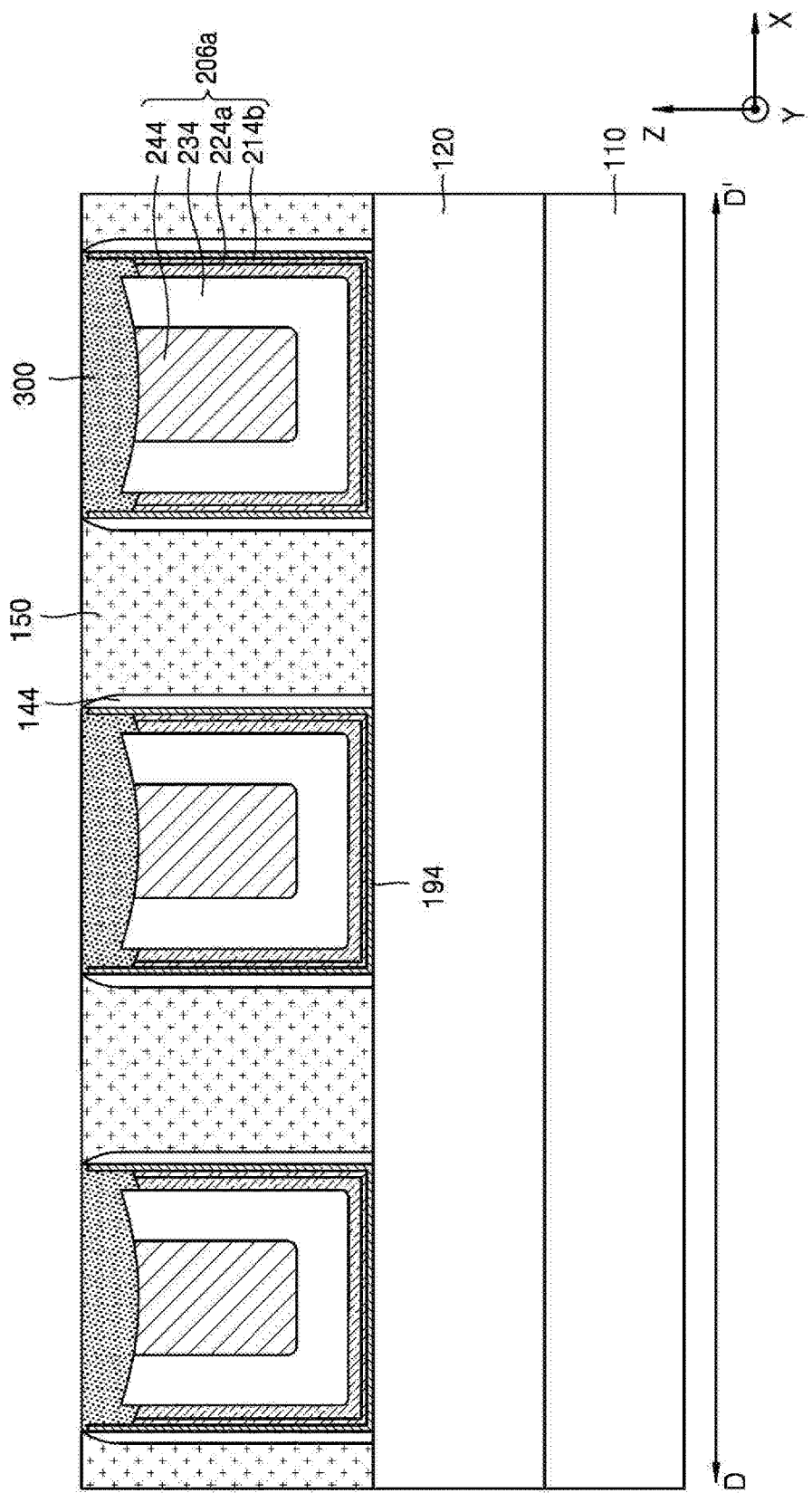

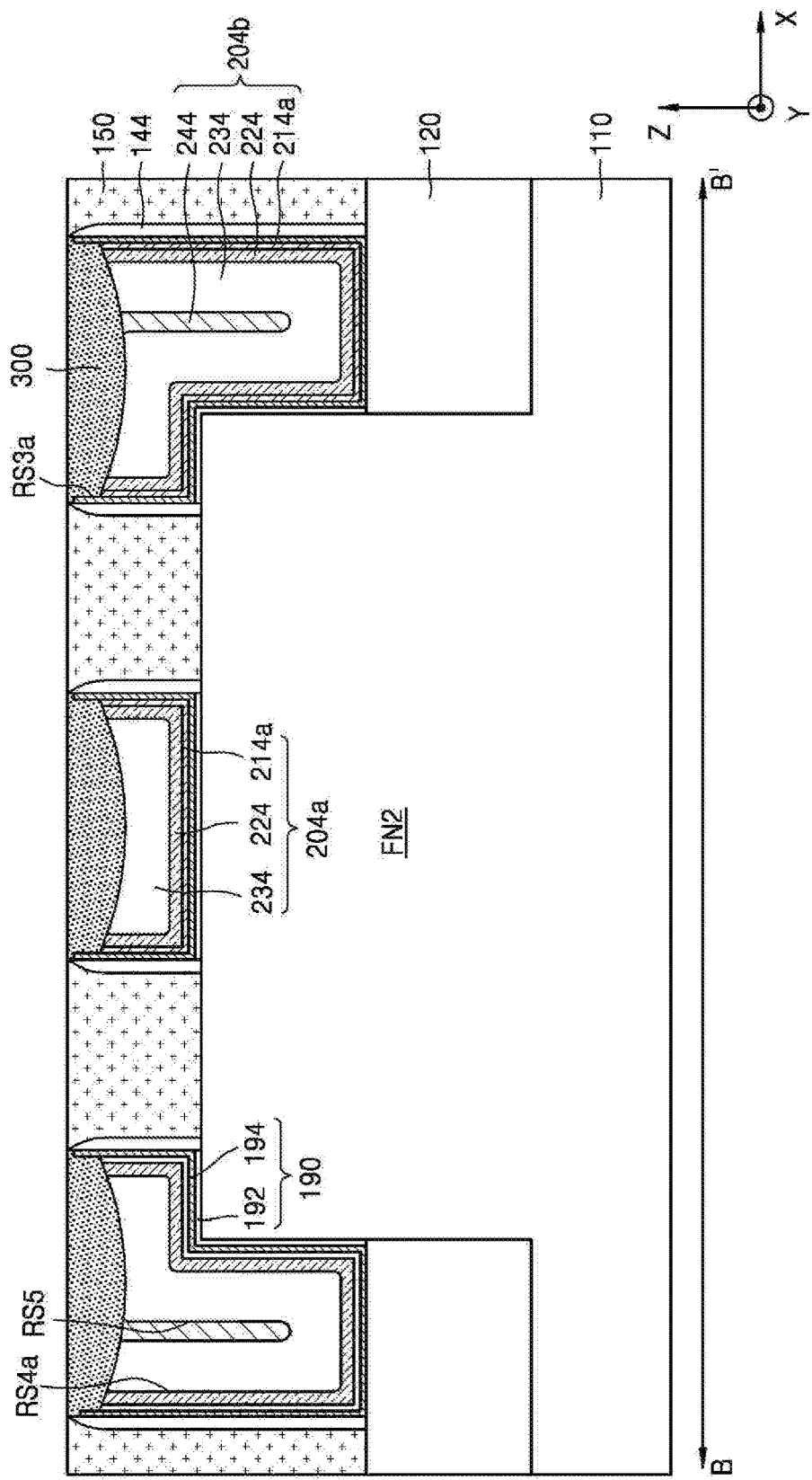

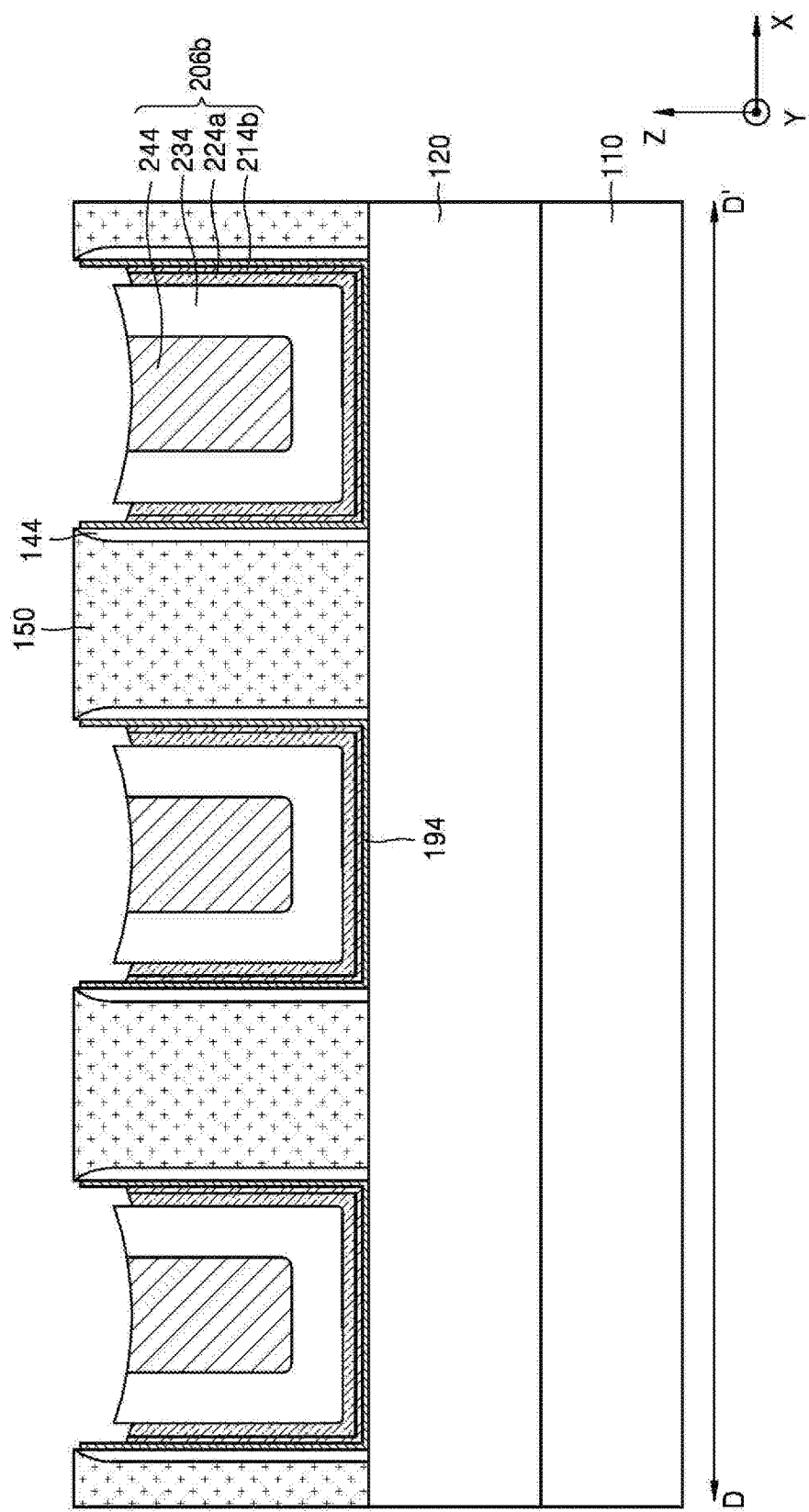

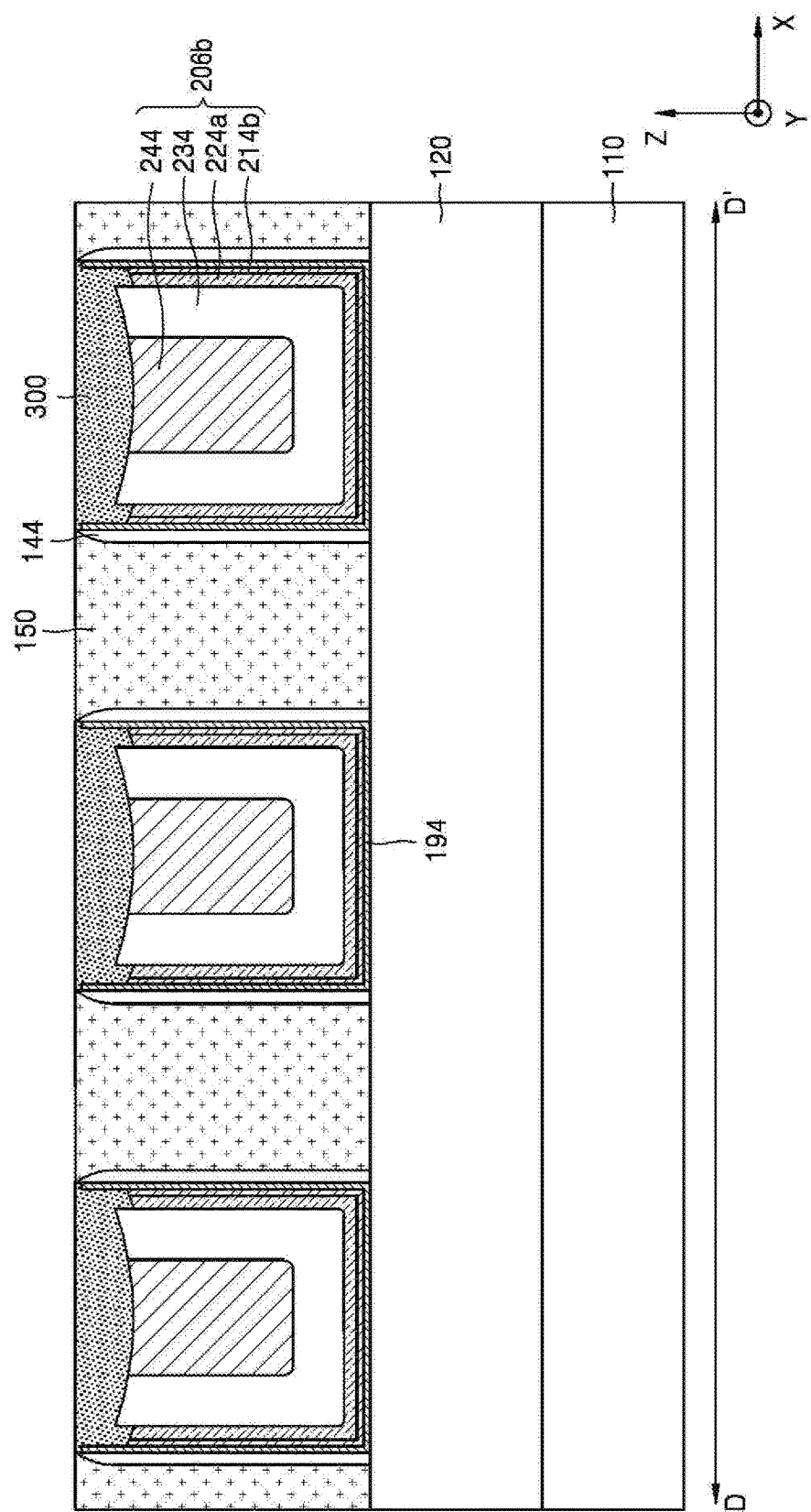

FINFET SEMICONDUCTOR DEVICE AND METHOD OF MANUFACTURING THE SAME

CROSS-REFERENCE TO RELATED APPLICATION

This application claims the benefit of Korean Patent Application No. 10-2015-0054494, filed on Apr. 17, 2015, in the Korean Intellectual Property Office, the disclosure of which is incorporated herein in its entirety by reference.

BACKGROUND

The inventive concepts relate to a semiconductor device, and more particularly, to a semiconductor device including a gate line having a relatively narrow width and a relatively reduced pitch and a method of manufacturing the semiconductor device.

The reduction of pattern sizes is often times desired in the manufacture of highly integrated semiconductor devices. The integration of a large number of devices into a small area, requires a reduction in the size of discrete devices. To this end, it is necessary to reduce the device pitch, that is equal to the sum of the width of each of patterns to be formed, and to reduce the interval between the patterns. As the design rules of semiconductor devices continue to undergo further reduction, there are certain limits in the formation of a reliable gate line having such a fine pitch.

SUMMARY

The inventive concepts provide a semiconductor device including a reliable gate line having a fine pitch.

The inventive concepts also provide a method of manufacturing the semiconductor device.

According to an aspect of the inventive concepts, there is provided a semiconductor device including: a substrate having a fin-type active region; a gate insulating layer that covers at least a portion of an upper surface and side portions of the fin-type active region; and a gate line that extends and intersects the fin-type active region while covering at least the portion of the upper surface and the side portions of the fin-type active region, the gate line being on the gate insulating layer, wherein a central portion of an upper surface of the gate line in a cross-section perpendicular to an extending direction of the gate line has a concave shape.

The semiconductor device may further include a pair of gate spacer layers that contact the side portions of the gate line, wherein the gate insulating layer may extend from between the fin-type active region and the gate line to between the pair of gate spacer layers and the gate line.

The gate line may include: a first gate electrode layer that extends while covering the upper surface and the side portions of the fin-type active region and sides of the pair of gate spacer layers, the sides of the pair of gate space layers facing each other and the first gate electrode layer defining a recess space; and a second gate electrode layer that extends while filling the recess space.

A central portion of the second gate electrode layer in a cross-section perpendicular to an extending direction of the gate line may have a level lower than that of an outer portion thereof with respect to the substrate.

A part of an upper surface of the first gate electrode layer, the part being adjacent to the gate insulating layer, may have a level higher than that of a part adjacent to the second gate electrode layer with respect to the substrate.

The upper surface of the first gate electrode layer and an upper surface of the second gate electrode layer may form a continuous surface.

A level of the continuous surface with respect to the substrate may be gradually reduced from a part adjacent to the second gate insulating layer to a central portion of the second gate electrode layer.

The gate line may have an irregular shape in which the second gate electrode layer protrudes from the first gate electrode layer in the vertical direction.

An upper surface of the second gate electrode layer may have a level higher than that of an upper surface of the first gate electrode layer with respect to the substrate.

A central portion of the second gate electrode layer may have a seam that extends from an upper surface of the second gate electrode layer to an inner region thereof.

The seam of the second gate electrode layer may extend from the lowest level of the upper surface of the second gate electrode layer to an inner region thereof.

The gate line may further include a barrier layer between the first gate electrode layer and the gate spacer layer.

A top portion of the barrier layer may have a level lower than those of upper surfaces of the first and second gate electrode layers.

An upper portion of the second gate electrode layer may have a width greater than that of a lower portion of the second gate electrode layer.

The upper surface of the gate line may have a level lower than those of the tops of the pair of gate spacer layers, wherein the semiconductor device may further include an insulating gate capping layer formed on the gate line and having an upper surface whose level is same as those of the tops of the pair of gate spacer layers.

The gate insulating layer may extend from between the pair of gate spacer layers and the gate line to between the pair of gate spacer layers and the insulating gate capping layer.

The top of the gate insulating layer may have a level lower than that of an upper surface of the insulating gate capping layer.

The top of the gate insulating layer may have a level higher than that of an upper surface of the gate line.

The gate capping layer may contact at least a portion of the side of the second gate electrode layer.

A portion of the gate capping layer may be between an upper portion of the second gate electrode layer and the gate insulating layer in a horizontal direction with respect to a main surface of the substrate.

According to another aspect of the inventive concepts, there is provided a semiconductor device including: a substrate having a fin-type active region; a device isolation layer on the substrate, the device isolation layer covering a lower portion of the fin-type active region; a pair of gate spacer layers that extend while intersecting the fin-type active region, the pair of gate spacer layers being on the device isolation layer and the substrate; a gate insulating layer that has a uniform thickness and covers at least a portion of each of sides of the pair of gate spacer layers, the pair of gate spacer layers facing each other, and an upper surface and both sides of the fin-type active region, the gate insulating layer positioned between the pair of gate spacer layers; and a gate line that extends between the pair of gate spacer layers, the gate line being on the gate insulating layer, wherein the gate line may include: a first gate electrode layer that extends while covering the at least a portion of the each of the sides of the pair of gate spacer layers and the upper surface and the both sides of the fin-type active region, the first gate electrode layer defining a recess space; and a second gate electrode layer that extends while filling the recess space, wherein a central portion of the second gate electrode layer in a cross-section perpendicular to an extending direction of the gate line has a level lower than that of an outer portion thereof with respect to the substrate.

An upper surface of the first gate electrode layer and an upper surface of the second gate electrode layer may form a continuous surface, and a top of the first gate electrode layer may have a level higher than that of the top of the second gate electrode layer.

An upper surface of the second gate electrode layer may have a level higher than that of an upper surface of the first gate electrode layer with respect to the substrate, so that the second gate electrode layer has an irregular shape protruding from the first gate electrode layer.

As each of upper surfaces of the first and second gate electrode layers is further away from the sides of the pair of gate spacer layers, each of the upper surfaces of the first and second gate electrode layers may have a relatively low level.

The second gate electrode layer may have a seam that extends from the lowest level of an upper surface of the second gate electrode layer to an inner region thereof.

According to another aspect of the inventive concepts, there is provided a method of manufacturing a semiconductor device, the method including: preparing a substrate having a fin-type active region; forming a dummy gate line that extends and intersects the fin-type active region while covering at least a portion of an upper surface and sides of the fin-type active region; forming a pair of gate spacer layers that contacts the sides of the dummy gate line; removing the dummy gate line; forming a gate material layer that covers the substrate and fills a space between the pair of gate spacer layers from which the dummy gate line is removed; and forming a gate line, which extends along the space between the pair of gate spacer layers and has a level lower than those of the tops of the pair of gate spacer layers, by removing a portion of the gate material layer, wherein a central portion of an upper surface of the gate line in a cross section perpendicular to an extending direction of the gate line has a concave shape.

The forming of a gate material layer may include: forming a first gate material layer that covers the substrate and defines a recess space in a space between the pair of gate spacer layers; and forming a second gate material layer that covers the first gate material layer and fills the recess space, wherein the gate line may include a first gate electrode layer, which is a portion of the first gate material layer, and a second gate electrode layer, which is a portion of the second gate material layer, wherein the forming of a gate line may include removing a portion of the first gate material layer and a portion of the second gate material layer at same time so that an upper surface of the first gate electrode layer and an upper surface of the second gate electrode layer form a continuous surface.

The method may further include further removing an upper portion of the first gate electrode layer so that the upper surface of the first gate electrode layer has a level lower than that of the upper surface of the second gate electrode layer, with respect to the substrate.

The forming of a gate line may include removing a portion of the first gate material layer and a portion of the second gate material layer so that as each of the upper surfaces of the first and second gate electrode layers is further away from the sides of the pair of gate spacer layers, the sides of the pair of gate space layers facing each other, each of the upper surfaces of the first and second gate electrode layers has a relatively low level.

The second gate electrode layer may have a seam that extends from the lowest level of the upper surface of the second gate electrode layer to the inside thereof.

According to another aspect of the inventive concepts, there is provided a semiconductor device comprising: a substrate having a plurality of fin-type active regions protruding in a vertical direction relative to a primary surface of the substrate, the fin-type active regions each extending in a first horizontal direction; a gate insulating layer that covers at least a portion of an upper surface and side portions of the fin-type active regions; and a gate line that extends in a second horizontal direction transverse the first horizontal direction, the gate line intersecting the plurality of fin-type active regions and covering the gate insulating layer on at least the portion of the upper surface and the side portions of the fin-type active region. The gate line may have a first portion having a first width and a second portion having a second width, the second width being less than the first width, and the second portion of the gate line positioned on the first portion of the gate line. An upper surface of the first portion of the gate line may have a concave cross-section in the first horizontal direction so that an inner region of the upper surface of the first portion of the gate line is lower in vertical position relative to an outer edge region thereof, and an upper surface of the second portion of the gate line has a concave cross-section in the first horizontal direction so that an inner region of the upper surface of the second portion of the gate line is lower in vertical position relative to an outer edge region thereof.

The second portion of the gate line may be positioned on the first portion of the gate line at a central region of the first portion of the gate line.

The first portion of the gate line and the second portion of the gate line may have a stepped cross-section in the first horizontal direction.

The semiconductor device may further comprise trench isolation structures between the plurality of fin-type active regions.

The semiconductor device may further comprise gate spacer layers at side portions of the gate line, wherein the gate insulating layer extends from between the fin-type active region and the gate line between the pair of gate spacer layers.

BRIEF DESCRIPTION OF THE DRAWINGS

Exemplary embodiments of the inventive concepts will be more clearly understood from the following detailed description taken in conjunction with the accompanying drawings in which:

FIG. 23 is a block diagram of an electronic system according to an exemplary embodiment of the inventive concepts.

DETAILED DESCRIPTION OF EMBODIMENTS

Figure 1A:
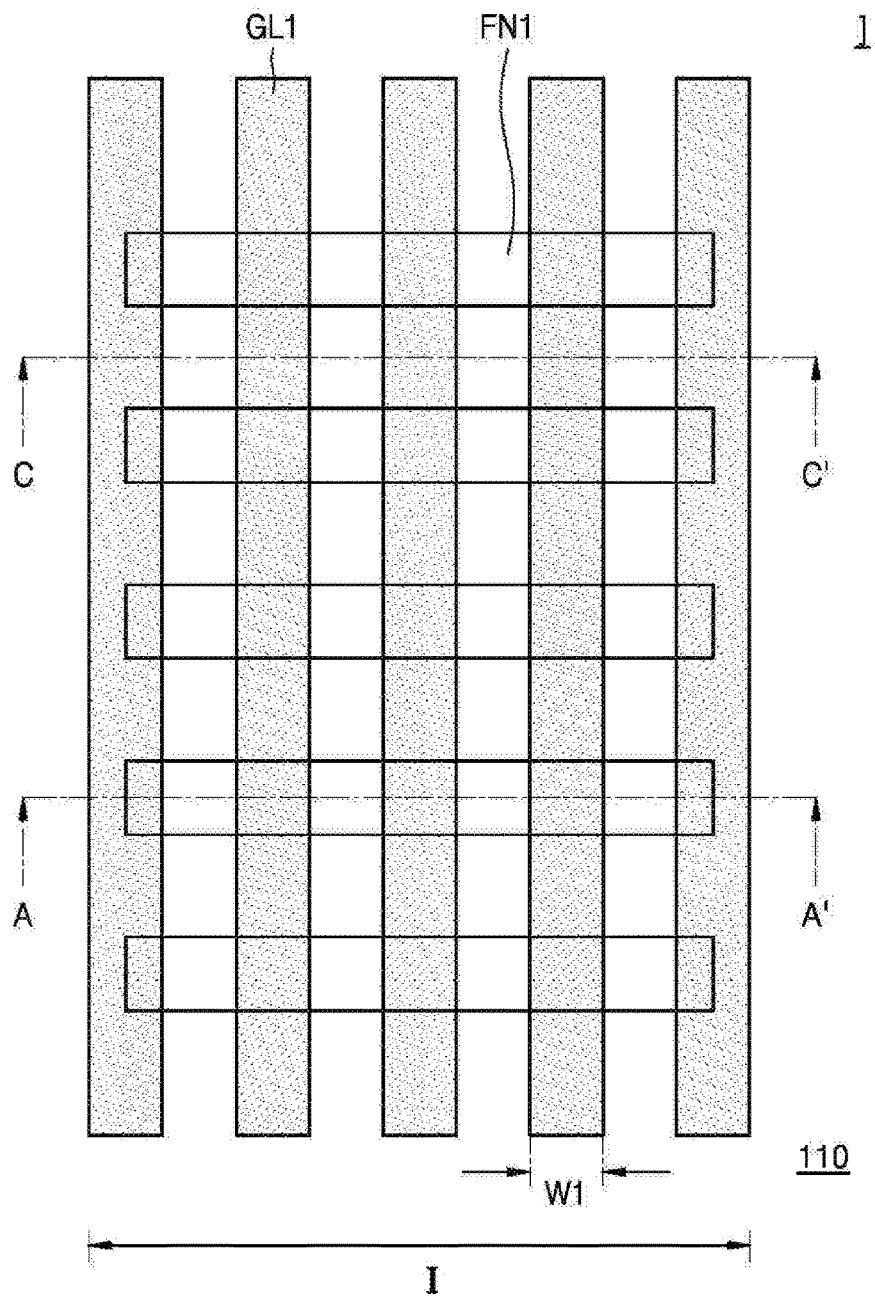
FIGS. 1A and 1B are plan layout diagrams of a main part of a semiconductor device according to an exemplary embodiment of the inventive concepts.

Reference will now be made in detail to exemplary embodiments, examples of which are illustrated in the accompanying drawings to help understanding the structure and effects of the inventive concept. However, exemplary embodiments are not limited to the embodiments illustrated hereinafter, and the exemplary embodiments herein are rather introduced to provide easy and complete understanding of the scope and spirit of exemplary embodiments. In the drawings, the sizes of constituting elements are exaggerated for clarity, and ratios of the respective constituting elements may be exaggerated, that is, greater or less than their actual values.

It will be understood that when an element, such as a layer, a region, or a substrate, is referred to as being "on," "connected to" or "coupled to" another element, it may be directly on, connected or coupled to the other element or intervening elements may be present. Other expressions, such as, "between" and "directly between", describing the relationship between the constituent elements, may be construed in the same manner.

The terms such as "first" and "second" are used herein merely to describe a variety of constituent elements, but the constituent elements are not limited by the terms. The terms are used only for the purpose of distinguishing one constituent element from another constituent element. For example, without departing from the right scope of the inventive concept, a first constituent element may be referred to as a second constituent element, and vice versa.

The singular form in the present specification includes the plural form unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those skilled in the art to which the inventive concept may pertain. As used herein, the term "and/or" includes any and all combinations of one or more of the associated listed items. Expressions such as "at least one of" when preceding a list of elements, modify the entire list of elements and do not modify the individual elements of the list.

Hereinafter, exemplary embodiments of the inventive concepts are described in detail in connection with attached drawings.

Figure 1B:
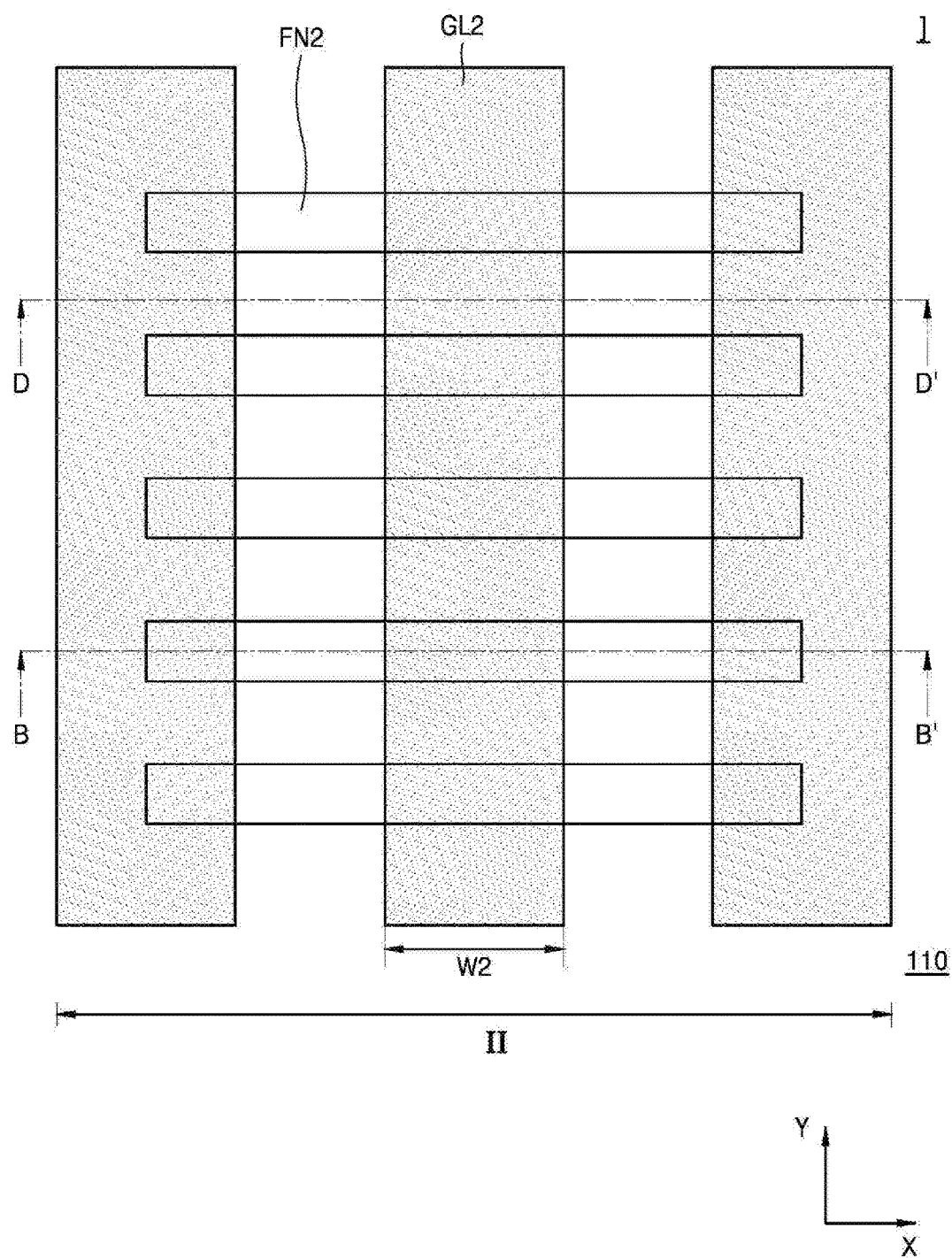

FIGS. 1A and 1B are plan layout diagrams of a main part of a semiconductor device 1 according to an exemplary embodiment of the inventive concepts.

Referring to FIGS. 1A and 1B, the semiconductor device 1 may include a substrate 110 having first and second fin-type active regions FN1 and FN2 (hereinafter, referred to as first and second active regions FN1 and FN2) and first and second gate lines GL1 and GL2 that extend and intersect, in a transverse direction, the first and second active regions FN1 and FN2, respectively.

In some embodiments, the substrate 110 has a first region I and a second region II. The first active region FN1 and the first gate line GL1 are formed in the first region I, and the second active region FN2 and the second gate line GL2 are formed in the second region II. The first region I and the second region II of the substrate 110 may be different regions in which different transistors have, respectively, different sizes, and particularly different gate electrode widths, may be formed. For example, a transistor formed in the second region II may have a higher operating voltage and a greater operating current as compared to a transistor formed in the first region I, or a transistor formed in the first region I may have a higher operating voltage and a greater operating current as compared to a transistor formed in the second region II.

In some embodiments, each of the first and second active regions FN1 and FN2 may have an elongated, bar, shape with a long axis in a first direction X. Although the present diagrams illustrate that the widths of the first and second active regions FN1 and FN2 in the direction of the short axis, i.e., in second direction Y, are equal to each other, the inventive concepts are not limited thereto. For example, the width of the second active region FN2 in the second direction Y may be greater than, or less than, that of the first active region FN1 in the second direction Y.

Figure 2A:
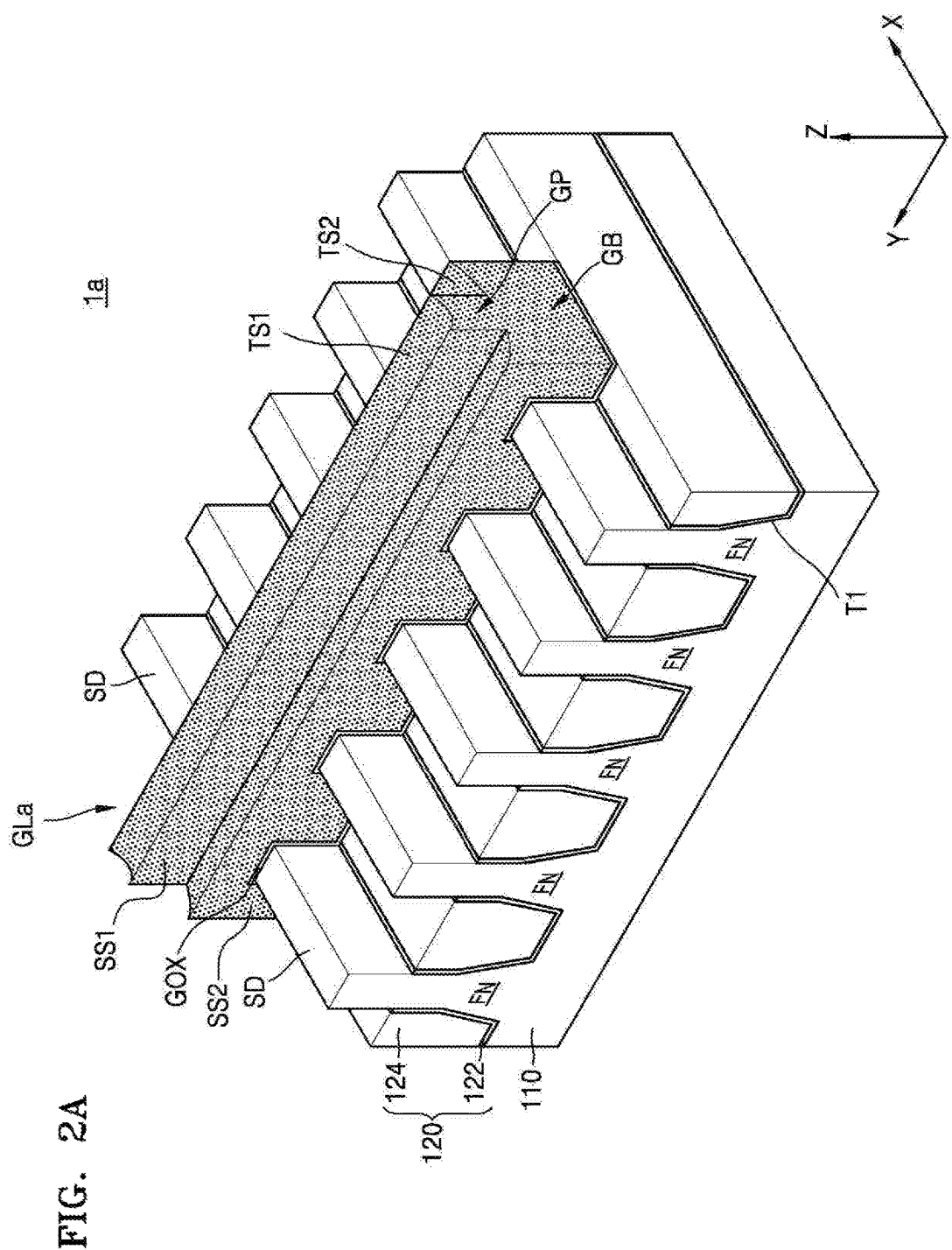
FIGS. 2A and 2B are perspective views of semiconductor devices according to exemplary embodiments of the inventive concepts.
Figure 2B:
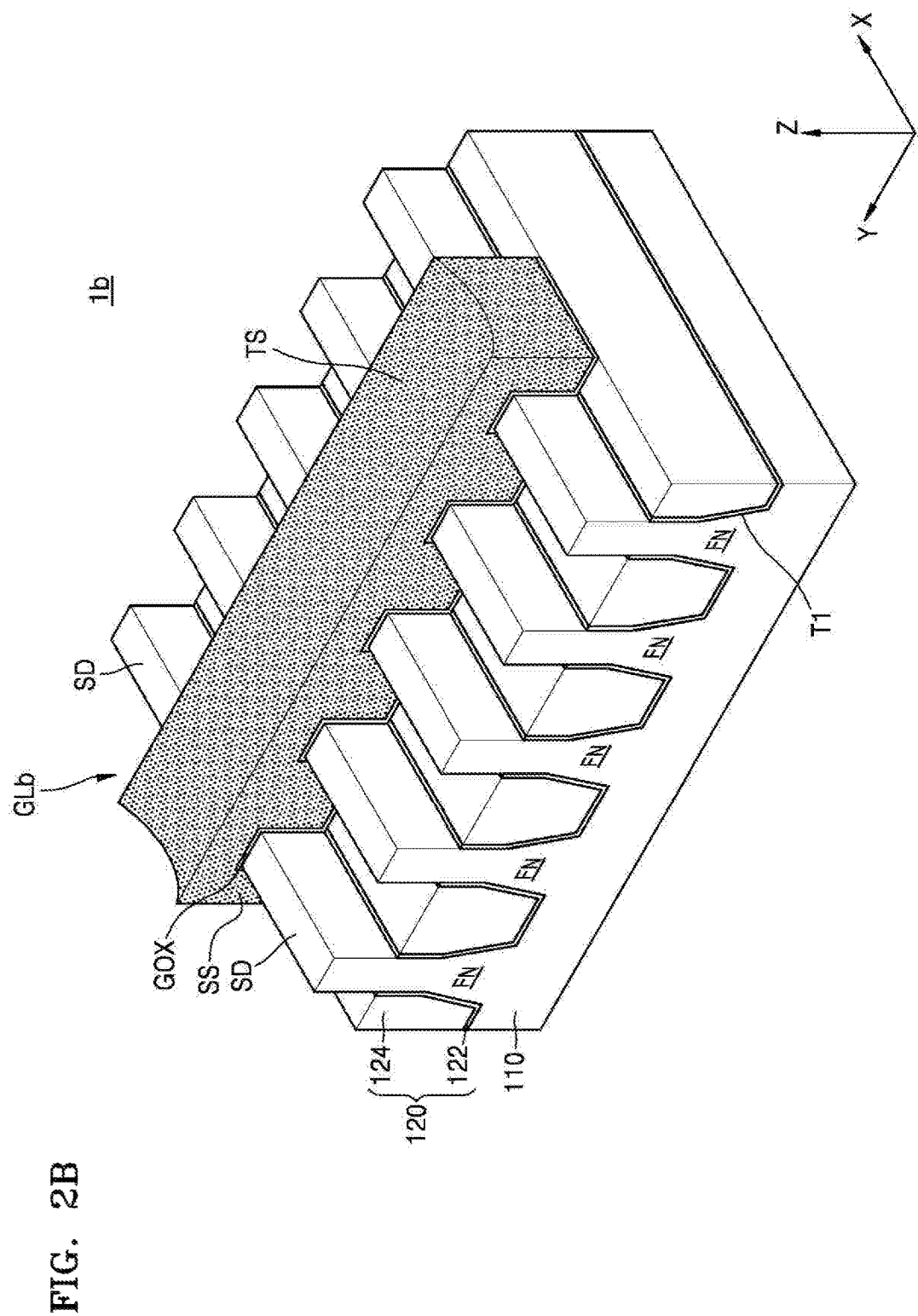
Figure 3A:
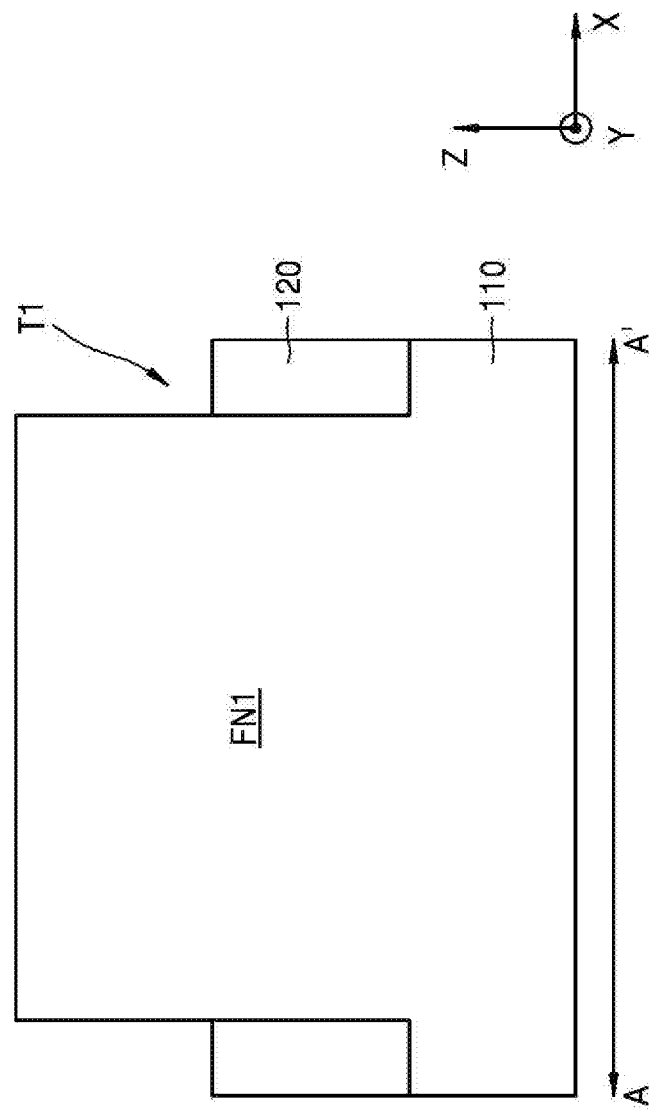
FIGS. 3A through 10D are cross-sectional views sequentially illustrating a method of manufacturing a semiconductor device, according to an exemplary embodiment of the inventive concepts.
Figure 3B:
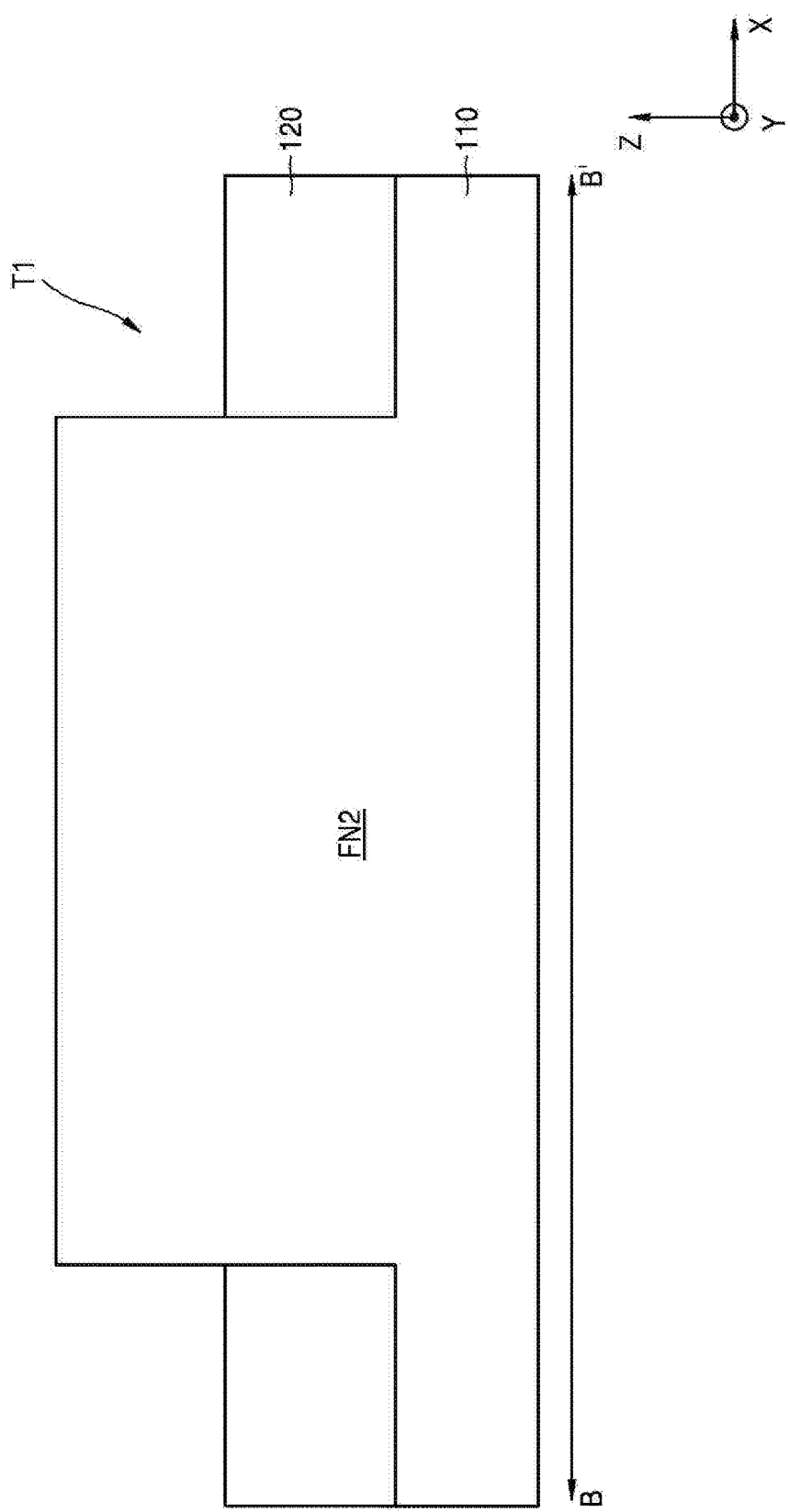
Figure 3C:
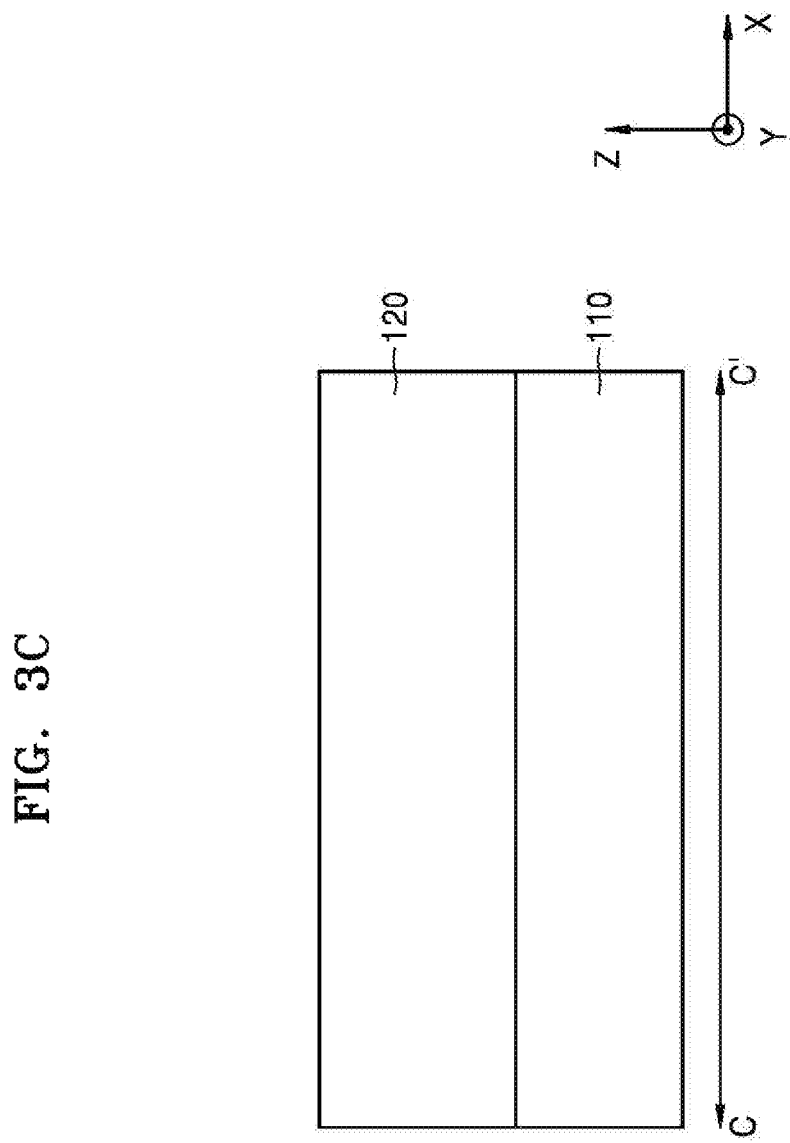
Figure 3D:
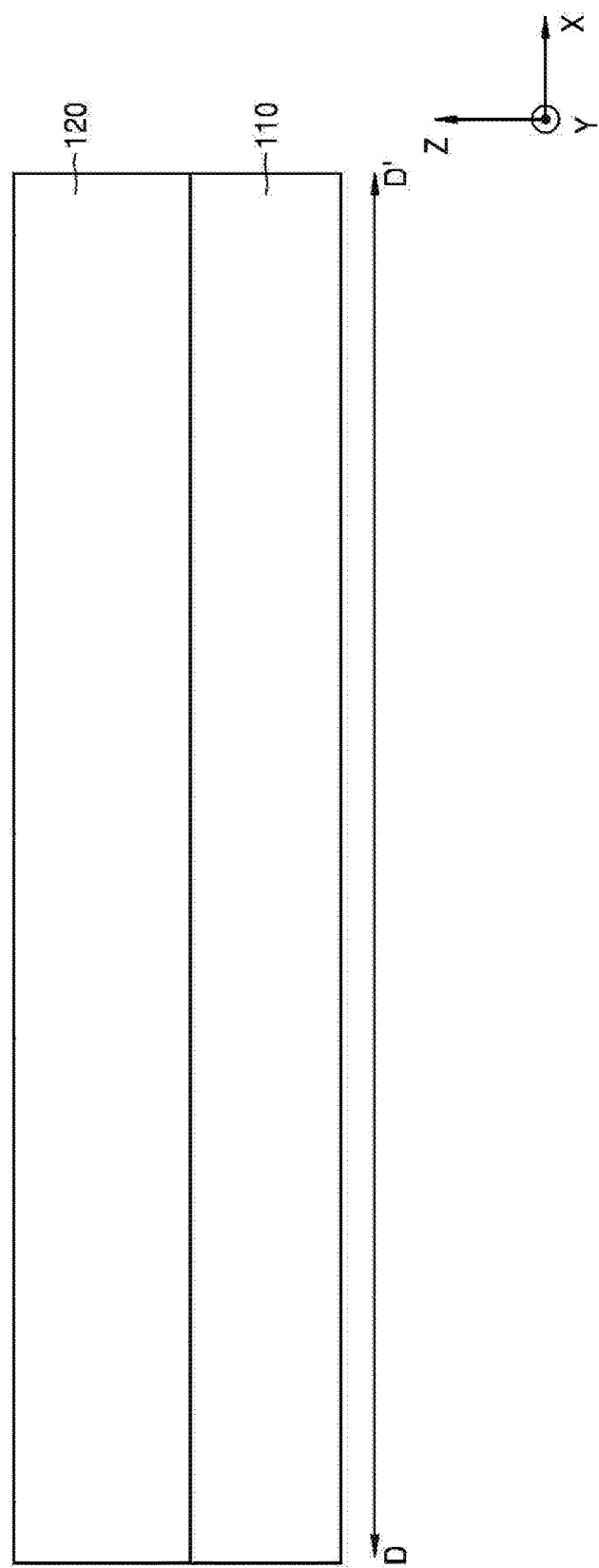
Figure 4C:
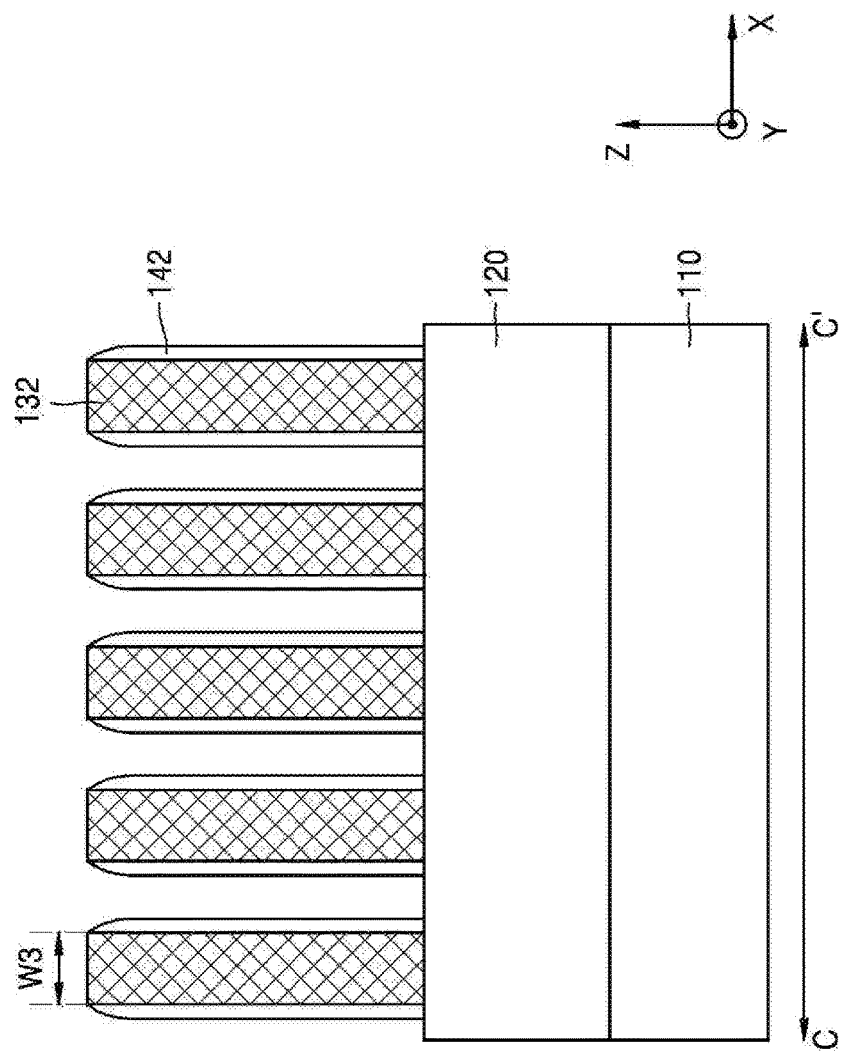
Figure 4D:
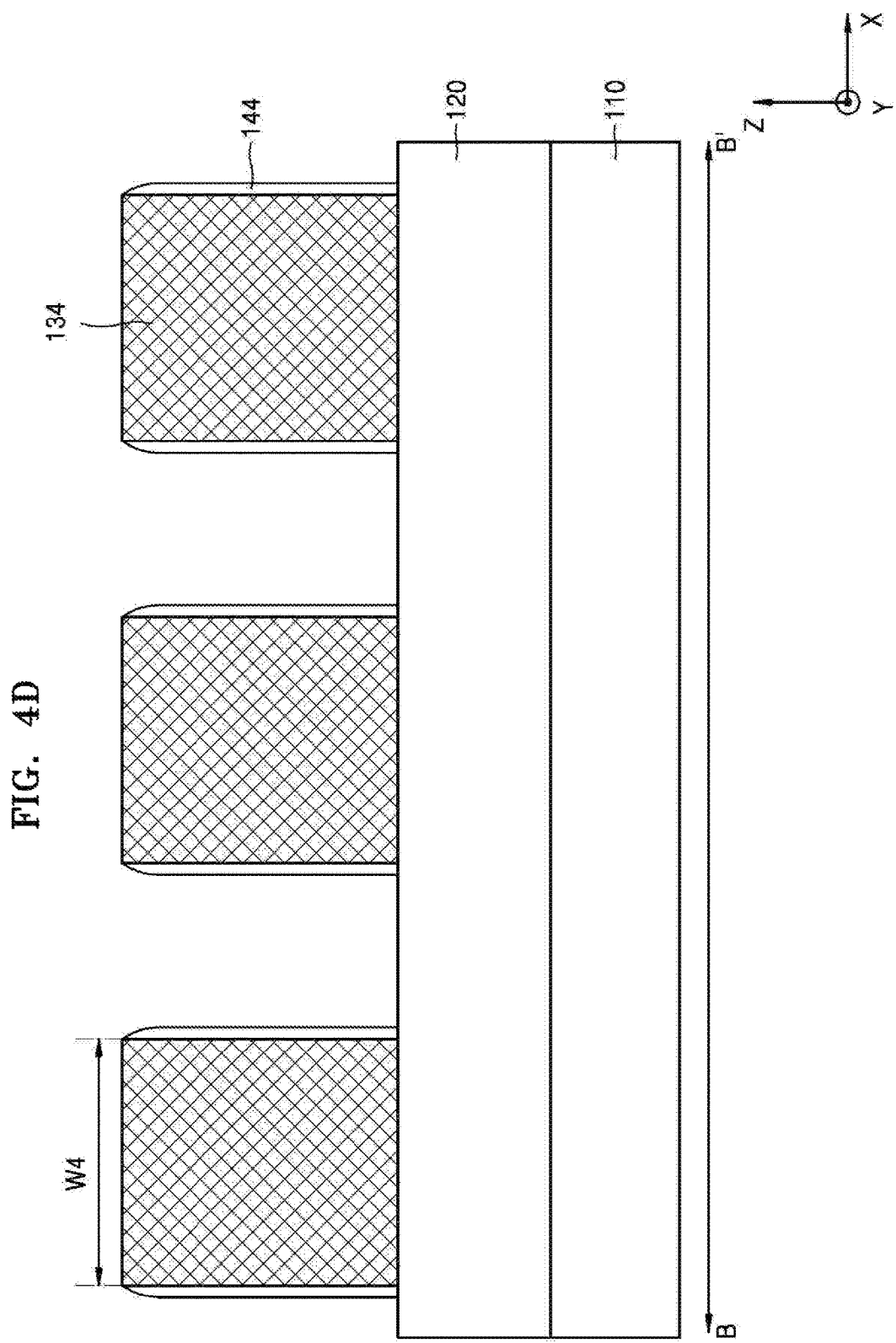
Figure 5A:
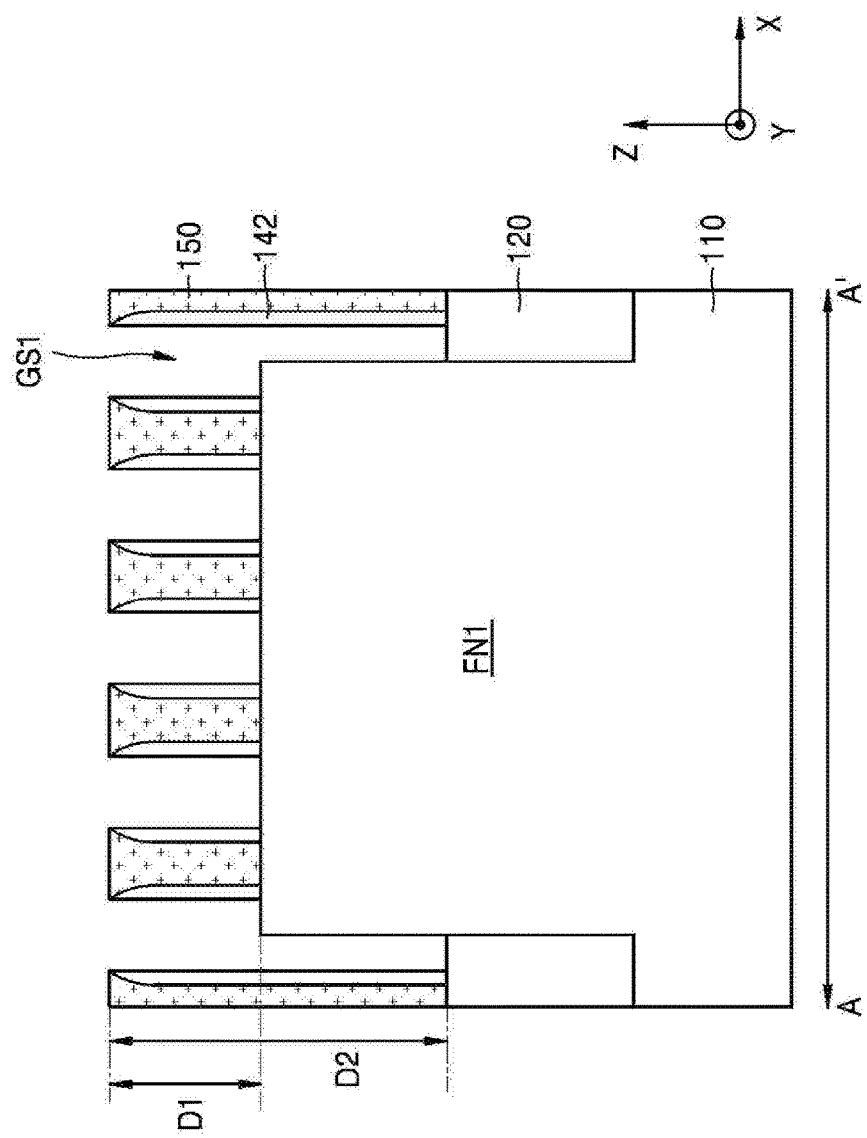
Figure 5B:
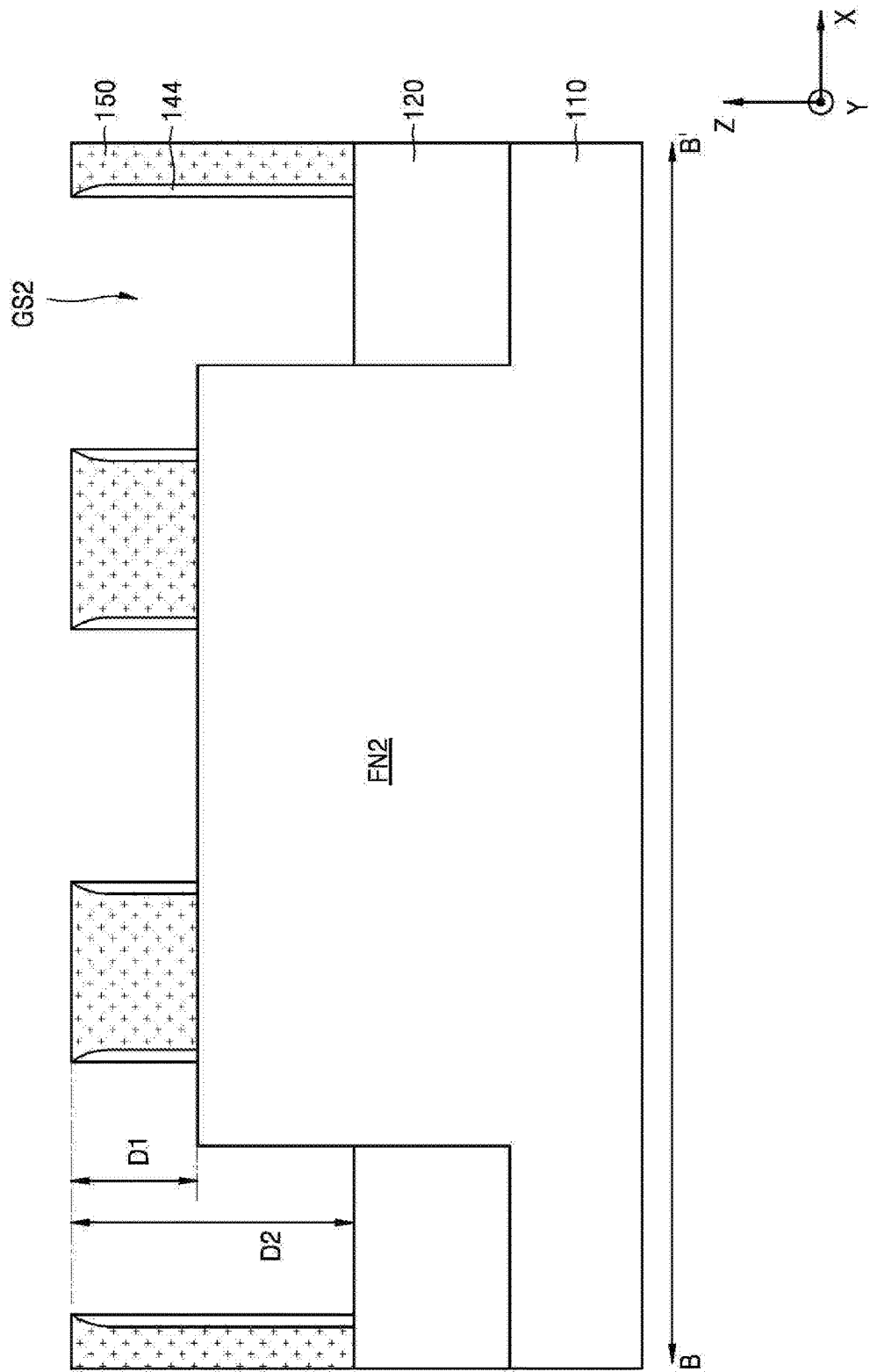
Figure 6A:
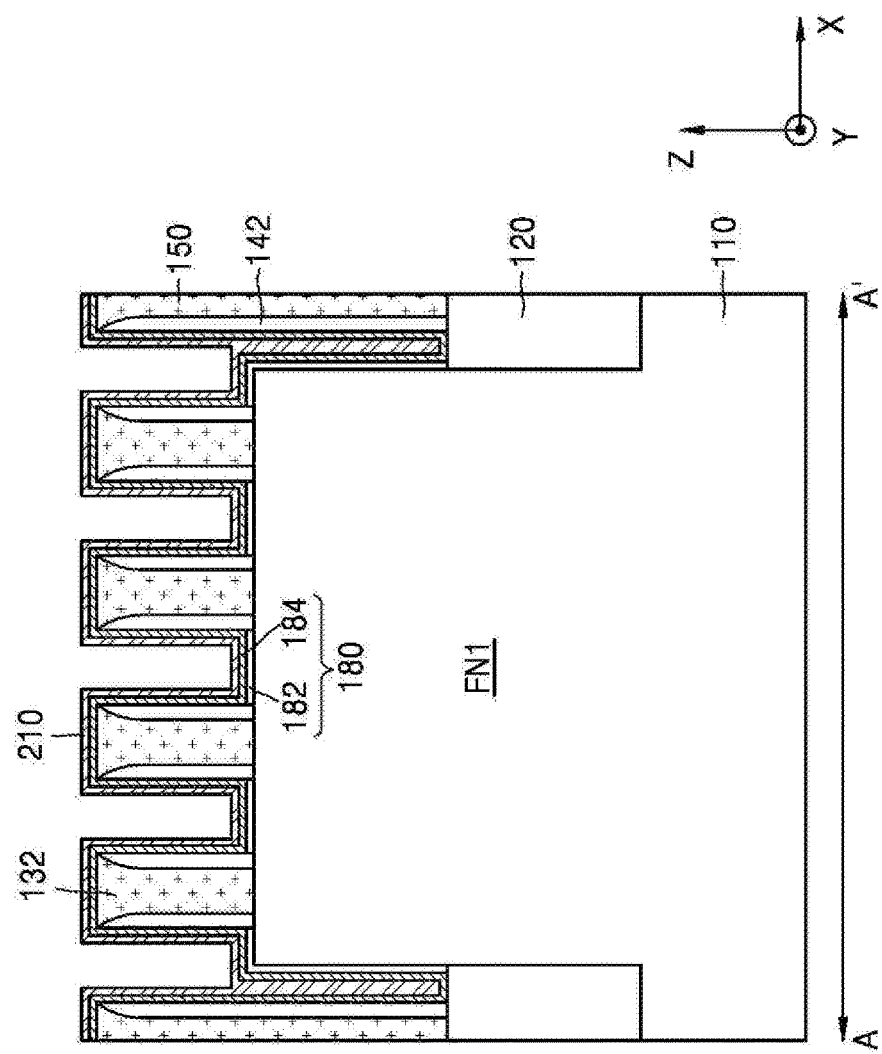
Figure 6C:
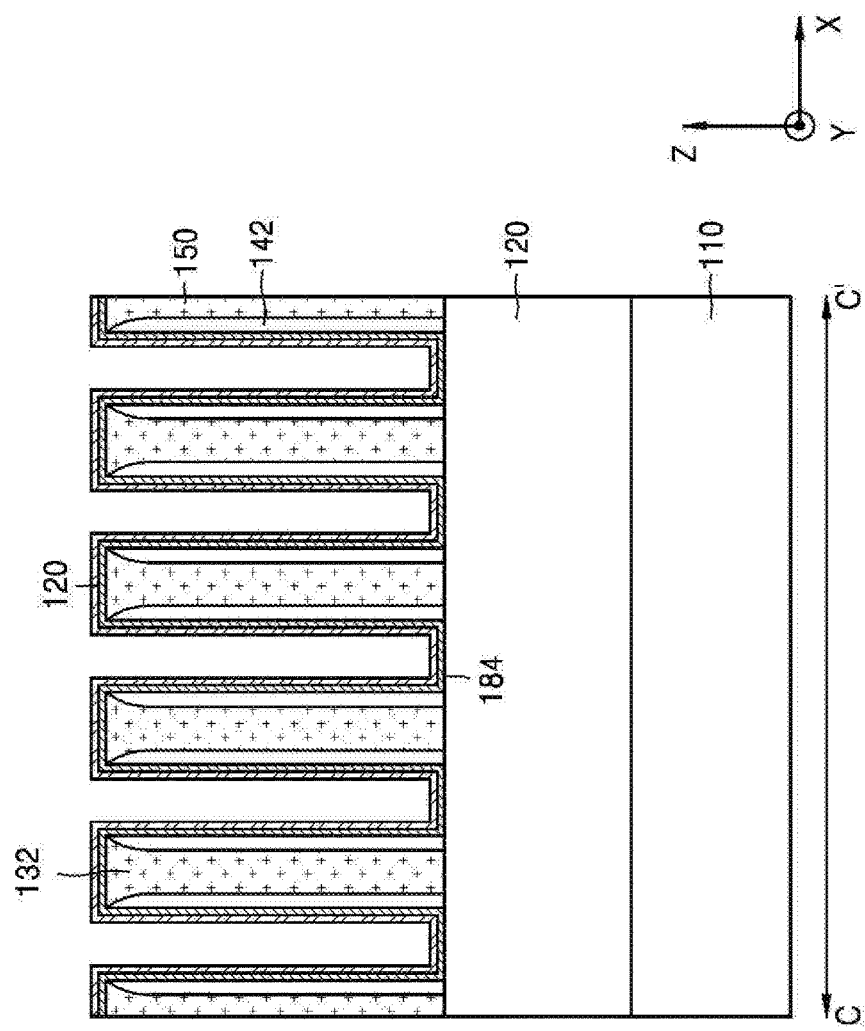
Figure 7A:
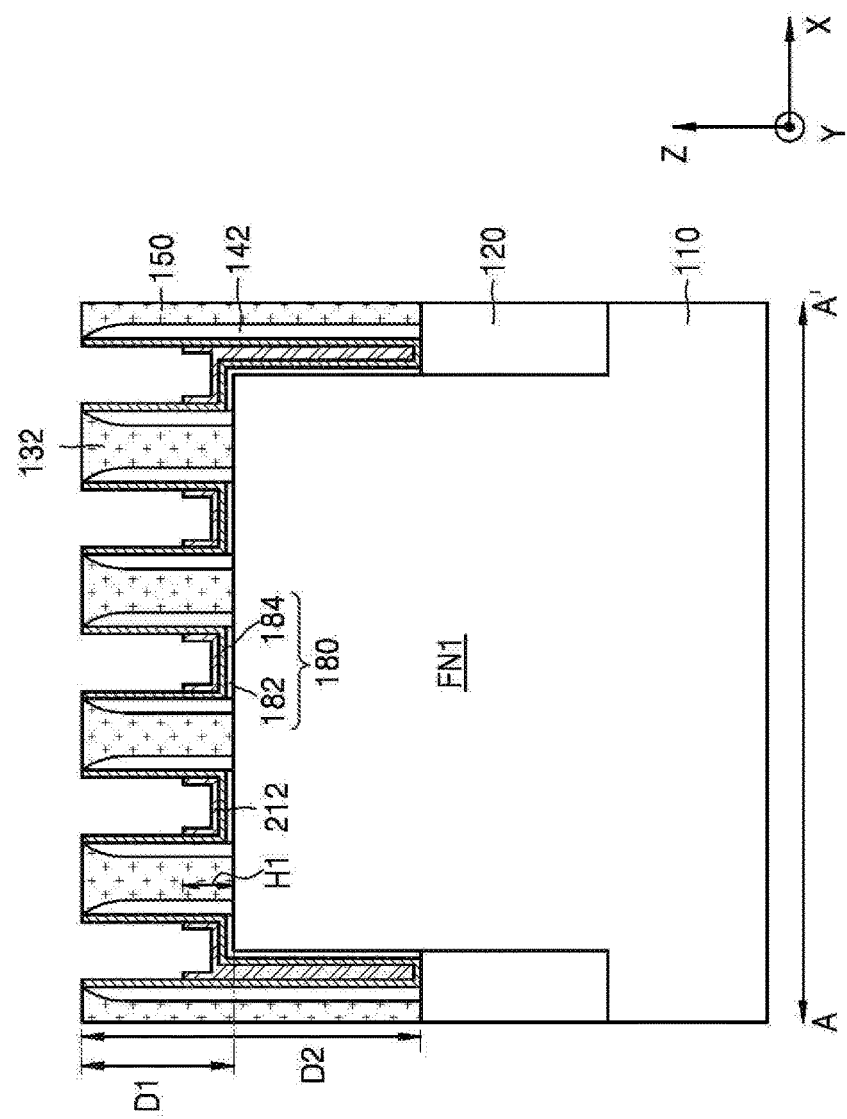
Figure 7C:
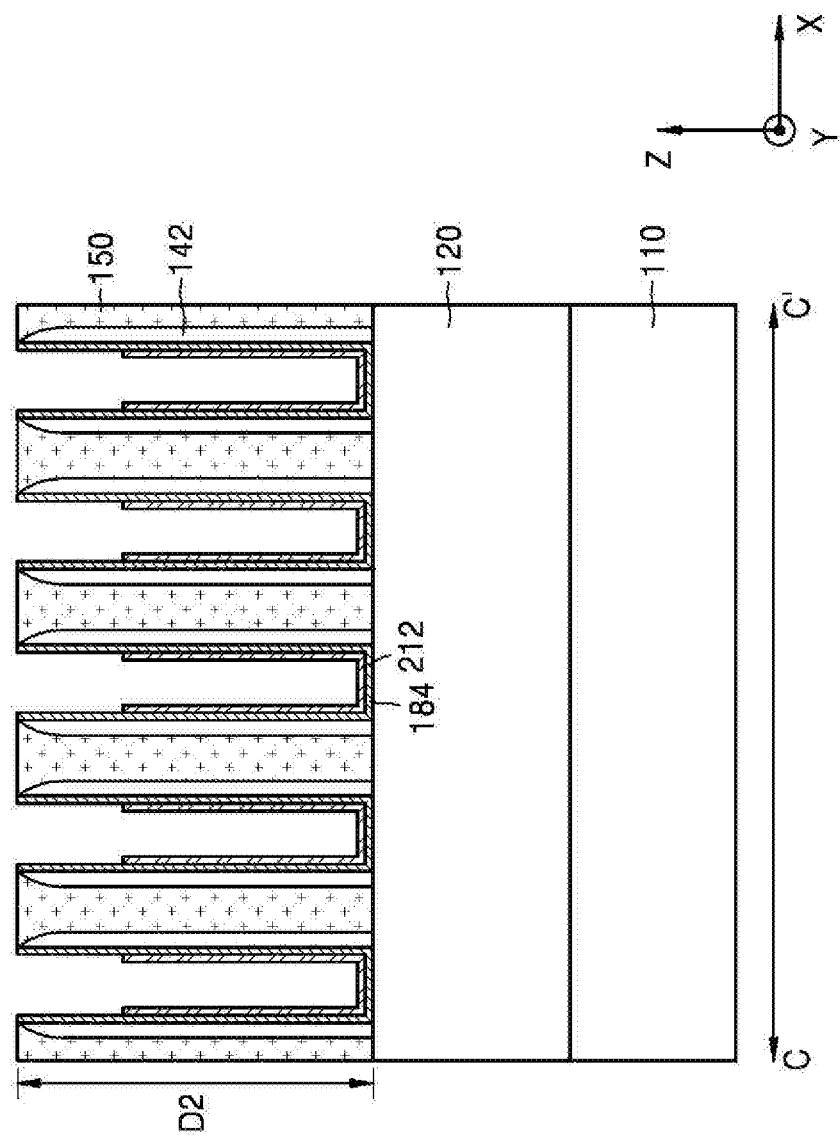
Figure 7D:
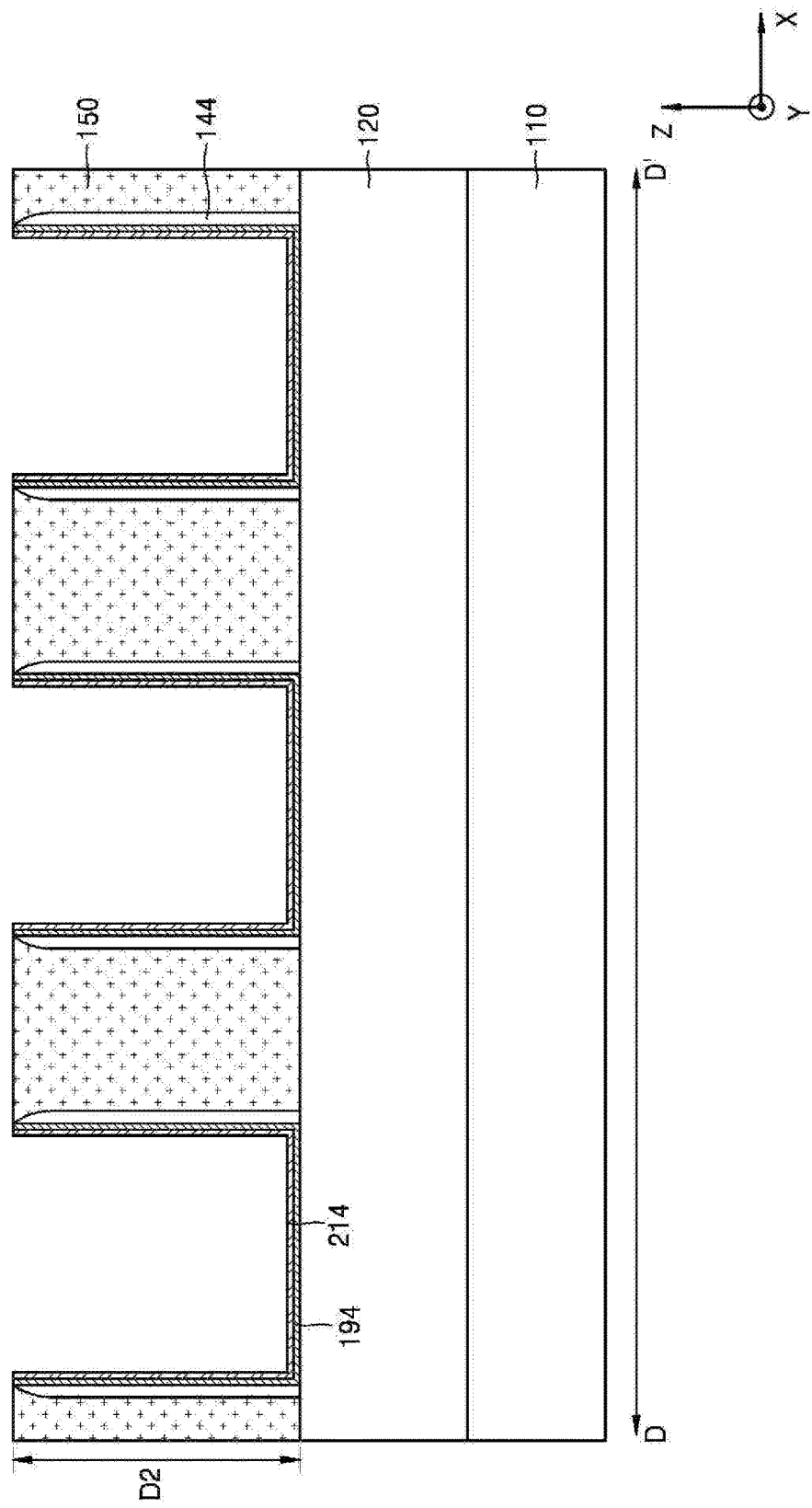
Figure 8A:
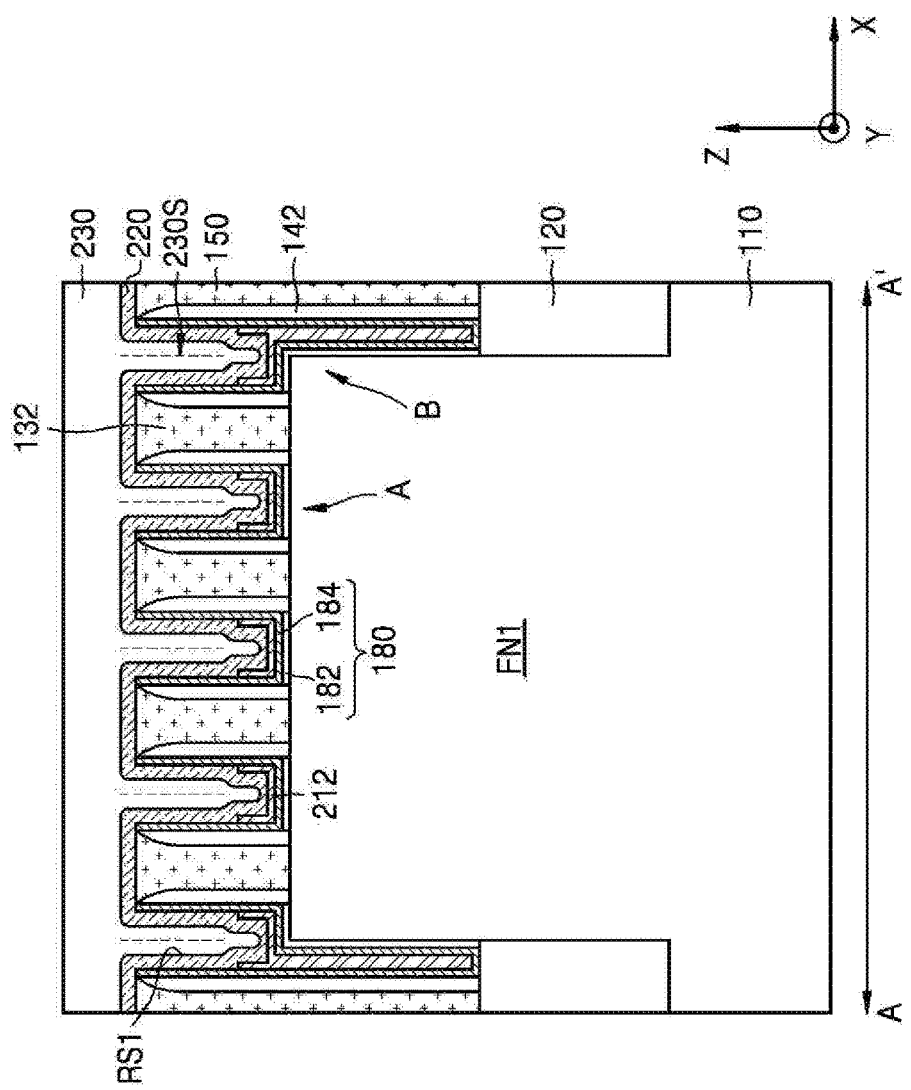
Figure 8B:
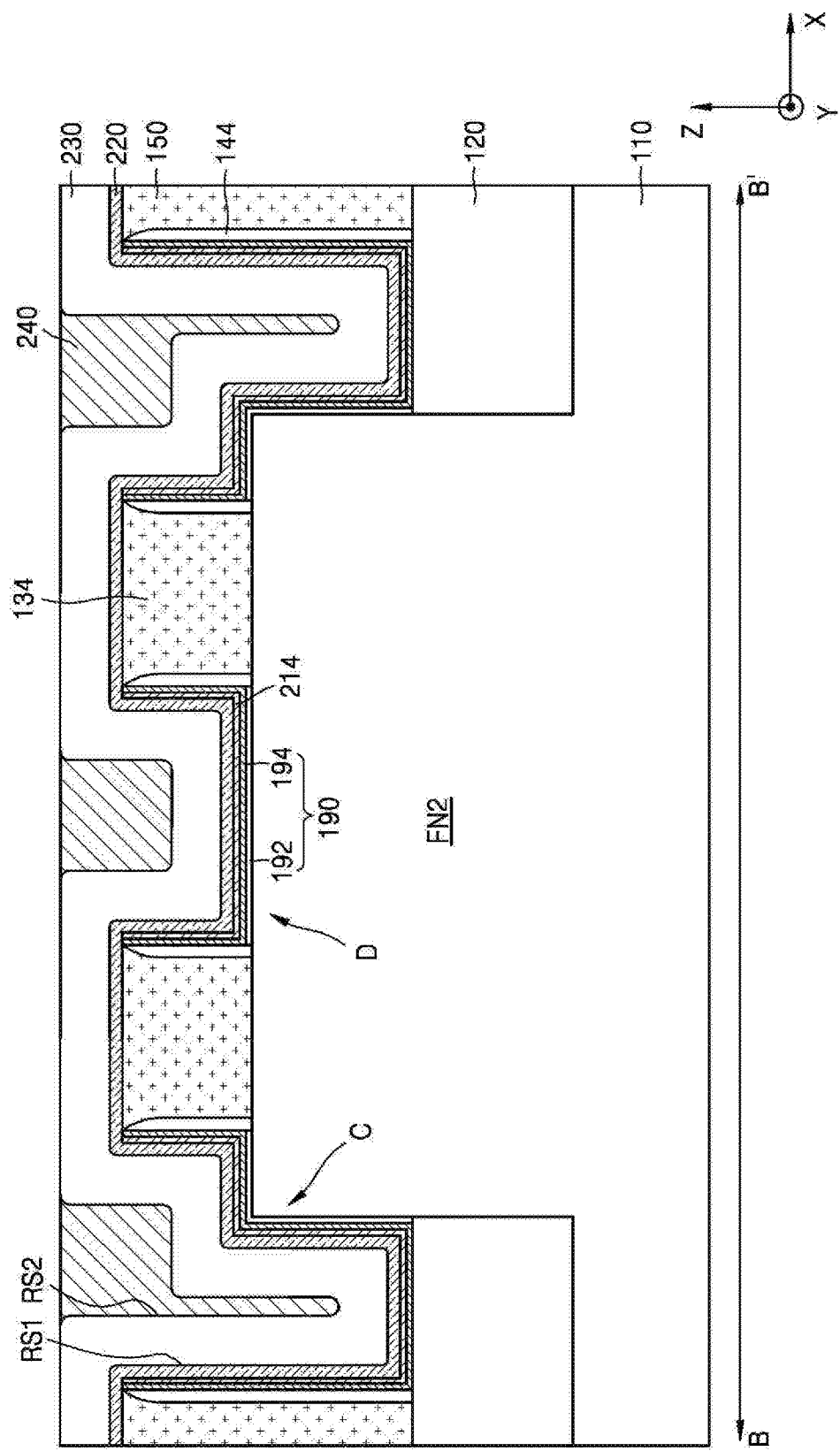
Figure 8C:
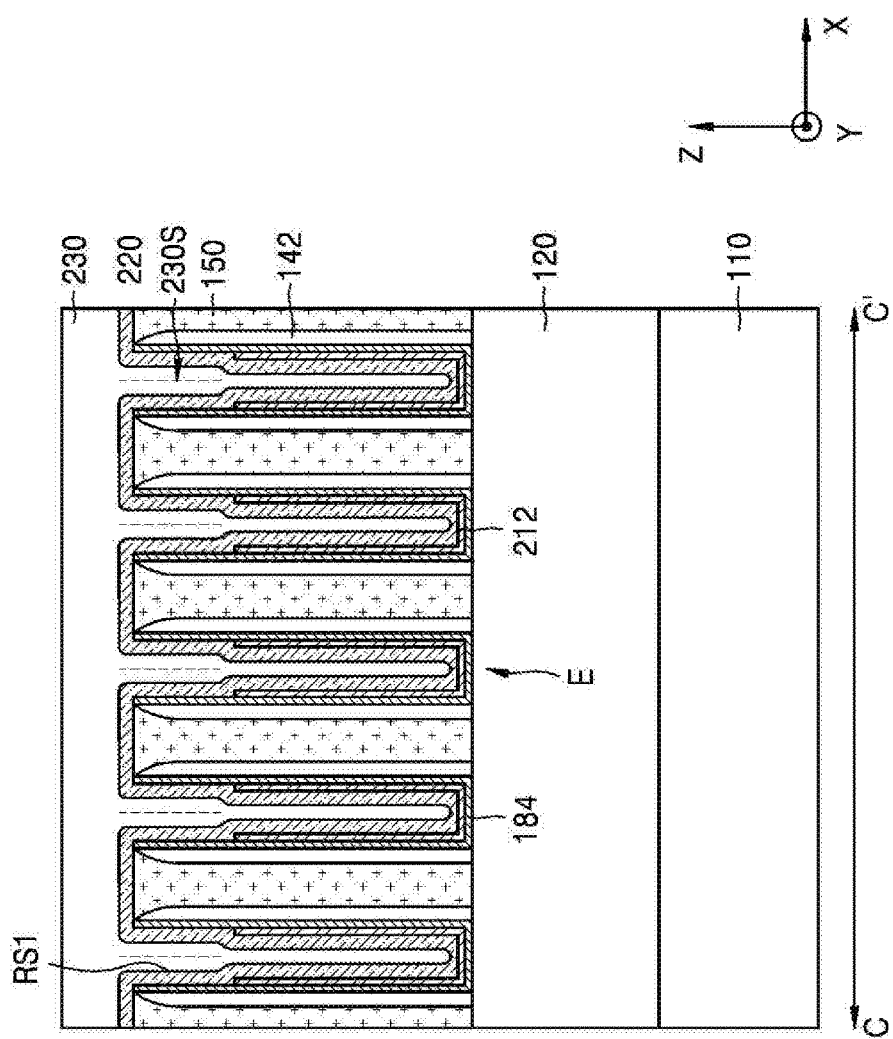
Figure 8D:
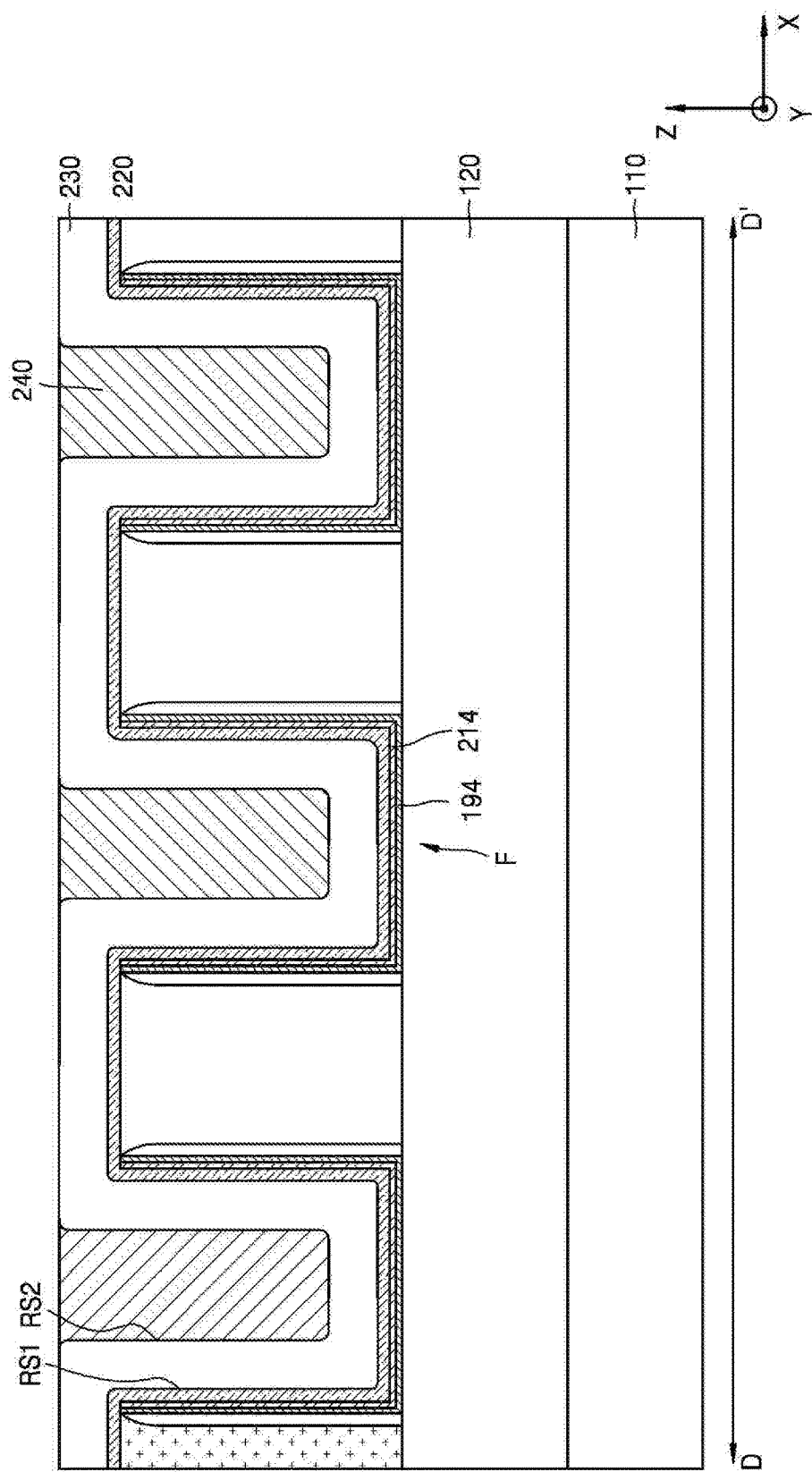

The first and second active regions FN1 and FN2 may protrude in a direction perpendicular to the primary surface of the substrate 110, i.e., in the z-axis direction. In some embodiments, a device isolation layer 120 may be formed on the substrate 110, as shown in FIGS. 2A and 2B, and both sides of a lower portion of each of the first and second active regions FN1 and FN2 may be covered by the device isolation layer 120.

The first and second active regions FN1 and FN2 may themselves be formed from a portion of the substrate 110 or from a semiconductor material in turn formed on the substrate 110. For example, the first and second active regions FN1 and FN2 may be formed by removing a portion of the substrate 110 in which the first and second active regions FN1 and FN2 are not to be defined, or may be formed by forming a semiconductor material on a portion of the substrate in which the first and second active regions FN1 and FN2 are to be defined.

The first and second gate lines GL1 and GL2 may extend in the second direction Y and intersect, in a transverse direction, the first and second active regions FN1 and FN2, respectively. In some embodiments, the first gate line GL1 may have a first width W1, and the second gate line GL2 may have a second width W2 that is greater than the first width W1. A first interval between two adjacent first gate lines GL1 may be equal to the first width W1, but embodiments of the present inventive concepts are not limited thereto. A second interval between two adjacent second gate lines GL2 may be equal to the second width W2, but embodiments of the present inventive concepts are not limited thereto. In some embodiments, a pitch of the second gate line GL2, which is equal to a sum of the second width W2 and the second interval, may be greater than a pitch of the first gate line GL1, which is equal to a sum of the first width W1 and the first interval.

In the first region I, a relatively small transistor may be formed via the first active region FN1 and the first gate line GL1. In the second region II, a relatively large transistor may be formed via the second active region FN2 and the second gate line GL2.

A channel region of the small transistor may be formed in a portion of the first active region FN1 which intersects with the first gate line GL1, and a channel region of the large transistor may be formed in a portion of the second active region FN2 intersected by the second gate line GL2. In the first active region FN1, a source/drain region of the small transistor may be formed at both sides of the channel region of the small transistor. In the second active region FN2, a source/drain region of the large transistor may be formed at both sides of the channel region of the large transistor.

FIGS. 2A and 2B are perspective views of semiconductor devices 1a and 1b according to exemplary embodiments of the inventive concept. Specifically, each of FIGS. 2A and 2B is a perspective view of a portion of one of the first and second regions I and II of the semiconductor device 1 shown in FIGS. 1A and 1B. Descriptions of FIG. 2B that overlap with those of FIG. 2A are omitted.

Referring to FIG. 2A, the semiconductor device 1a may include a substrate 110 having a fin-type active region FN (hereinafter, referred to as an active region FN) and a gate line GLa that extends and intersects the active region FN. The active region FN shown in FIG. 2A may be the first active region FN1 shown in FIG. 1A or the second active region FN2 shown in FIG. 1B. The gate line GLa shown in FIG. 2A may be the first gate line GL1 shown in FIG. 1A or the second gate line GL2 shown in FIG. 1B.

In some embodiments, the substrate 110 may include a semiconductor material. The substrate 110 may comprise, for example, silicon. Alternatively, the substrate 110 may include a semiconductor element, such as germanium (Ge), or a compound semiconductor material, such as silicon carbide (SiC), gallium arsenide (GaAs), indium arsenide (InAs), or indium phosphide (InP). In another embodiment, the substrate 110 may have a silicon on insulator (SOI) structure. For example, the substrate 110 may include a buried oxide (BOX) layer. The substrate 110 may include a conductive region, for example, a well doped with impurities. The substrate 110 may have various device isolation structures, such as a shallow trench isolation (STI) structure or a deep trench isolation (DTI) structure.

A plurality of active regions FN protrude from the substrate 110 toward a third direction Z perpendicular to the main surface of the substrate 110. Both sides of a lower portion of each of the plurality of active regions FN may be covered with a device isolation layer 120.

The device isolation layer 120 may be formed to fill at least a portion of an isolation trench T1 that defines the active regions FN. The device isolation layer 120 may include an insulating liner 122 and a gapfill insulating layer 124, stacked sequentially from an inside wall of the isolation trench T1. The insulating liner 122 may be formed to contact at least a portion of the side of the active region FN. The gapfill insulating layer 124 may cover the side of the active region FN with the insulating liner 122 interposed therebetween and fill the inside of the isolation trench T1.

In some embodiments, the insulating liner 122 and the gapfill insulating layer 124 may comprise different oxide films obtained by using different methods.

In some embodiments, the insulating liner 122 may be obtained by performing a process of oxidizing a surface of the active region FN. For example, a first oxide film forming the insulating liner 122 may be formed by using an in-situ steam generation (ISSG) process, a thermal oxidation process, an ultraviolet (UV) oxidation process, or an $O_2$ plasma oxidation process, or other suitable process. In some embodiments, the insulating liner 122 may have a thickness of about 10 Å to about 100 Å.

In some embodiments, a second oxide film forming the gapfill insulating layer 124 may be a film formed by using a deposition process or a coating process. In some embodiments, the gapfill insulating layer 124 may be an oxide film formed by using a flowable chemical vapor deposition (FCVD) process or a spin coating process. For example, the gapfill insulating layer 124 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but embodiments of the present inventive concepts are not limited thereto.

In some embodiments, the device isolation layer 120 may further include a nitride film or an oxynitride film. For example, the device isolation layer 120 may further include a nitride film or an oxynitride film that is placed between the insulating liner 122 formed of the first oxide film and the gapfill insulating layer 124 formed of the second oxide film.

A deep trench (not shown) having a depth greater than that of the isolation trench T1 may be formed in the substrate 110. In some embodiments, the deep trench may be formed in an edge region of each of the first and second regions I and II shown in FIGS. 1A and 1B or a region between the first region I and the second region II to operate as an isolation barrier between transistors of the regions I, II. The interior of the deep trench may be filled with a third oxide film formed by a coating process or a deposition process.

A gate insulating film GOX and a gate line GLa, which cover both sides and an upper surface of each of the plurality of active regions FN, are sequentially formed on the plurality of active regions FN and the device isolation layer 120. The gate insulating film GOX and the gate line GLa may extend in the second direction Y intersecting the first direction X that is a long axis direction of the plurality of active regions FN.

Although the gate insulating film GOX shown in FIG. 2A covers the bottom of the gate line GLa, embodiments of the present inventive concepts are not limited thereto. For example, the gate insulating film GOX may cover the bottom and sidewalls of the gate line GLa.

The gate insulating film GOX may include silicon oxide, silicon nitride, silicon oxynitride, gallium oxide, germanium oxide, high-permittivity dielectric material, or a combination thereof. For example, the gate insulating film GOX may have a dielectric constant of about 10 to about 25. The gate insulating film GOX may be formed using an atomic layer deposition (ALD) process, a chemical vapor deposition (CVD) process, or a physical vapor deposition (PVD) process.

A channel region may be formed in a portion of the active region FN which intersects the gate line GLa, and a source/drain region SD may be formed in a portion of the active region FN, which is positioned at both sides of the gate line GLa.

Although not illustrated in FIGS. 2A and 2B, the source/drain region SD may comprise a semiconductor layer epitaxially grown from the active region FN. The source/drain region SD may have an embedded SiGe structure including a plurality of epitaxially grown SiGe layers, an epitaxially grown Si layer, or an epitaxially grown SiC layer.

In some embodiments, the gate line GLa may include a plurality of metal-containing layers. For example, the gate line GLa may include a barrier layer, a first gate electrode layer, and a second gate electrode layer, or may include a barrier layer and first through third gate electrode layers. The barrier layer may function as a barrier that prevents atoms forming the first gate electrode layer from being diffused into the gate insulating film GOX between the first gate electrode layer and the gate insulating film GOX. The first gate electrode layer or the barrier layer and the first gate electrode layer may function as a metal-containing layer for adjusting the work function of the gate line GLa. The second gate electrode layer or the second and third gate electrode layers may function as a gapfill metal-containing layer, which fills a space formed in an upper portion of the first gate electrode layer, and/or a low resistance metal-containing layer. Each of the barrier layer and the first through third gate electrode layers may be a single metal-containing layer or a multilayered metal-containing layer. A plurality of metal-containing layers forming the gate line GLa will be described in detail later.

In a cross section (i.e., an X-Z plane) perpendicular to the second direction Y, which is an extending direction of the gate line GLa, an upper surface of the gate line GLa may have a concave shape at the central portion thereof. The gate line GLa may include a gate base portion GB and a gate protrusion portion GP protruding from the gate base portion GB, which form an uneven shape. The width of the gate base portion GB in the first direction X may be greater than that of the gate protrusion portion GP in the first direction X. The gate protrusion portion GP may have a first upper surface TS1 and a first side SS1, and the gate base portion GB may have a second upper surface TS2 and a second side SS2. The second upper surface TS2, which is the upper surface of the gate base portion GB of the gate line GLa, may have a level lower than that of the first upper surface TS1, with respect to the substrate 110. Accordingly, the gate line GLa may have an uneven cross-sectional shape with the first side SS1 between the second upper surface TS2 having a relatively low level and the first upper surface TS1 having a relatively high level.

As the first upper surface TS1 is away from the side of the gate line GLa, the first upper surface TS1 may have a relatively low level with respect to the substrate 110. In other words, the first upper surface TS1 may have a concave shape in which a central portion of the first upper surface TS1 has a level that is lower than that of an outer portion thereof with respect to the substrate 110. The first upper surface TS1 may have the highest level at a portion at which the first upper surface TS1 borders the first side SS1. As the second surface TS2 is away from the side of the gate line GLa, the second upper surface TS2 may have a relatively low level with respect to the substrate 110. The second upper surface TS2 may have the highest level at a portion at which the second upper surface TS2 borders the second side SS2, and may have the lowest level in a part in which the second upper surface TS2 borders the first side SS1. The part of the second upper surface TS2, which has the highest level, may have a relatively low level with respect to the substrate 110, compared to the part of the first upper surface TS1, which has the lowest level.

For purposes of the present specification, the central portion denotes the center and a region around the center, and the outer portion denotes an outermost portion and a region around the outermost portion.

Referring to FIG. 2B, the semiconductor device 1b includes a substrate 110 having a fin-type active region FN (hereinafter, referred to as an active region FN), and a gate line GLa that extends to intersect the active region FN. The active region FN shown in FIG. 2B may be the first active region FN1 shown in FIG. 1A or the second active region FN2 shown in FIG. 1B. The gate line GLa shown in FIG. 2B may be the first gate line GL1 shown in FIG. 1A or the second gate line GL2 shown in FIG. 1B.

In some embodiments, the substrate 110 may comprise a semiconductor material. A plurality of active regions FN protrude from the substrate 110 toward a third direction Z perpendicular to the main surface of the substrate 110. Both sides of a lower portion of each of the plurality of active regions FN may be covered with a device isolation layer 120.

The device isolation layer 120 may be formed to fill at least a portion of an isolation trench T1 that defines the active regions FN. The device isolation layer 120 may include an insulating liner 122 and a gapfill insulating layer 124 stacked sequentially from an inside wall of the isolation trench T1. The insulating liner 122 may be formed to contact the side of the active region FN. The gapfill insulating layer 124 may cover the side of the active region FN with the insulating liner 122 interposed therebetween and fill the inside of the isolation trench T1.

A gate insulating film GOX and a gate line GLb, which cover both sides and an upper surface of each of the plurality of active regions FN, are formed on the plurality of active regions FN and the device isolation layer 120. The gate insulating film GOX and the gate line GLa may extend in the second direction Y intersecting the first direction X that is a long axis direction of the plurality of active regions FN.

Although the gate insulating film GOX shown in FIG. 2B covers the bottom of the gate line GLb, embodiments of the present inventive concepts are not limited thereto. For example, in some embodiments, the gate insulating film GOX may cover the bottom and sidewalls of the gate line GLb.

The gate insulating film GOX may be a silicon oxide film, a silicon nitride film, a silicon oxynitride film, a high-permittivity dielectric film, or a combination thereof.

A channel region may be formed in a portion of the active region FN which intersects with the gate line GLb, and a source/drain region SD may be formed in a portion of the active region FN, which is positioned at both sides of the gate line GLb.

The gate line GLb may include a plurality of metal-containing layers. For example, the gate line GLb may include a barrier layer, a first gate electrode layer, and a second gate electrode layer, or may include a barrier layer and first through third gate electrode layers. A case where a plurality of metal-containing layers form the gate line GLb is described in detail herein.

In a cross section (i.e., an X-Z plane) perpendicular to the second direction Y, which is an extending direction of the gate line GLb, the upper surface TS of the gate line GLb may have a concave shape at the central portion thereof. The upper surface TS of the gate line GLb may be a continuous surface. As the upper surface TS of the gate line GLb is away from the side SS of the gate line GLb, the upper surface TS may have a relatively low level with respect to the substrate 110. In other words, the upper surface TS of the gate line GLb may have a concave shape in which a central portion of the upper surface TS has a level that is lower than that of an outer portion thereof with respect to the substrate 110.

FIGS. 3A through 10D are cross-sectional views sequentially illustrating a method of manufacturing a semiconductor device, according to an exemplary embodiment of the inventive concept. Specifically, FIGS. 3A, 4A, 5A, 6A, 7A, 8A, 9A, and 10A are cross-sectional views taken along a line A-A' of FIG. 1A, FIGS. 3B, 4B, 5B, 6B, 7B, 8B, 9B, and 10B are cross-sectional views taken along a line B-B' of FIG. 1B, FIGS. 3C, 4C, 5C, 6C, 7C, 8C, 9C, and 10C are cross-sectional views taken along a line C-C' of FIG. 1A, and FIGS. 3D, 4D, 5D, 6D, 7D, 8D, 9D, and 10D are cross-sectional views taken along a line D-D' of FIG. 1B. Accordingly, FIGS. 3A, 4A, 5A, 6A, 7A, 8A, 9A, and 10A, and FIGS. 3C, 4C, 5C, 6C, 7C, 8C, 9C, and 10C are cross-sectional views illustrating the first region I of FIG. 1A, and FIGS. 3B, 4B, 5B, 6B, 7B, 8B, 9B, and 10B and FIGS. 3D, 4D, 5D, 6D, 7D, 8D, 9D, and 10D are cross-sectional views illustrating the second region II of FIG. 1B.

In the descriptions of FIGS. 3A through 10D, the same reference numerals as employed to describe FIGS. 1A through 2B may be used.

FIGS. 3A through 3D are cross-sectional views illustrating a process of forming a fin-type active region, according to exemplary embodiments of the present inventive concepts.

Referring to FIGS. 3A through 3D, a substrate 110 having active regions FN1 and FN2 that are fin-type active regions are prepared. The active region FN1 is formed in a first region I, and the active region FN2 is formed in a second region II.

The active regions FN1 and FN2 protrude from the substrate 110 in a third direction Z perpendicular to the main surface of the substrate 110. Both sides of a lower portion of each of the active regions FN1 and FN2 are covered with a device isolation layer 120. The device isolation layer 120 may be formed to fill at least a portion of an isolation trench T1 that defines the active regions FN1 and FIN2. An upper surface of the device isolation layer 120 may have a level that is lower than those of upper surfaces of the active regions FN1 and FN2, with respect to the substrate 110. Accordingly, since upper portions of the active regions FN1 and FN2 are not covered by the device isolation layer 120, the active regions FN1 and FN2 may protrude over the device isolation layer 120.

FIGS. 4A through 4D are cross-sectional views illustrating a process of forming a dummy gate line, according to an exemplary embodiment of the inventive concept.

Referring to FIGS. 4A through 4D, dummy gate lines 132 and 134 and dummy gate spacer layers 142 and 144 (hereinafter, referred to as gate spacer layers 142 and 144) covering both sides of the dummy gate lines 132 and 134, respectively, are formed on the substrate 110 having the active regions FN1 and FN2 and the device isolation layer 120 formed therein.

To form the dummy date lines 132 and 134, a dummy gate material layer (not shown) is formed on the substrate 110 having the active regions FN1 and FN2 and the device isolation layer 120 formed therein. Thereafter, the dummy gate material layer may be patterned to form the dummy date lines 132 and 134 extending in a second direction Y. The dummy gate lines 132 and 134 may be formed by performing a photolithography process and an etching process on the dummy gate material layer. A fine pattern formation process, such as a double patterning technology (DPT) or a quadruple patterning technology (QPT), or other suitable process, may be used to form the dummy gate lines 132 and 134. The dummy gate lines 132 and 134 may include, for example, polysilicon, but embodiments of the present inventive concepts are not limited thereto.

At least one of the dummy gate line 132 may be formed to intersect a middle portion of the active region FN1, and at least another one of the dummy gate line 132 may be formed to intersect a boundary portion between the active region FN1 and the device isolation layer 120. At least one of the dummy gate line 134 may be formed to intersect a middle portion of the active region FN2, and at least another one of the dummy gate line 134 may be formed to intersect a boundary portion between the active region FN2 and the device isolation layer 120.

In some embodiments, the dummy gate line 132, that is, a first dummy gate line 132, may be formed in the first region I, and the dummy gate line 134, that is, a second dummy gate line 134, may be formed in the second region II. The first dummy gate line 132 and the second dummy gate line 134 may have a third width W3 and a fourth width W4, respectively, in a first direction X. The fourth width W4 may be greater than the third width W3. The third width W3 and the fourth width W4 may be equal to or slightly greater than the first width W1 and the second width W2, respectively.

A dummy gate insulating film (not shown) may be disposed between the first dummy gate line 132 and the active region FN1 and between the second gate line 134 and the active region FN2.

After the dummy gate lines 132 and 134 are formed, a dummy gate material layer having a uniform thickness is formed on the substrate 110 having the dummy gate lines 132 and 134 formed thereon, and the gate spacer layers 142 and 144 covering both sides of the dummy gate lines 132 and 134, respectively, are formed by performing an etchback process. The gate spacer layers 142 and 144 may include, for example, silicon nitride.

In some embodiments, each of the gate spacer layers 142 and 144 may have a multilayered structure. For example, each of the gate spacer layers 142 and 144 may have a multilayered structure including sequentially formed two or more layers. For example, each of the gate spacer layers 142 and 144 may have a multilayered structure that selectively includes a silicon oxide film, a silicon nitride film, a low-permittivity dielectric film having a permittivity less than that of the silicon oxide film, and air. For example, each of the gate spacer layers 142 and 144 may have a structure in which a silicon oxide film, a low-permittivity dielectric film, or air is placed between two silicon nitride films.

The gate spacer layer 142, that is, a first gate spacer layer 142, may be formed in the first region I, and the gate spacer layer 144, that is, a second gate spacer layer 144, may be formed in the second region II.

FIGS. 5A through 5D are cross-sectional views illustrating a process of forming an interlayer insulating layer, according to an exemplary embodiment of the inventive concept.

Referring to FIGS. 5A through 5D together with FIGS. 4A through 4D, an interlayer insulating layer 150 is formed to cover the sides of the dummy gate lines 132 and 134 and fill a space between gate spacer layers 142 facing each other and a space between gate spacer layers 143 facing each other. Also, the dummy gate lines 132 and 134 are removed and thus gate spaces GS1 and GS2, in which a portion of the surface of each of the active regions FN1 and FN2 and a portion of the surface of the device isolation layer 1120 are exposed, are formed between a pair of gate spacer layers 142 and between a pair of gate spacer layers 144, respectively.

The gate spaces GS1 and GS2 may have a first depth D1 on the device isolation layer 120 and have a second depth D2 on the active regions FN1 and FN2. The first depth D1 may be greater than the first depth D2. The first depth D1 may be greater than the first depth D2 by an amount equal to a height of a portion of each of the active regions FN1 and FN2, the portion protruding over the device isolation layer 120.

In some embodiments, to form the interlayer insulating layer 150, an interlayer insulating material layer, which covers the sides of the dummy gate lines 132 and 134, fills a space between gate spacer layers 142 facing each other and a space between gate spacer layers 143 facing each other, and covers the dummy gate lines 132 and 134 and the gate spacer layers 142 and 144, is formed on the substrate 110 having the dummy gate lines 132 and 134 and the gate spacer layers 142 and 144 formed thereon. Next, a planarization process for removing a portion of the interlayer insulating material layer is performed by using the dummy gate lines 132 and 134 and/or the gate spacer layers 142 and 144 as etch-stop layers to form the interlayer insulating layer 150. For example, a chemical mechanical polishing (CMP) process may be preformed to remove a portion of the interlayer insulating material layer.

FIGS. 6A through 6D are cross-sectional views illustrating a process of forming a gate insulating layer and a barrier material layer, according to an exemplary embodiment of the inventive concepts.

Referring to FIGS. 6A through 6D, gate insulating layers 180 and 190 and a barrier material layer 210 are formed on the substrate 110 having the interlayer insulating layer 150 and the gate spacer layers 142 and 144 formed thereon.

The gate insulating layer 180, that is, a first gate insulating layer 180, is formed in the first region I, and the gate insulating layer 190, that is, a second insulating layer 190, is formed in the second region II.

The gate insulating layer 180 may include an interface insulating layer 182 and a high-permittivity dielectric layer 184, and the gate insulating layer 190 may include an interface insulating layer 192 and a high-permittivity dielectric layer 194. The interface insulating layers 182 may be formed to have a uniform thickness on a surface of the active region FN1 which is not covered by the interlayer insulating layer 150 and the gate spacer layer 142, and the interface insulating layers 192 may be formed to have a uniform thickness on a surface of the active region FN2 which is not covered by the interlayer insulating layer 150 and the gate spacer layer 144. The high-permittivity dielectric layers 184 and 194 may be formed to have a uniform thickness on the substrate 110 having the interlayer insulating layer 150 and the gate spacer layers 142 and 144, formed thereon. The interface insulating layer 182 may be disposed between the high-permittivity dielectric layer 184 and the active region FN1, and the interface insulating layer 192 may be disposed between the high-permittivity dielectric layer 194 and the active region FN2.

The interface insulating layers 182 and 192 may comprise silicon oxide, silicon nitride, silicon oxynitride, gallium oxide, or germanium oxide, but embodiments of the present inventive concepts are not limited thereto. In some embodiments, the interface insulating layers 182 and 192 may comprise an oxide, nitride, or oxynitride of a material that forms the active regions FN1 and FN2.

The high-permittivity dielectric layers 184 and 194 may comprise a material having a dielectric constant greater than that of a silicon oxide film or silicon nitride film. The high-permittivity dielectric layers 184 and 194 may include one selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof, but embodiments of the present inventive concepts are not limited thereto.

The first gate insulating layer 180 and the second insulating layer 190 may include the same material, but embodiments of the present inventive concepts are not limited thereto. For example, the first gate insulating layer 180 and the second gate insulating layer 190 may include different materials or may have different thicknesses. For example, the thickness of the second gate insulating layer 190 may be greater than that of the first gate insulating layer 180. For example, the first gate insulating layer 180 may have a multilayered structure including the first interface insulating layer 182 and the first high-permittivity dielectric layer 184, and the second gate insulating layer 190 may be a single layer. For example, the first gate insulating layer 180 may have a multilayered structure including the first interface insulating layer 182 and the first high-permittivity dielectric layer 184, and the second gate insulating layer 190 may have a multilayered structure including the second interface insulating layer 192 and the second high-permittivity dielectric layer 194. In addition, the first interface insulating layer 182 and the second interface insulating layer 192 may include different materials or may have different thicknesses, and the first high-permittivity dielectric layer 184 and the second high-permittivity dielectric layer 194 may include same material and may have same thickness.

The barrier material layer 210 may be formed to have a uniform thickness on the high-permittivity dielectric layer 184. The barrier material layer 210 may include at least one metal selected from Ti, Ta, W, Ru, Nb, Mo, and Hf or a metal nitride including the at least one metal. The barrier material layer 210 may have a thickness of several tens of angstroms (Å). The barrier material layer 210 may be a single layer, but is not limited thereto. For example, the barrier material layer 210 may include two or more layers. When the barrier material layer 210 includes multiple layers, each of the multiple layers may have a thickness of several Å to several tens of Å.

The barrier material layer 210 may have different thicknesses or different structures according to regions. For example, the thickness of a portion of the barrier material layer 210, formed in the second region II, may be greater than that of a portion of the barrier material layer 210, formed in the first region I. For example, the number of multiple layers that form a portion of the barrier material layer 210 formed in the second region II may be greater than the number of multiple layers that form a portion of the barrier material layer 210 formed in the first region I. Alternatively, even in the same first region I or in the same second region II, the barrier material layer 210 may be formed to have different thicknesses or different structures according to work functions of transistors to be formed.

FIGS. 7A through 7D are cross-sectional views illustrating a process of forming a barrier layer, according to an exemplary embodiment of the inventive concepts.

Referring to FIGS. 7A through 7D, a portion of the barrier material layer 210 (see FIGS. 6A through 6D) formed on the interlayer insulating layer 150 and the gate spacer layers 142 and 144 is removed. In this case, portions of the gate insulating layers 180 and 190 formed on the interlayer insulating layer 150 and the gate spacer layers 142 and 144 may also be removed together with the portion of the barrier material layer 210. When the gate insulating layers 180 and 190 include the interface insulating layers 182 and 192 and the high-permittivity dielectric layers 184 and 194, only the high-permittivity dielectric layers 184 and 194 of the gate insulating layers 180 and 190 are formed on the interlayer insulating layer 150 and the gate spacer layers 142 and 144. Thus, portions of the high-permittivity dielectric layer 184 and 194 formed on the interlayer insulating layer 150 and the gate spacer layers 142 and 144 may be removed.

In the first region I, first and second barrier layers 212 and 214 are formed by further removing a portion of the barrier material layer 210, which is adjacent to the sides of upper portions of the gate spacer layers 142 and 144. The first barrier layer 212 is formed in the first region I, and the second barrier layer 214 is formed in the second region II. The top of the first barrier layer 212 may have a first height H1 from the upper surface of the first active region FN1. The top of the second barrier layer 214 may have a level that is higher than that of the top of the first barrier layer 214. For example, the top of the second barrier layer 214 may have a level same as or similar to that of the top of the interlayer insulating layer 150 and/or the top of the second gate spacer layer 144.

To remove a portion of the barrier material layer 210 and portions of the gate insulating layers 180 and 190, a mold material layer (not shown), which fills a space between the gate spacer layers 142 and a space between the gate spacer layers 144 and covers the substrate 110, is formed, and then a planarization process such as a CMP process may be performed so that the interlayer insulating layer 150 and the gate spacer layers 142 and 144 are exposed.

Next, after removing a portion of an upper portion of the mold material layer that fills a space between the gate spacer layers 142 in the first region I, the first barrier layer 212 and the second barrier layer 214 may be formed by removing an exposed portion of the barrier material layer 210, that is, a portion of the barrier material layer 210, formed on an upper portion of the gate spacer layer 142. After the first and second barrier layers 212 and 214 are formed, the entire mold material layer may be removed.

In FIGS. 7A through 7D, although the top of the first barrier layer 212 is lower than that of the second barrier layer 214, the inventive concept is not limited thereto. For example, the top of the second barrier layer 214 may also have a relatively low level, in a manner similar to the top of the first barrier layer 212.

FIGS. 8A through 8D are cross-sectional views illustrating a process of forming a gate material layer, according to an exemplary embodiment of the inventive concepts.

Referring to FIGS. 8A through 8D, first through third gate material layers 220, 230, and 240 are sequentially formed on the substrate 110 on which the barrier layers 212 and 214 have been formed. The gate material layers 220, 230, and 240 may be formed to fill a space between a pair of gate spacer layers 142 and a space between a pair of gate spacer layers 144 and cover the gate spacer layers 142 and 144 and the interlayer insulating layer 150.

In some embodiments, the first gate material layer 220 may comprise a metal-containing material including at least one selected from Ti, Ta, Al, W, Ru, Nb, Mo, Hf, Ni, Co, Pt, Yb, Tb, Dy, Er, and Pd, but embodiments of the present inventive concepts are not limited thereto. The second gate material layer 230 may include a metal nitride, for example, TiN, TaN, or a combination thereof, but embodiments of the present inventive concepts are not limited thereto. The third gate material layer 240 may include W, but embodiments of the present inventive concepts are not limited thereto.

The first gate material layer 220 may be formed to have a uniform thickness to define a first recess space RS1 in a space between a pair of gate spacer layers 142 and a space between a pair of gate spacer layers 144 while covering the substrate 110. The second gate material layer 230 may be formed to have a uniform thickness on the first gate material layer 220.

In some embodiments, the second gate material layer 230 may completely fill the first recess space RS1 in the first region I. Accordingly, the second gate material layer 230 may have a seam 230S extending along the center between a pair of gate spacer layers 142 in the first recess space RS1 of the first region I.

In the first region I, a lower portion of the first recess space RS1 may be narrow than an upper portion thereof. Accordingly, in the first recess space RS1, the width of an upper portion of the second gate material layer 230 may be greater than that of a lower portion thereof. In the first region I, the first recess space RS1 may have a bottom having same level regardless of the position where the first recess space RS1 is formed. For example, when the first recess space RS1 is on the first active region FN1 (position "A"), when the first recess space RS1 is on both the first active region FN1 and the device isolation layer 120 (position "B"), and when the first recess space RS1 is in the device isolation layer 120 (position "E"), the bottom of the first recess space RS1 may have a level higher than that of the upper surface of the first active region FNS.

In the second region II, the second gate material layer 230 may be formed to define a second recess space RS2 in the first recess space RS1. The third gate material layer 240 may be formed in the second region II to fill the second recess space RS2.

To form the third gate material layer 240, a preliminary third gate material layer (not shown), which fills the second recess space RS2 and covers the substrate 110, may be formed on the second gate material layer 230, and then a planarization process such as a CMP process may be performed to remove a portion of the preliminary third gate material layer until the second gate material layer 230 is exposed.

In the second region II, the first recess space RS1 may have a bottom having a different level according to the position where the first recess space RS1 is formed. For example, when the first recess space RS1 is on both the second active region FN2 and the device isolation layer 120 (position "C") and when the first recess space RS1 is on the device isolation layer 120 (position "F"), the bottom of the first recess space RS1 may have a level lower than that of the upper surface of the second active region FN2. When the first recess space RS1 is on the second active region FN2 (position "D"), the bottom of the first recess space RS1 may have a level higher than that of the upper surface of the second active region FN2.

Accordingly, when the second recess space RS2 is on both the second active region FN2 and the device isolation layer 120 (position "C") and when the second recess space RS2 is in the device isolation layer 120 (position "F"), the third gate material layer 240 may extend up to a level lower than that of the upper surface of the second active region FN2.

However, the shapes of the second recess space RS2 and third material layer 240 on both the second active region FN2 and the device isolation layer 120 are not limited thereto. For example, when a portion on the device isolation layer 120 of the first recess space RS1 on both the device isolation layer 120 and the second active region FN2 (position "C") is relatively small, due to the width of the second active region FN2 in the first direction X, the location of the second gate spacer layer 144, and the extent of misalignment in a photolithography process performed to form the second active region FN2 and the second gate spacer layer 144, a portion of the second recess space RS2 and a portion of the third gate material layer 240, which extend up to a level lower than that of the upper surface of the second active region FN2 and have a relatively narrow width, may not be formed.

FIGS. 9A through 9D are cross-sectional views illustrating a process of forming a gate line, according to an exemplary embodiment of the inventive concept.

Referring to FIGS. 9A through 9D, a first gate line 202 and second gate lines 204a and 204b are formed by partially removing the first through third gate material layers 220, 230, and 240 shown in FIGS. 8A through 8D. As the first through third gate material layers 220, 230, and 240 shown in FIGS. 8A through 8D are partially removed, a third recess space RS3 may be defined between a pair of gate spacer layers 192 and 194. The upper surfaces of the first and second gate lines 202, 204a, and 204b may have a level that is lower than those of the tops of the pair of gate spacer layers 192 and 194. The upper surface of each of the first and second gate lines 202, 204a, and 204b may have a concave shape at a central portion thereof.

The first gate line 202 is formed in the first region I, and the second gate lines 204a and 204b are formed in the second region II. When the second gate lines 204a and 204b extend in the second direction Y, a part 204a, located on the second active region FN2 (position "D"), and a part 204b, at least a portion of which is located on the device isolation layer 120 (position "C" or "F"), that is, the part 204b that is on both the second active region FN2 and the device isolation layer 120 (position "C") or on the device isolation layer 120 (position "F"), may be integrally formed.

The first gate line 202 may correspond to the first gate line GL1 shown in FIG. 1A and/or the gate line GLb shown in FIG. 2B. The second gate lines 204a and 204b may correspond to the second gate line GL2 shown in FIG. 1B and/or the gate line GLa shown in FIG. 2A.

An upper portion of a second barrier layer 213a may also be removed in the process of forming the second gate lines 204a and 204b.

In the first region I, the upper surface of the first gate line 202 may have a concave shape at a central portion thereof. The first gate insulating layer 180 may extend from between the first active region FN1 and the first gate line 202 to between the first gate spacer layer 142 and the first gate line 202. In the process of forming the first gate line 202, an upper portion of the first gate insulation layer 180, that is, an upper portion of the first high-permittivity dielectric layer 184, is removed, and thus, the top of the first gate insulating layer 180, that is, the top of the first high-permittivity dielectric layer 184, may have a level lower than that of the top of the first gate spacer layer 142 or the top of the interlayer insulating layer 150. Due to etch selectivity between a material forming the first gate insulating layer 180 and a material forming the first gate line 202, the top of the first gate insulating layer 180 may have a level higher than that of the top of the first gate line 202.

The first gate line 202 may include a first barrier layer 212, a first gate electrode layer 222 defining a fourth recess space RS4, and a second gate electrode layer 232 filling the fourth recess space RS4. The upper surface of the first gate electrode layer 222 and the upper surface of the second gate electrode layer 232 may themselves each form a continuous surface. The level of the continuous surface with respect to the substrate 110 may be gradually reduced from a part adjacent to the first gate insulating layer 180, that is, the first high-permittivity dielectric layer 184, to the central portion of the second gate electrode layer 232. Accordingly, the top of the first gate electrode 222 may have a level higher than that of the top of the second gate electrode 232.

In the upper surface of the first gate electrode layer 222, a part adjacent to the first gate insulating layer 180, that is, the first high-permittivity dielectric layer 184, may have a level higher than that of a part adjacent to the second gate electrode layer 180.

A central portion of the second gate electrode layer 232 may have a seam 230S that extends from the upper surface of the second gate electrode layer 232 toward the inside thereof. In the process of removing a portion of the second gate material layer 230 to form the second gate electrode 232, the etch rate may be relatively high at the seam 230S. Accordingly, the central portion of the second gate electrode layer 232 may have a level lower than that of an outer portion thereof with respect to the substrate 110. In addition, the seam 230S of the second gate electrode 232 may extend from the central portion, which has the lowest level, of the upper surface of the second gate electrode 230 to the interior region thereof.

The lowest part of the upper surface of the first gate electrode 202 may have a second height H2 with respect to the first active region FN1, and the highest part of the upper surface of the first gate electrode 202 may have a third height H3 with respect to the first active region FN1.

The top of the first barrier layer 212 may have a first height H1 with respect to the first active region FN1, and the first height H1 may be less than the second and third heights H2 and H3. Accordingly, the top of the first barrier layer 212 may have a level lower than those of the first and second gate electrode layers 222 and 232.

Due to the presence of the first barrier layer 212, an upper portion of the fourth recess space RS4 defined by the first gate electrode layer 222 may be greater than a lower portion of the fourth recess space RS4. Accordingly, the width of an upper portion of the second gate electrode layer 232 that is formed in the fourth recess space RS4 may be greater than that of a lower portion of the second gate electrode layer 232.

In the second region II, the upper surface of each of the second gate lines 204a and 204b may have a concave cross-sectional shape at a central portion thereof. The second gate insulating layer 190 may extend from between the second active region FN2 and each of the second gate lines 204a and 204b to between the second gate spacer layer 144 and each of the second gate lines 204a and 204b. In the process of forming the second gate lines 204a and 204b, an upper portion of the second gate insulation layer 190, that is, an upper portion of the second high-permittivity dielectric layer 194, is removed, and thus, the top of the second gate insulating layer 190, that is, the top of the second high-permittivity dielectric layer 194, may have a level that is lower than that of the top of the second gate spacer layer 144 or the top of the interlayer insulating layer 150. Due to an etch selectivity between a material forming the second gate insulating layer 190 and a material forming the second gate lines 204a and 204b, the top of the second gate insulating layer 190 may have a level higher than that of the top of each of the second gate lines 204a and 204b.

The second gate line 204a, which is placed on the second active region FN2, may include a second barrier layer 214a, a first gate electrode layer 224 defining the fourth recess space RS4, and a second gate electrode layer 234 filling the fourth recess space RS4. The upper surface of the first gate electrode layer 224 and the upper surface of the second gate electrode layer 234 may form a continuous surface. The level of the continuous surface with respect to the substrate 110 may be gradually reduced from a part adjacent to the second gate insulating layer 190, that is, the second high-permittivity dielectric layer 194, to the central portion of the second gate electrode layer 234. Accordingly, the top of the first gate electrode 224 may have a level higher than that of the top of the second gate electrode 234. In the upper surface of the first gate electrode layer 224, a part adjacent to the second gate insulating layer 190, that is, the second high-permittivity dielectric layer 194, may have a level higher than that of a part that is adjacent to the second gate electrode layer 234. The central portion of the second gate electrode layer 234 may have a level lower than that of an outer portion thereof with respect to the substrate 110. The top of the second barrier layer 214a may have a height same as or similar to that of the top of the first gate electrode layer 224.

The second gate line 204b, at least a portion of which is placed on the device isolation layer 120, may include the second barrier layer 214a, the first gate electrode layer 224 defining the fourth space RS4, the second gate electrode layer 234 defining a fifth recess space RS5 while covering the inside wall of the fourth recess space RS4, and a third gate electrode layer 244 filling the fifth recess space RS5. The upper surfaces of the first through third gate electrode layers 224, 234, and 244 may form a continuous surface.

The shape of the second gate line 204b, at least a portion of which is placed on the device isolation layer 120, is similar to that of the second gate line 204a, which is placed on the second active region FN2, except that the second gate line 204b includes the fifth recess space RS5, which is defined by the second gate electrode layer 234, and the third gate electrode layer 244 filling the fifth recess space RS5. Thus, repeated descriptions of the second gate line 204b are omitted.

As stated above, the second gate line 204b, at least a portion of which is placed on the device isolation layer 120, includes the third gate electrode layer 244. However, the second gate line 204a, which is placed on the second active region FN2, does not include the third gate electrode layer 244 since a part corresponding to the third gate material layer 240 is completely removed in the process of partially removing the first through third gate material layers 220, 230, and 240 shown in FIGS. 8A through 8D.

Figure 9A:
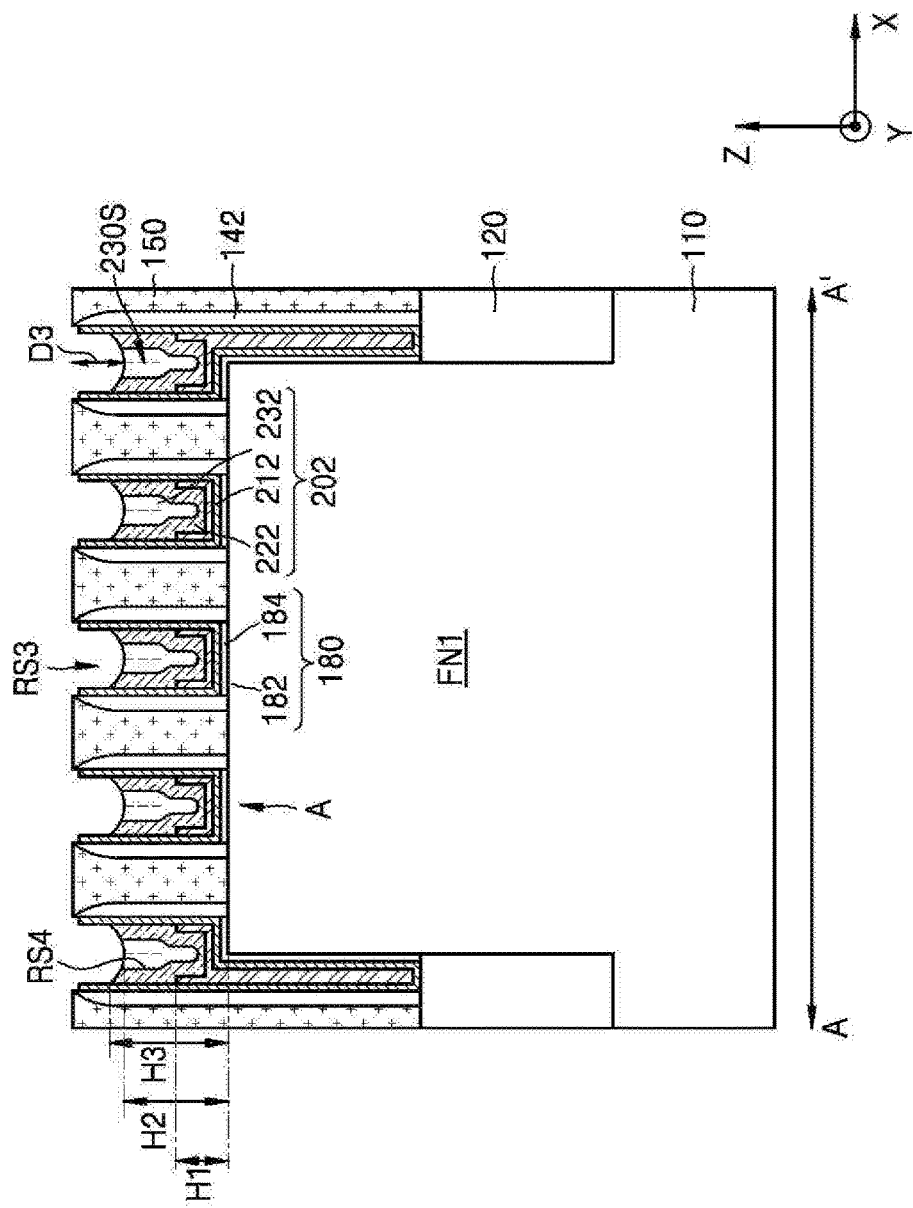
Figure 9B:
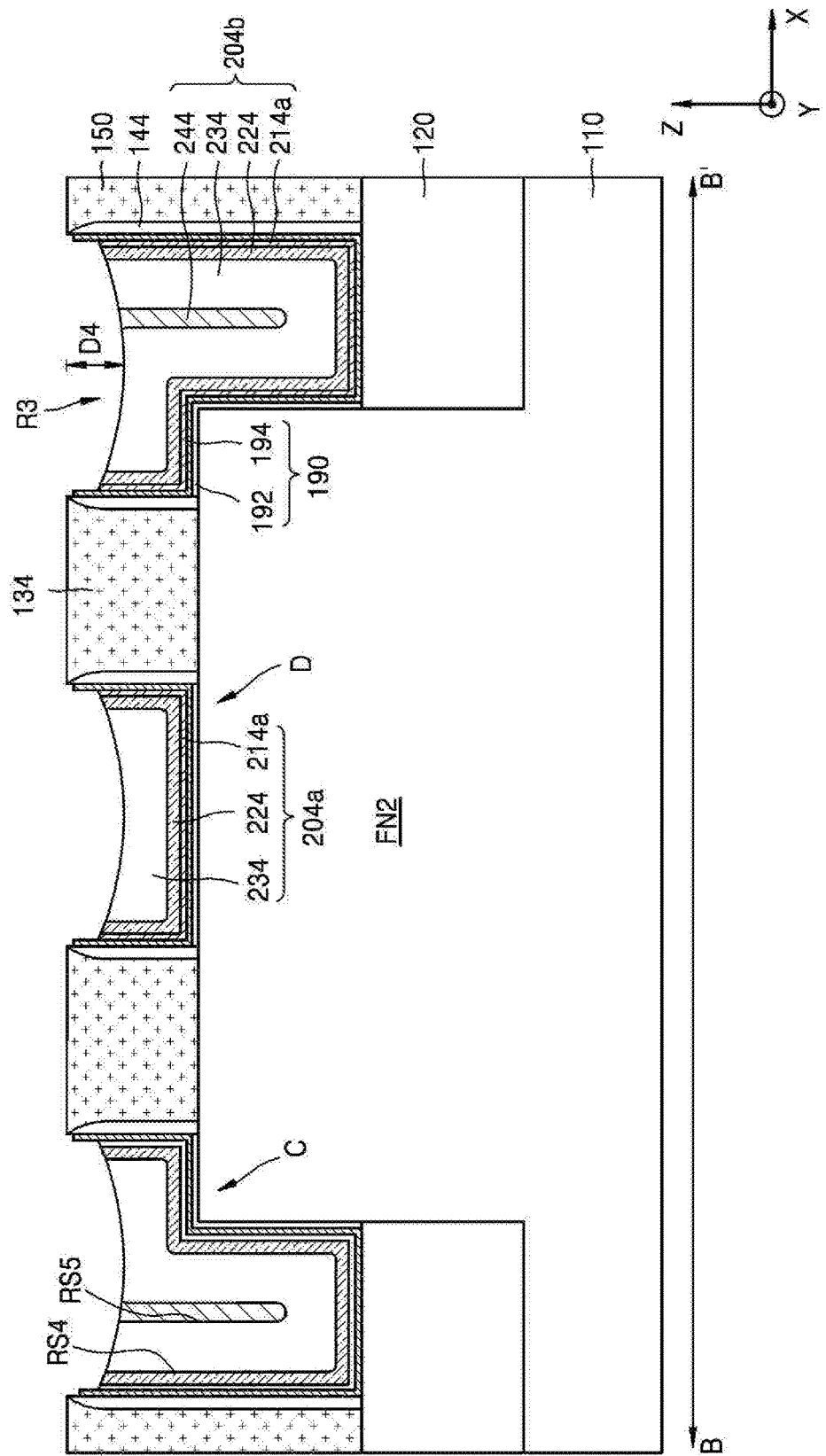
Figure 9C:
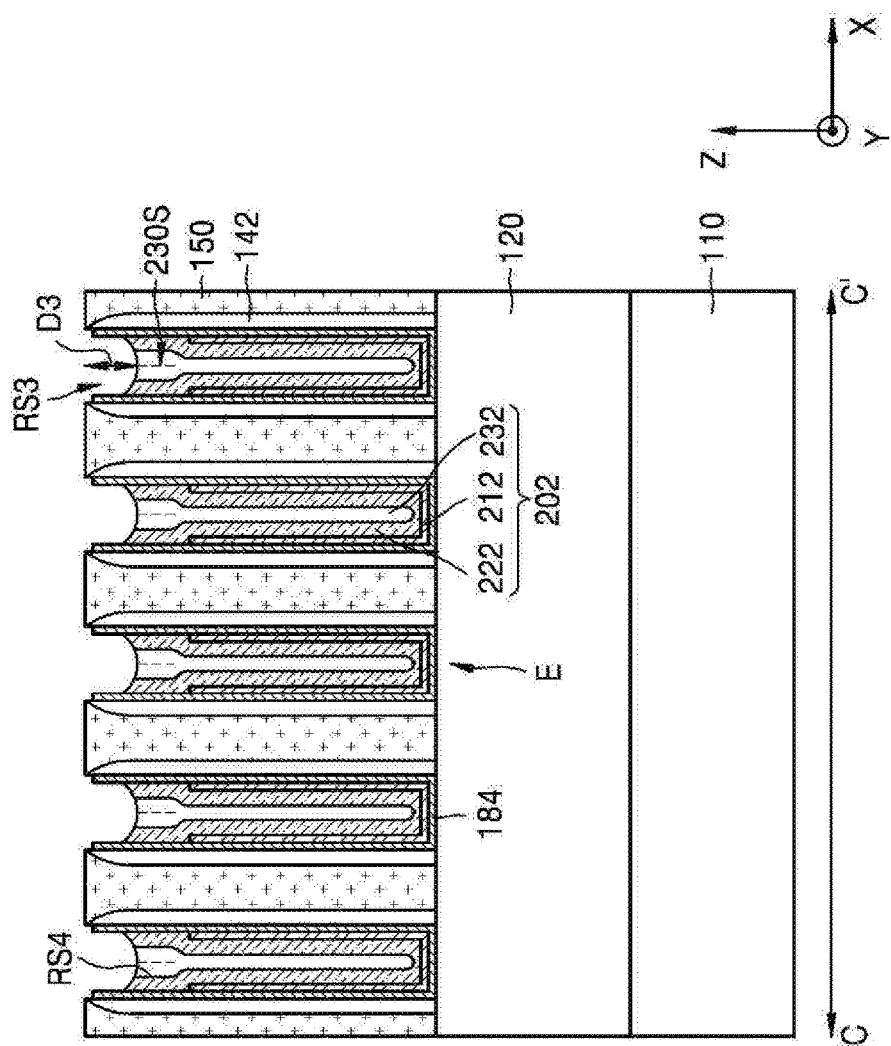

A part of the third gate electrode layer 244, which is adjacent to the side of the second active region FN2, as shown in FIG. 9B, may not be formed due to the width of the second active region FN2 in the first direction X, the location of the second gate spacer layer 144, and the extent of misalignment in a photolithography process that is performed to form the second active region FN2 and the second gate spacer layer 144. In other words, the second gate line 204b, formed over the second active region FN2 and the device isolation layer 120, may include the third gate electrode layer 244, but this layer is optional, and, in some embodiments, the third gate electrode layer 244 may not be formed.

In some embodiments, a third depth D3 measured from the upper surface of the interlayer insulating layer 150 to a lowest level of the upper surface of the first gate line 202 may be greater than a fourth depth D4 from the upper surface of the interlayer insulating layer 150 to a lowest level of the upper surfaces of the second gate lines 204a and 204b.

FIGS. 10A through 10D are cross-sectional views illustrating a process of forming a gate capping layer, according to an exemplary embodiment of the inventive concepts.

Referring to FIGS. 10A through 10D, a gate capping layer 300 is formed on the gate lines 202, 204a and 204b. The upper surface of the gate capping layer 300 may have same level as the tops of the gate spacer layers 142 and 144. In some embodiments, the gate capping layer 300 may include, for example, an insulating material such as silicon nitride. To form the gate capping layer 300, a gate capping material (now shown), which covers the substrate 110 while filling the third recess space RS3, may be formed, and then a planarization process such as a CMP process may be performed to expose the interlayer insulating layer 150 and the gate spacer layers 142 and 144.

The gate insulating layer 180 may extend from between the gate spacer layer 142 and the gate line 202 to between the gate spacer layer 142 and the gate capping layer 300, and the gate insulating layer 190 may extend from between the gate spacer layer 144 and each of the gate lines 204a and 204b to between the gate spacer layer 144 and the gate capping layer 300. The tops of the gate insulating layers 180 and 190 may have a level lower than that of the upper surface of the gate capping layer 300, and may be covered by the gate capping layer 300.

The gate lines 202, 204a and 204b may be formed so that the gate lines 202, 204a and 204b have a relatively narrow width and a relatively smaller pitch and a void does not occur. In addition, the gate capping layer 300 may prevent a short circuit from being generated between each of the gate line 202, 204a and 204b and an unwanted part.

Figure 11A:
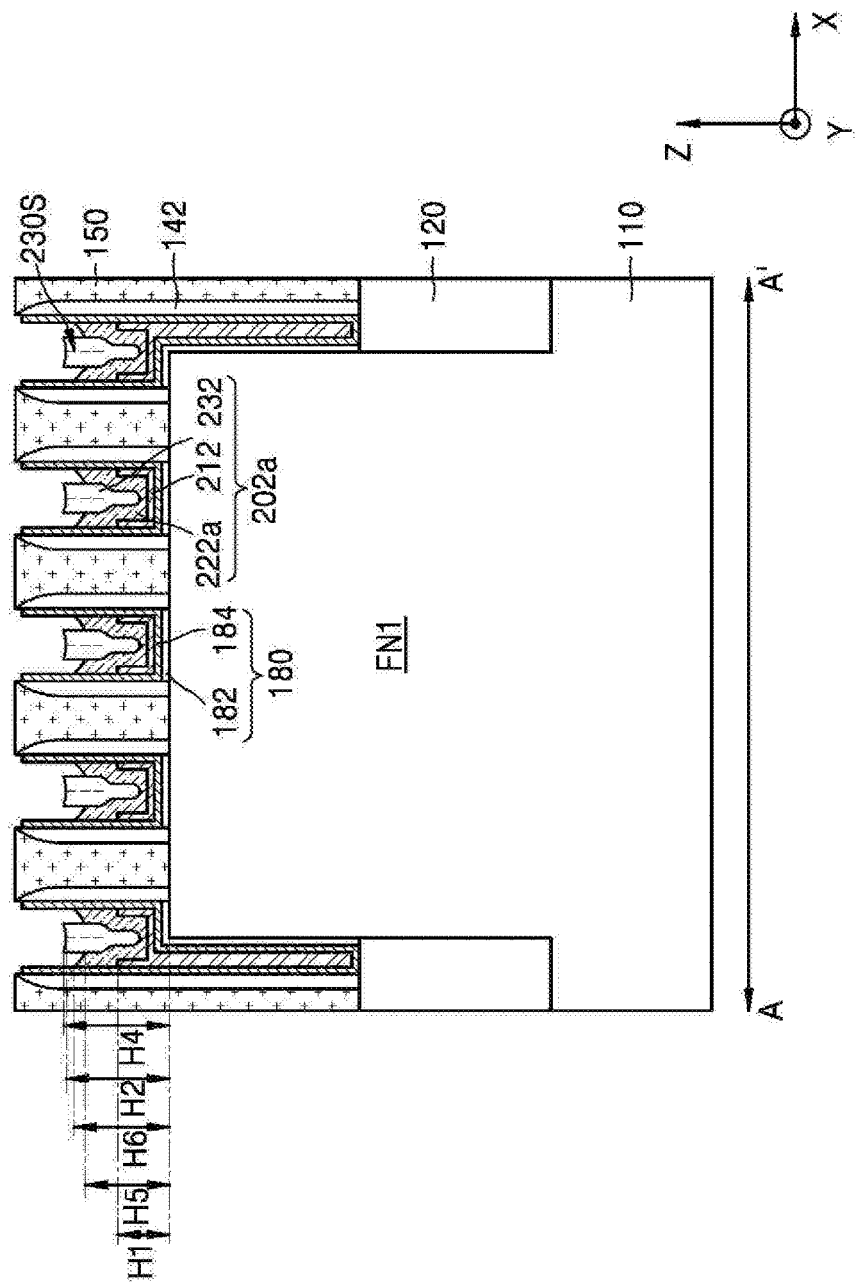
FIGS. 11A through 12D are cross-sectional views sequentially illustrating a method of manufacturing a semiconductor device, according to an exemplary embodiment of the inventive concepts.
Figure 11B:
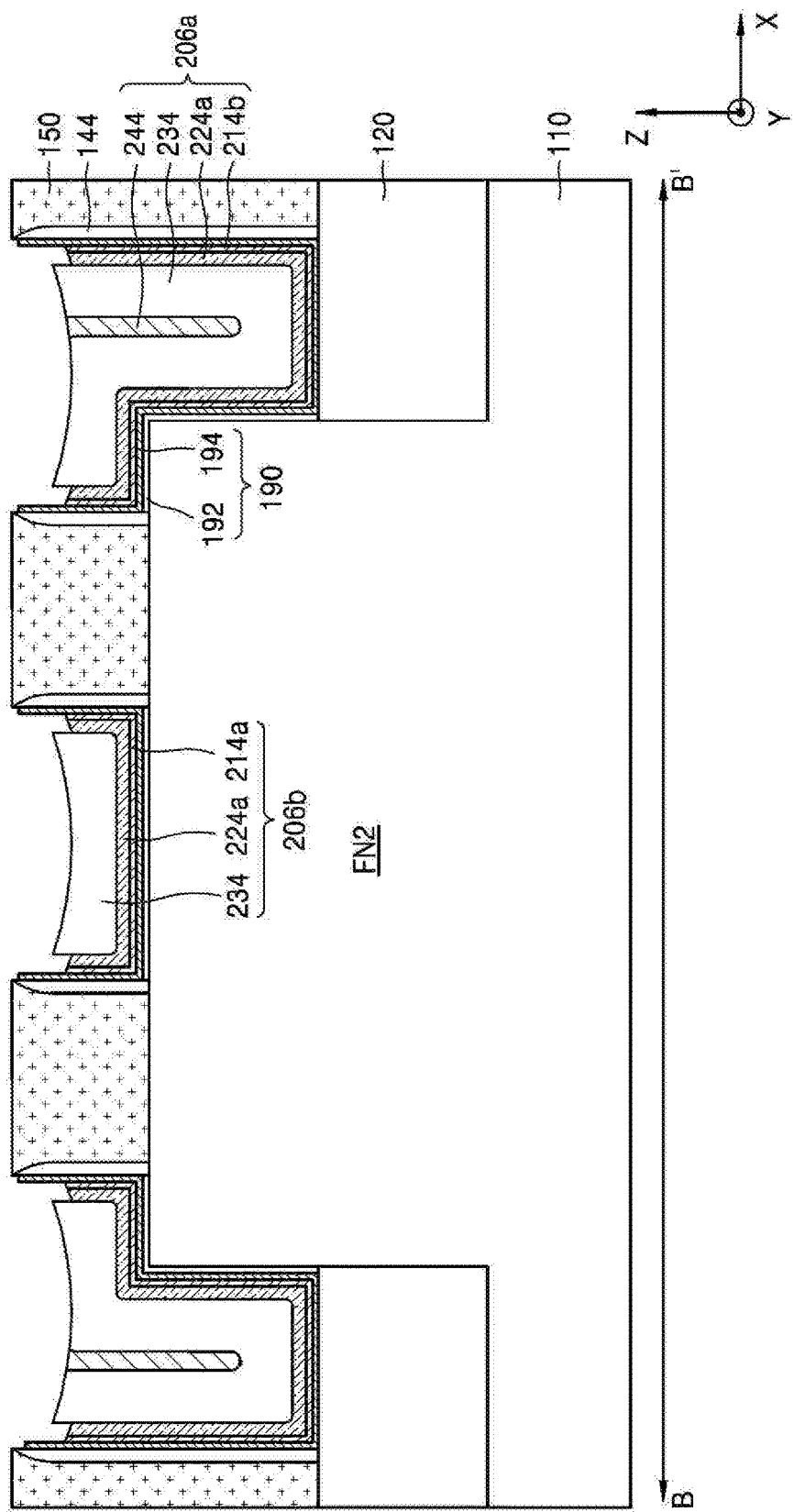
Figure 11C:
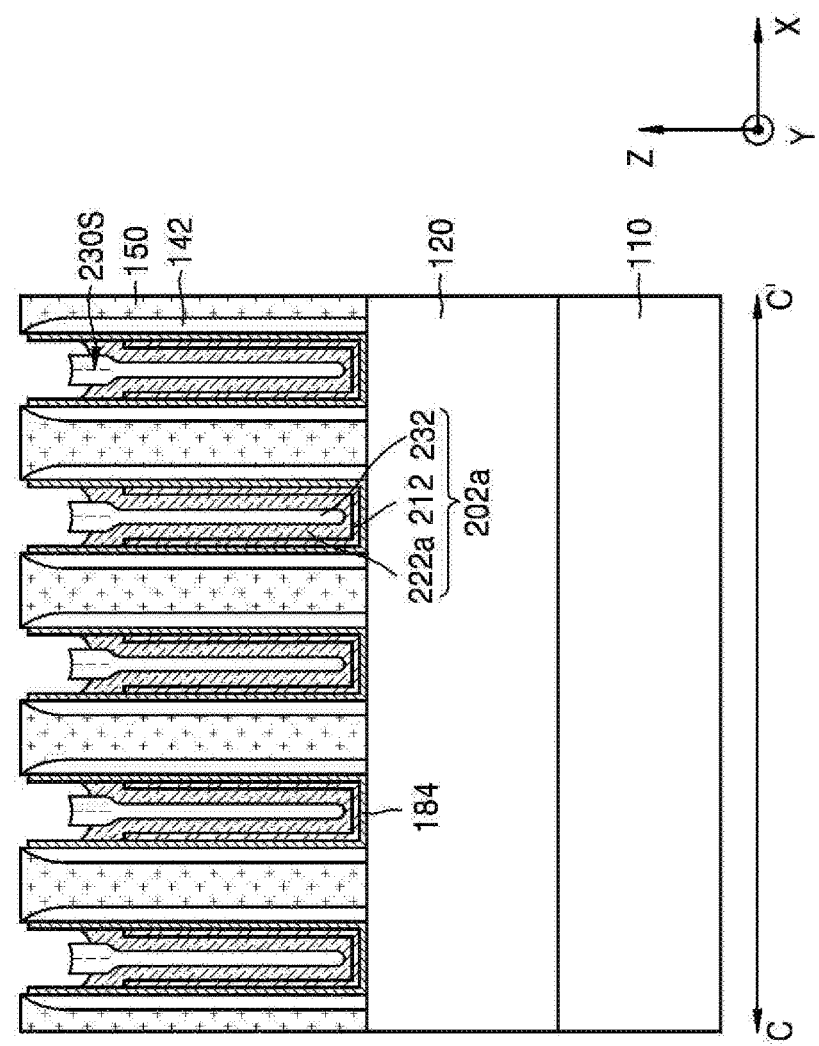
Figure 12A:
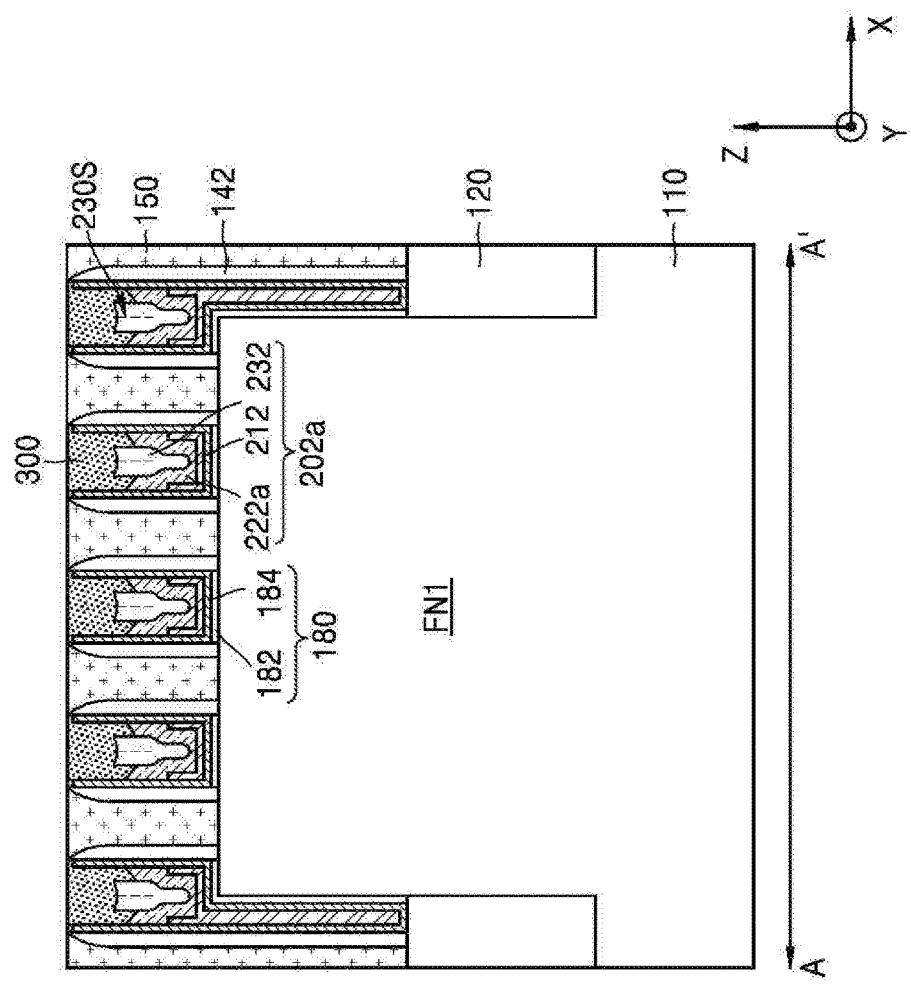
Figure 12B:
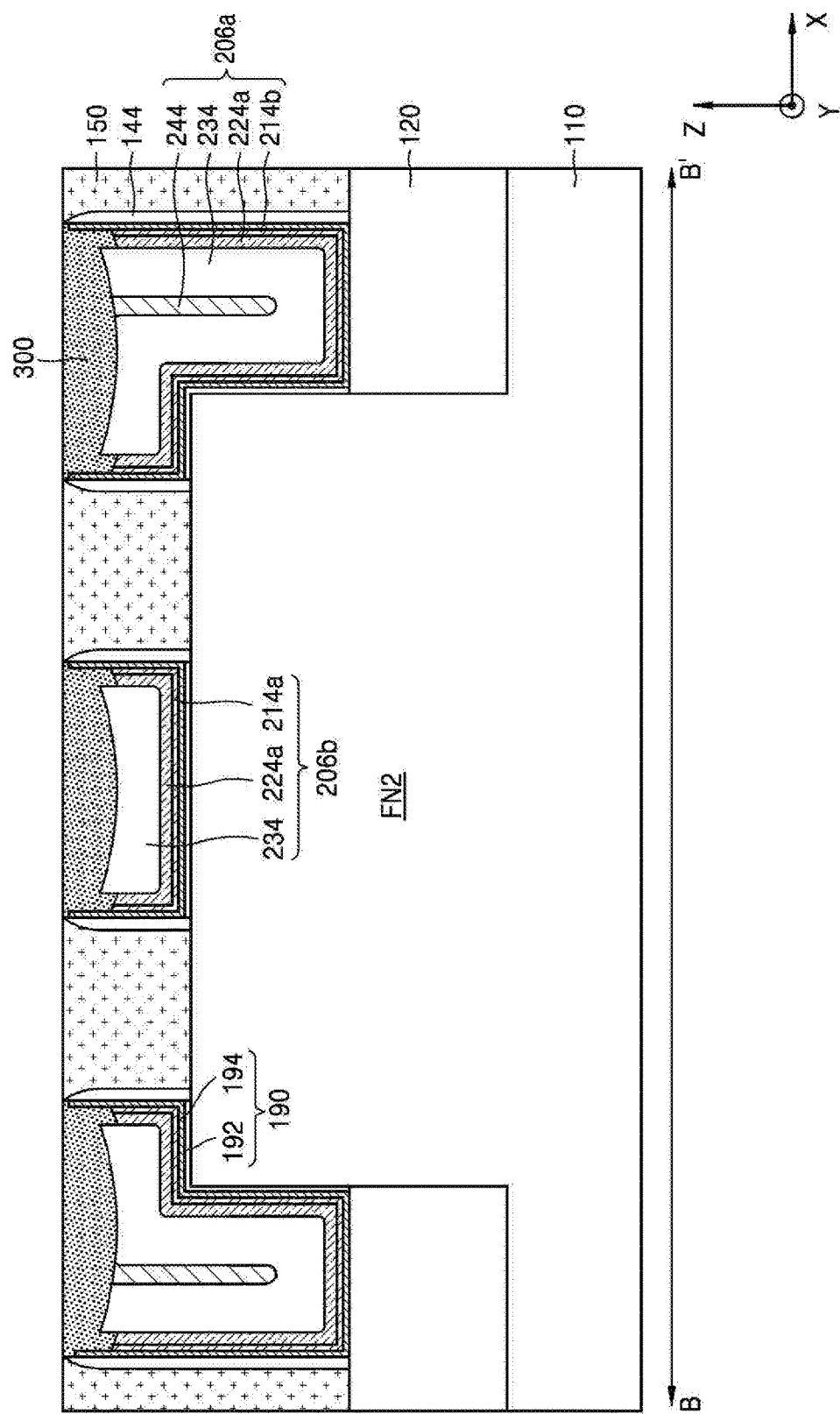
Figure 12C:
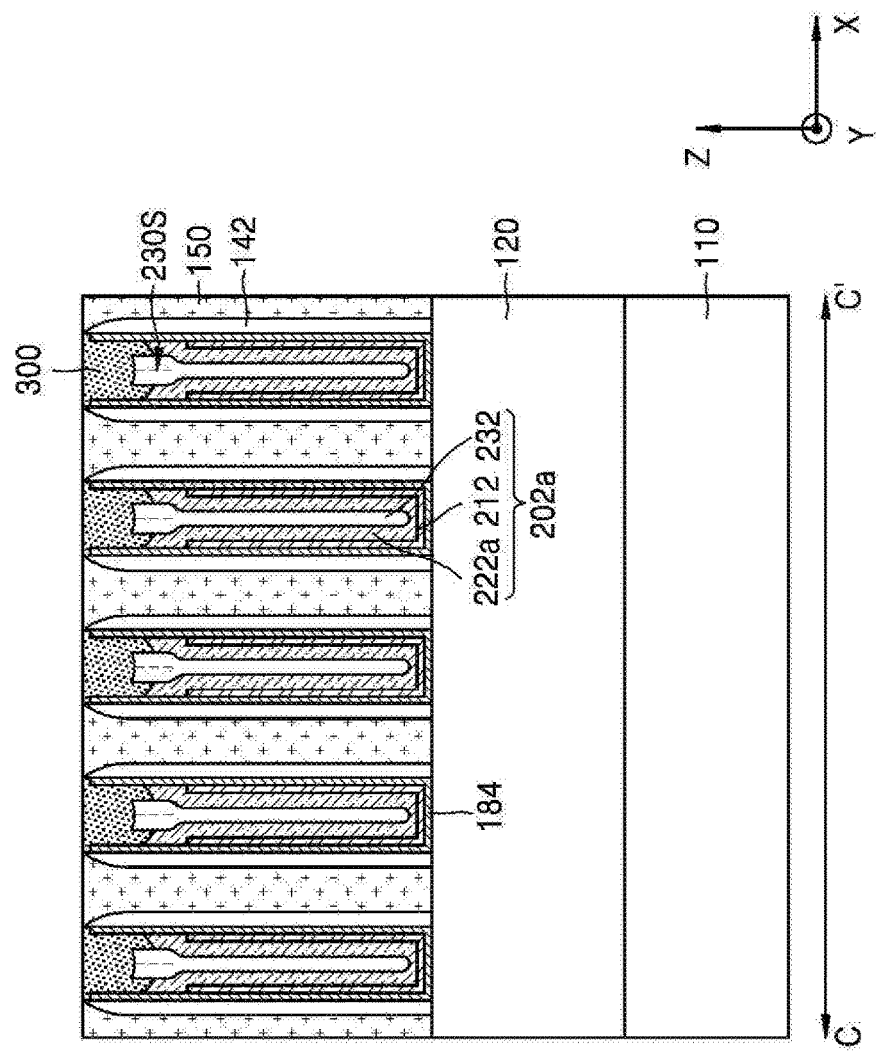

FIGS. 11A through 12D are cross-sectional views sequentially illustrating a method of manufacturing a semiconductor device, according to an exemplary embodiment of the inventive concept. Specifically, FIGS. 11A and 12A are cross-sectional views taken along a line A-A' of FIG. 1A, FIGS. 11B and 12B are cross-sectional views taken along a line B-B' of FIG. 1B, FIGS. 11C and 12C are cross-sectional views taken along a line C-C' of FIG. 1A, and FIGS. 11D and 12D are cross-sectional views taken along a line D-D' of FIG. 1B. Accordingly, FIGS. 11A, 12A, 11C, and 12C are cross-sectional views illustrating the first region I of FIG. 1A, and FIGS. 11B, 12B, 11D, and 12D are cross-sectional views illustrating the second region II of FIG. 1B. The descriptions of FIGS. 11A through 12D that overlap with those of FIGS. 3A through 10D are omitted.

FIGS. 11A through 11D are cross-sectional views illustrating a process of forming a gate line, according to an exemplary embodiment of the inventive concept. Specifically, FIGS. 11A through 11D are cross-sectional views illustrating a process performed after the process of FIGS. 9A through 9D.

Referring to FIGS. 11A through 11D, gate lines 202a, 206a, and 206b have irregular shapes in which second gate electrode layers 232 and 234 protrude from first gate electrode layers 222a and 224a. Accordingly, the upper surfaces of the second gate electrode layers 232 and 234 may have levels higher than those of the first gate electrode layers 222a and 224a with respect to the substrate 110. The first gate electrode layers 222a and 224a shown in FIGS. 11A through 11D may be formed by removing upper portions of the first gate electrode layers 222 and 224 shown in FIGS. 9A through 9D, so that the upper surfaces of the first gate electrode layers 222a and 224a have levels lower than those of the upper surfaces of the second gate electrode layers 232 and 234 with respect to the substrate 110.

Figure 9D:
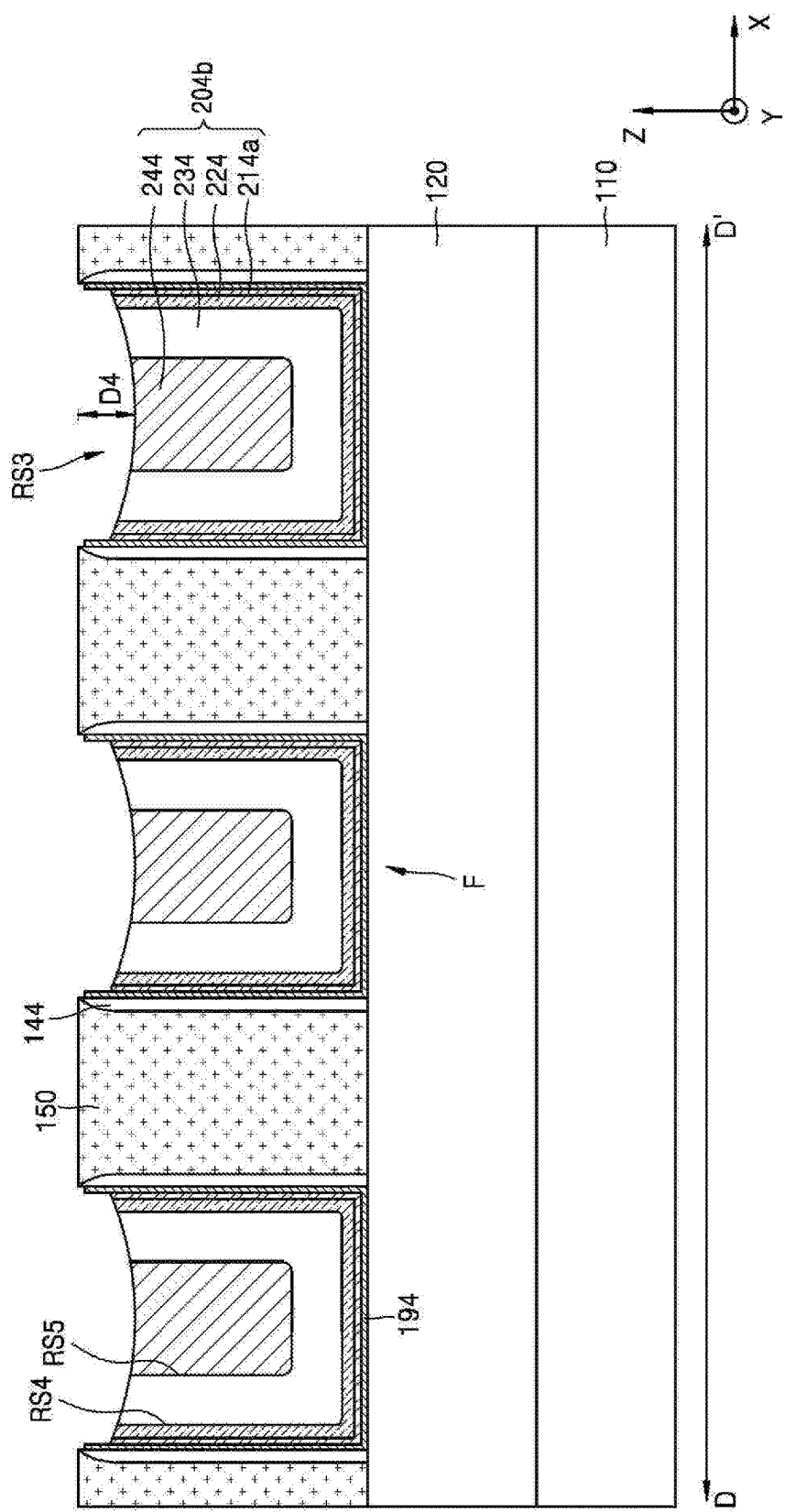
Figure 10A:
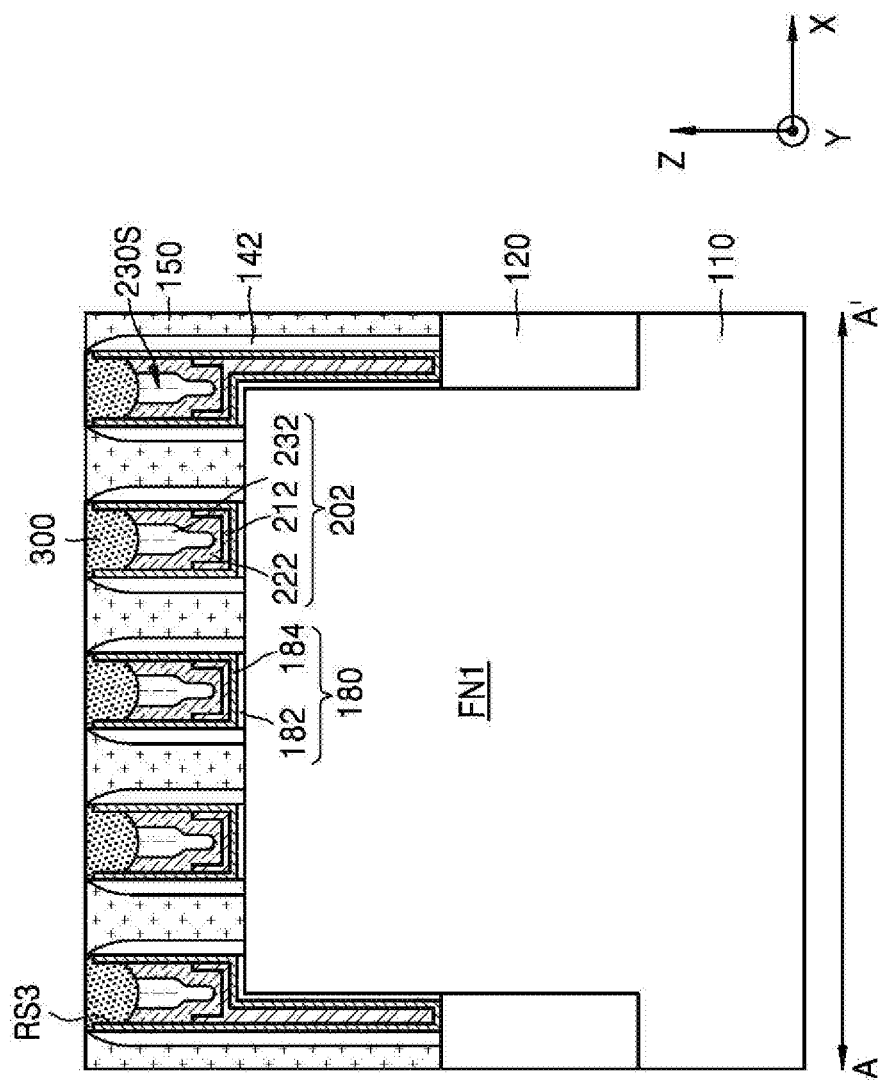
Figure 10B:
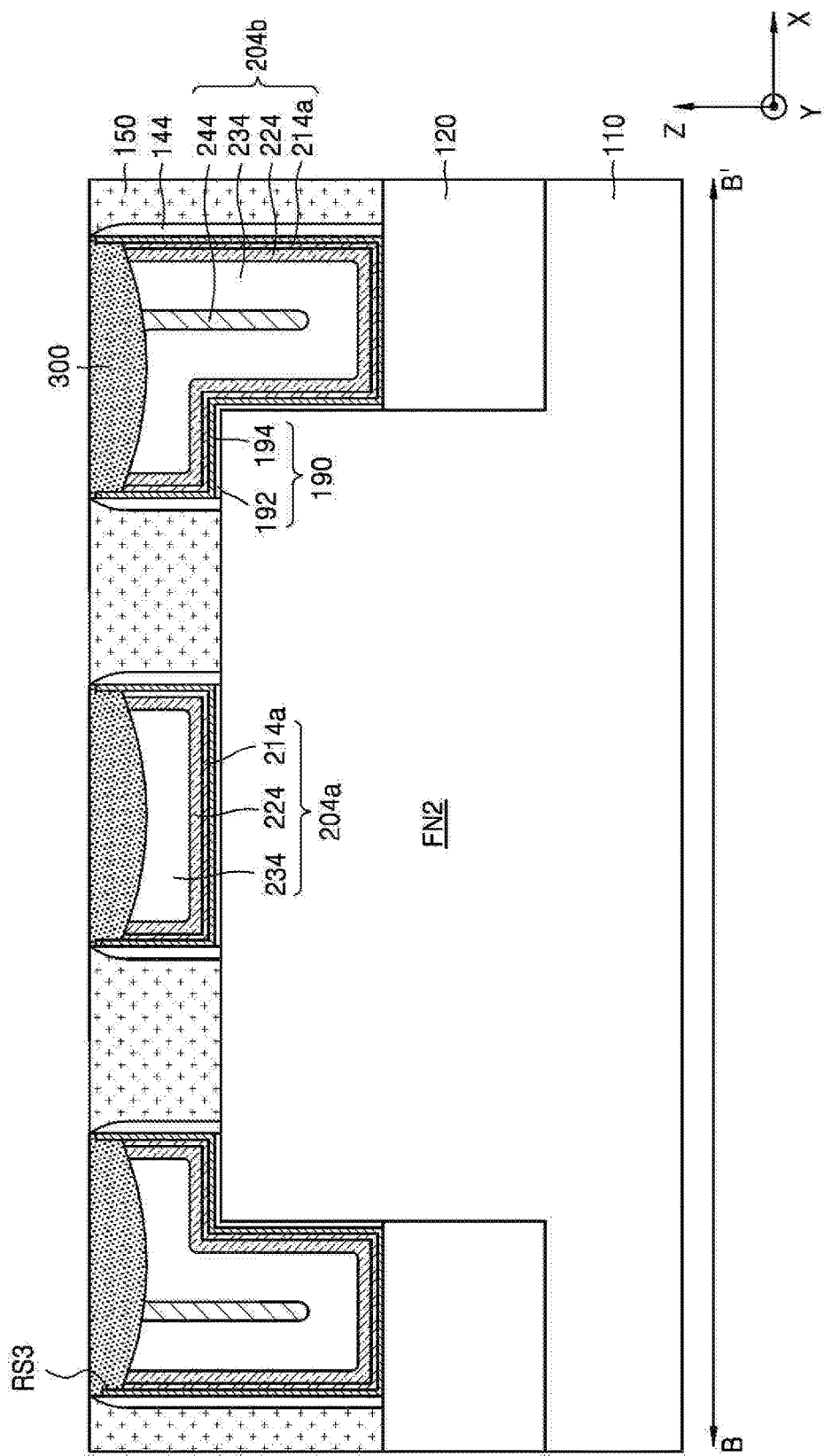
Figure 10C:
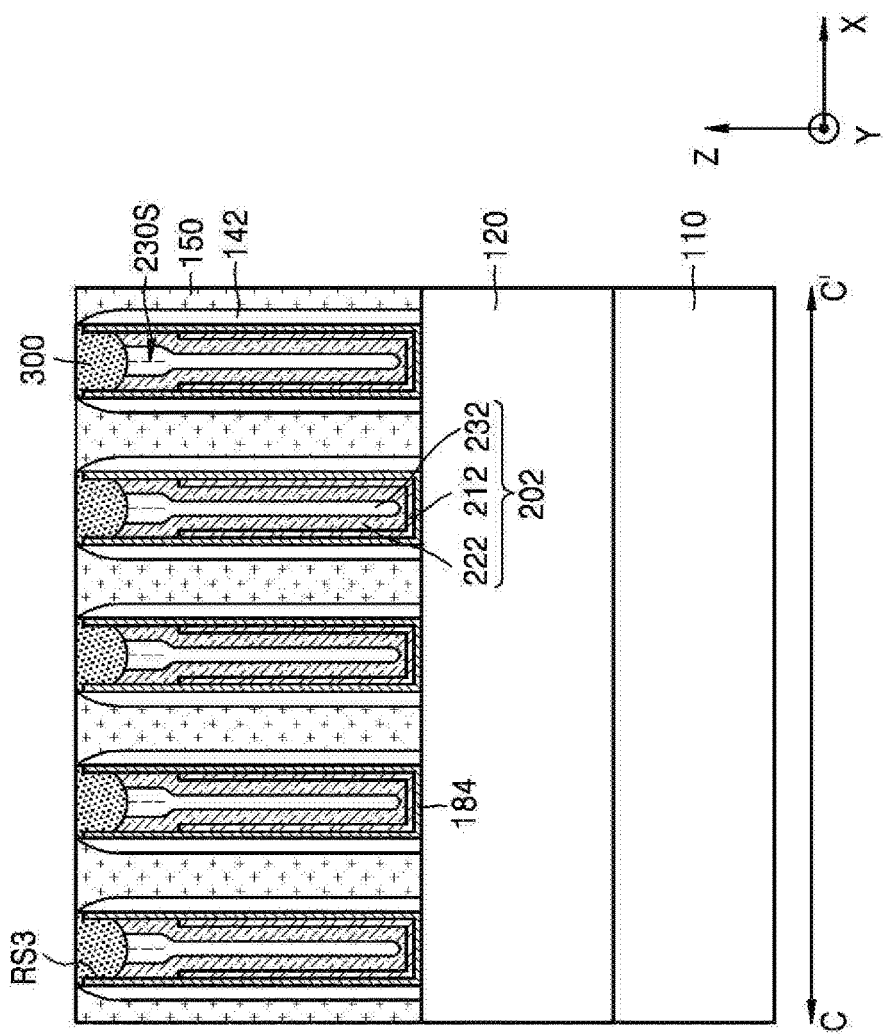
Figure 10D:
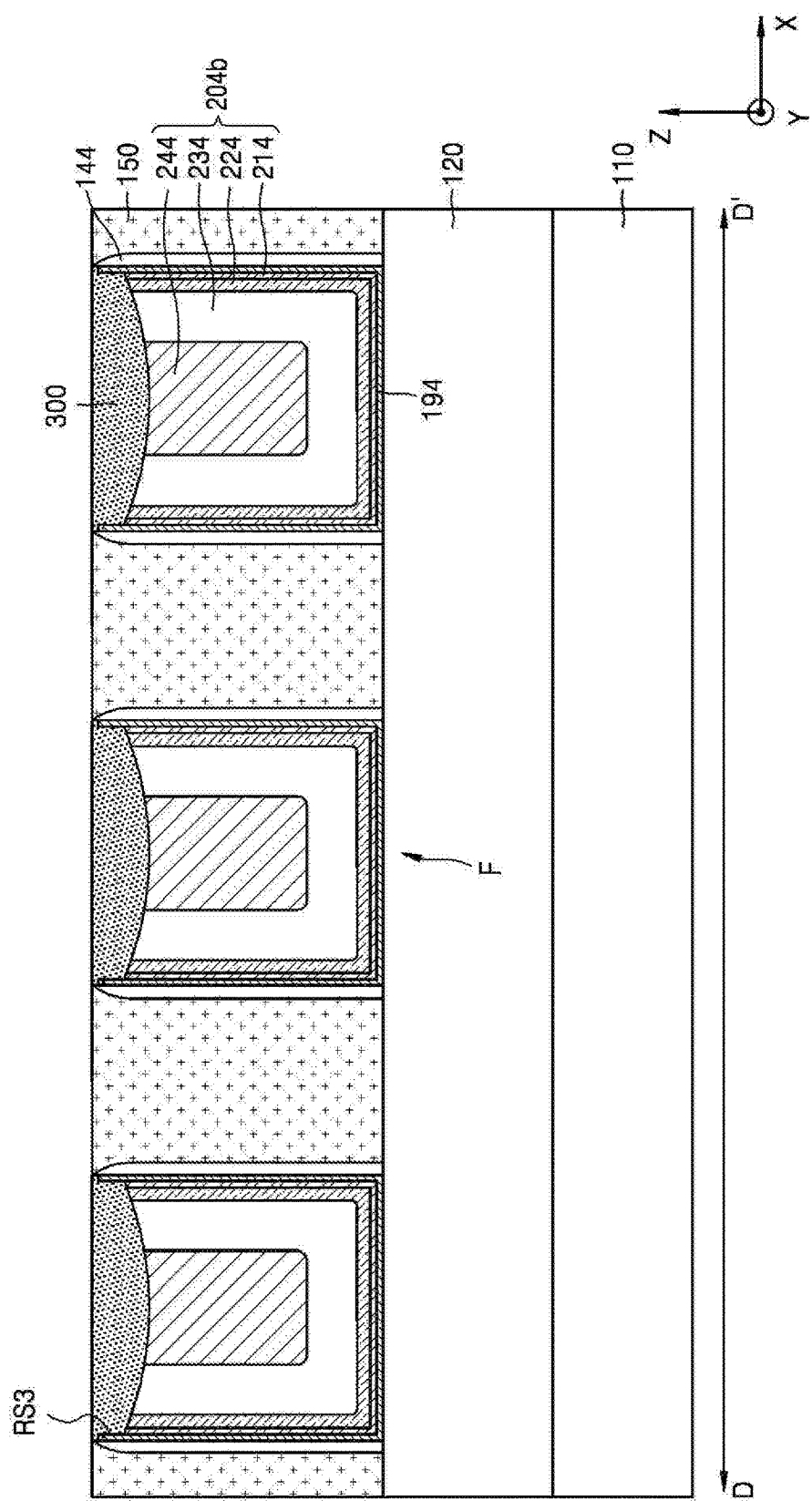

In the process of forming the first gate electrode layers 222a and 224a, an upper portion of the second barrier layer 214a shown in FIGS. 9B and 9D may also be removed to form the second barrier layer 214b shown in FIGS. 11A through 11D. The top of the second barrier layer 214b may have a height same as or similar to that of the top of the first gate electrode layer 224a.

In the upper surfaces of the first gate electrode layers 222 and 224 shown in FIGS. 9A through 9D, parts adjacent to the gate insulating layers 180 and 190 have levels higher than those of parts adjacent to the second gate electrode layers 212 and 214. Thus, regarding the upper surfaces of the first gate electrode layers 222a and 224a shown in FIGS. 11A through 11D, parts adjacent to the gate insulating layers 180 and 190 may have levels higher than those of parts that are adjacent to the second gate electrode layers 232 and 234.

The lowest part of the upper surface of the second gate electrode 232 forming the first gate line 202a may have a second height H2 from the first active region FN1, and the highest part of the upper surface of the second gate electrode 232 may have a fourth height H4 from the first active region FN1. The lowest part of the upper surface of the first gate electrode 222a forming the first gate line 202a may have a fifth height H5 from the first active region FN1, and the highest part of the upper surface of the first gate electrode 222a may have a sixth height H6 from the first active region FN1. The fifth height H5 and the sixth height H6 may be less than the second height H2 and the fourth height H4.

The shape of the gate line 206a is similar to that of the gate line 202a except that the gate line 206a includes the third gate electrode layer 244 described above with reference to FIGS. 9A through 9D. Thus, repeated descriptions of the gate line 206a are omitted.

FIGS. 12A through 12D are cross-sectional views illustrating a process of forming a gate capping layer, according to an exemplary embodiment of the inventive concepts.

Referring to FIGS. 12A through 12D, a gate capping layer 300 is formed on the gate lines 202a, 206a, and 206b. In some embodiments, the upper surface of the gate capping layer 300 may have same level as the tops of gate spacer layers 142 and 144.

Since the second gate electrode layers 232 and 234 has irregular shapes protruding from the first gate electrode layers 222a and 224a, respectively, a portion of the gate capping layer 300 may be positioned between an upper portion of each of the second gate electrode layers 232 and 234 and the gate insulating layer 180 in a horizontal direction with respect to the main surface of the substrate 110. The gate capping layer 300 may be in contact with at least a portion of the side of each of the second gate electrode layers 232 and 234.

Since the gate lines 202a, 206a, and 206b each have a protruding irregular shape, a parasitic capacitance formed between each of the gate lines 202a, 206a, and 206b and its surrounding area may be reduced.

Figure 13A:
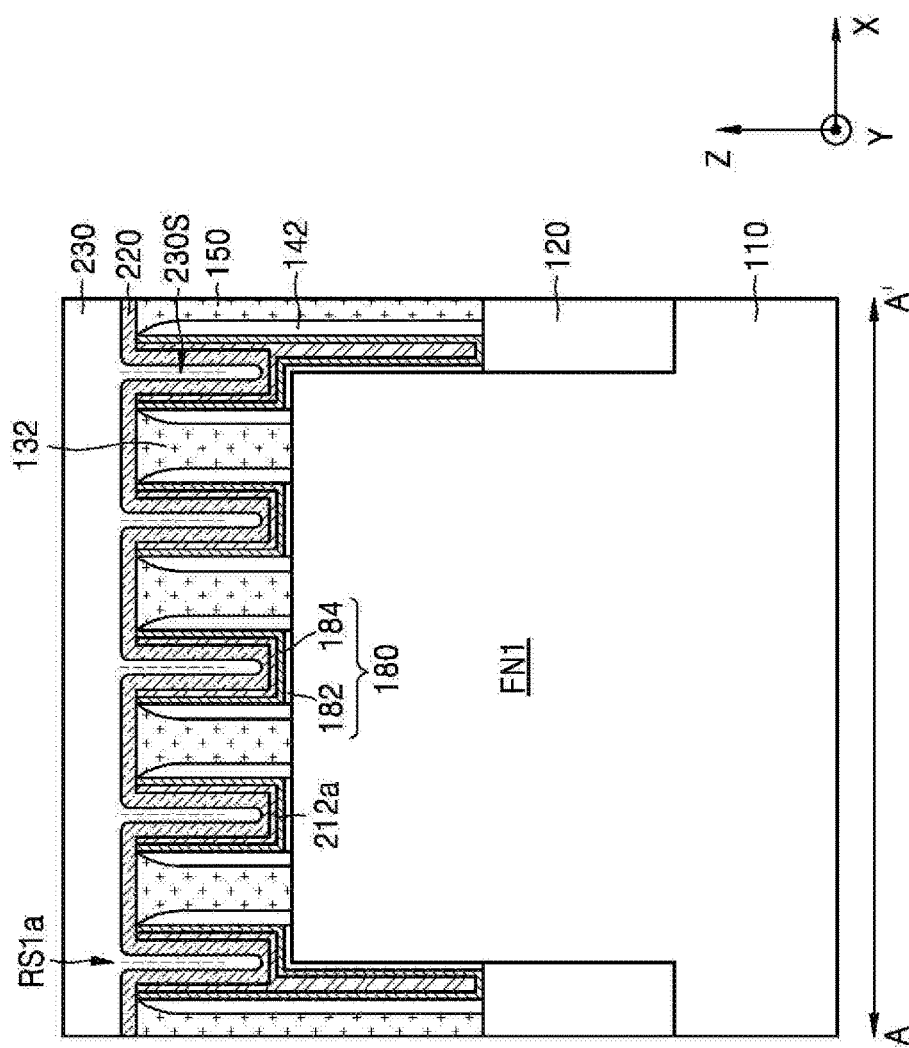
FIGS. 13A through 15D are cross-sectional views sequentially illustrating a method of manufacturing a semiconductor device, according to an exemplary embodiment of the inventive concepts.
Figure 13B:
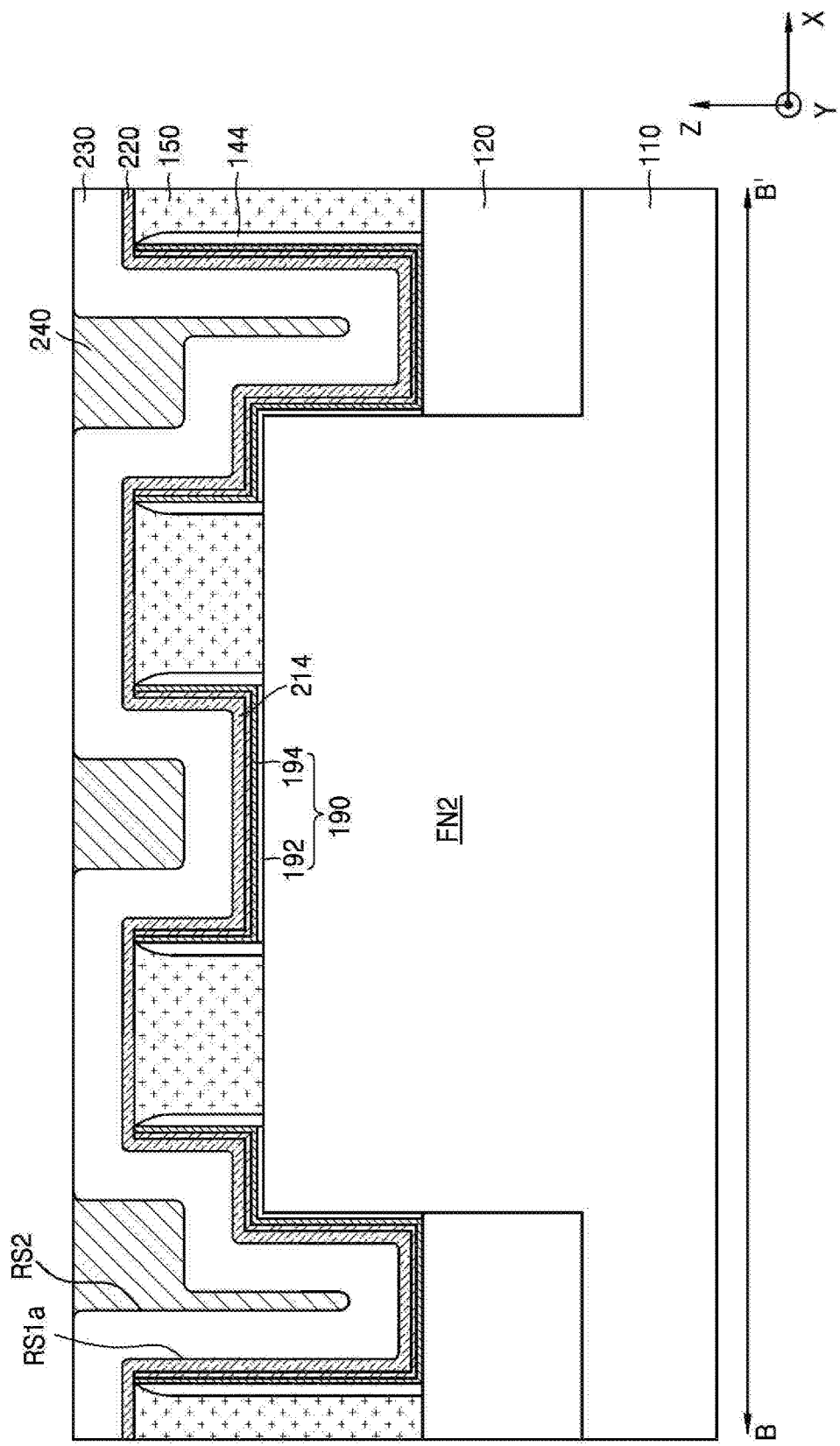
Figure 13C:
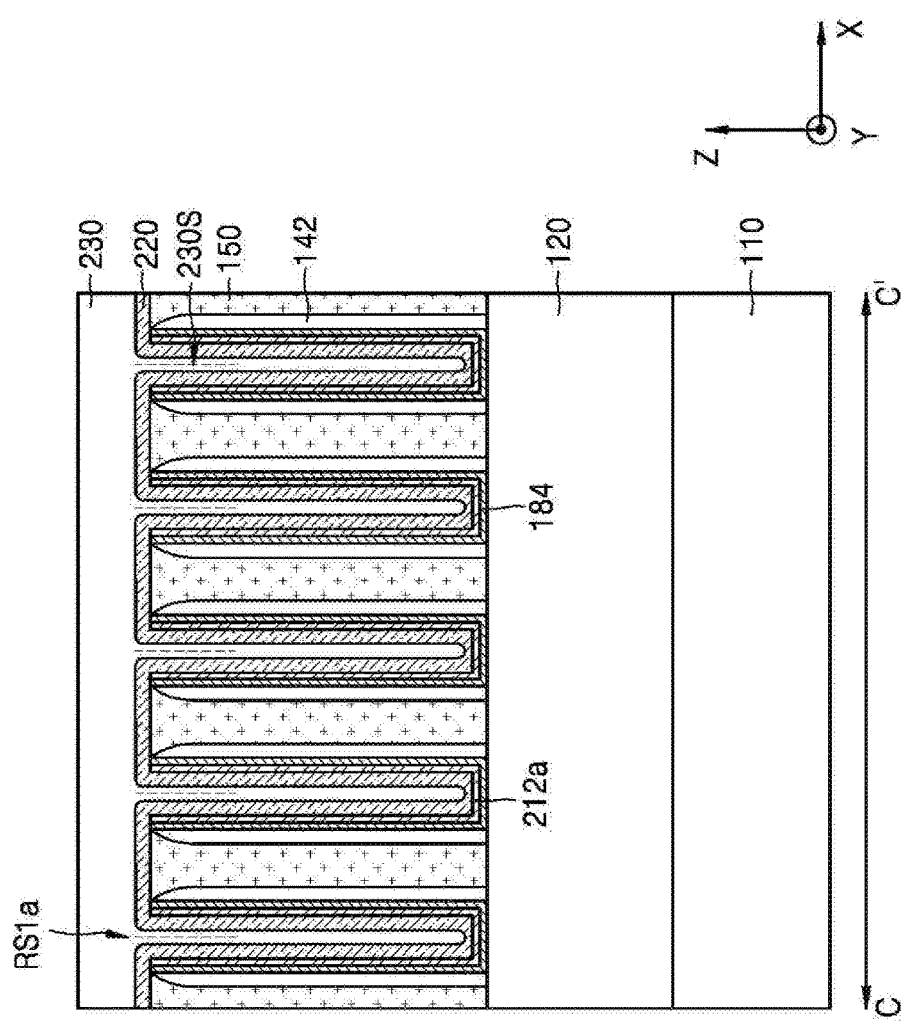
Figure 13D:
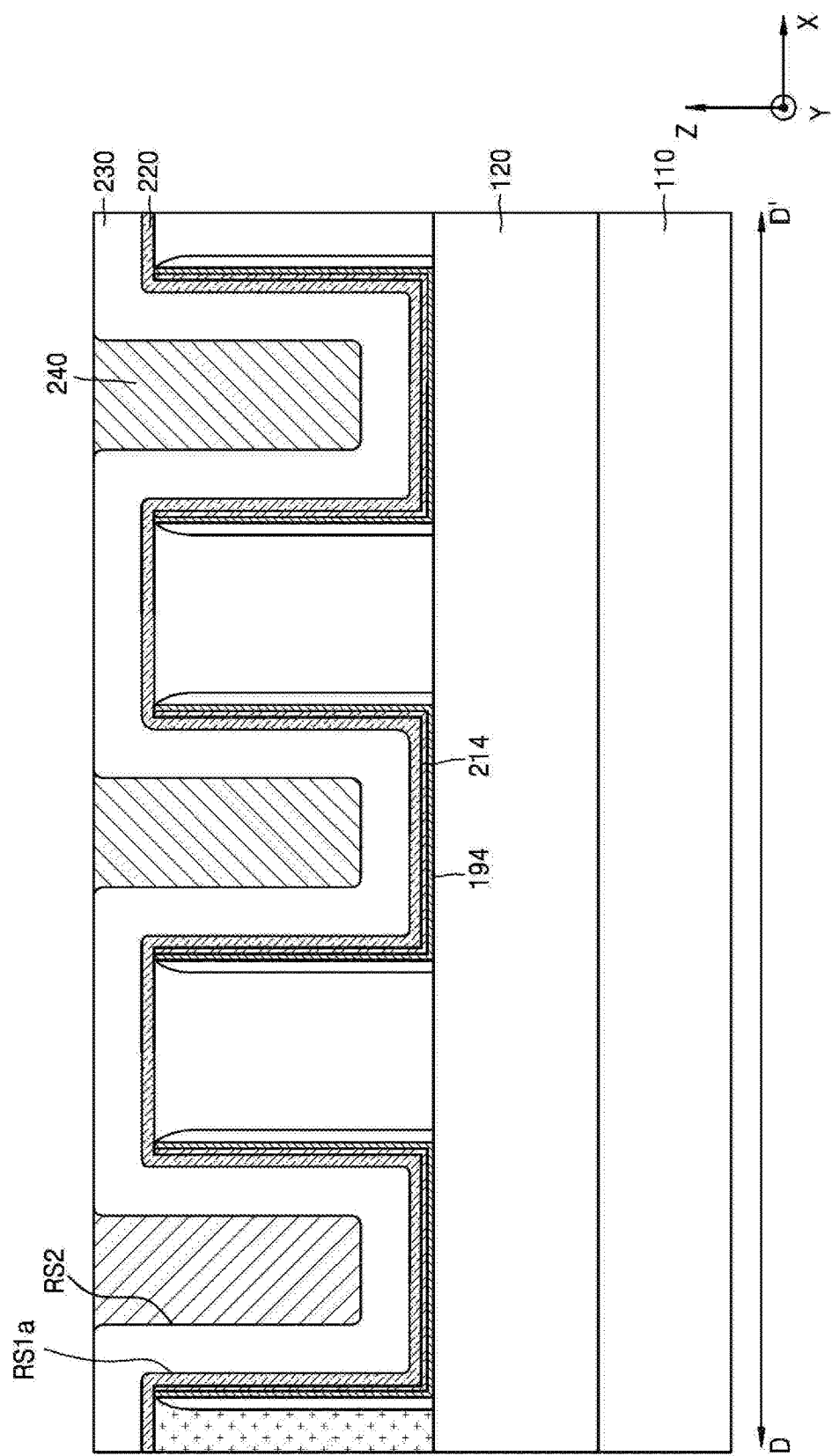
Figure 14A:
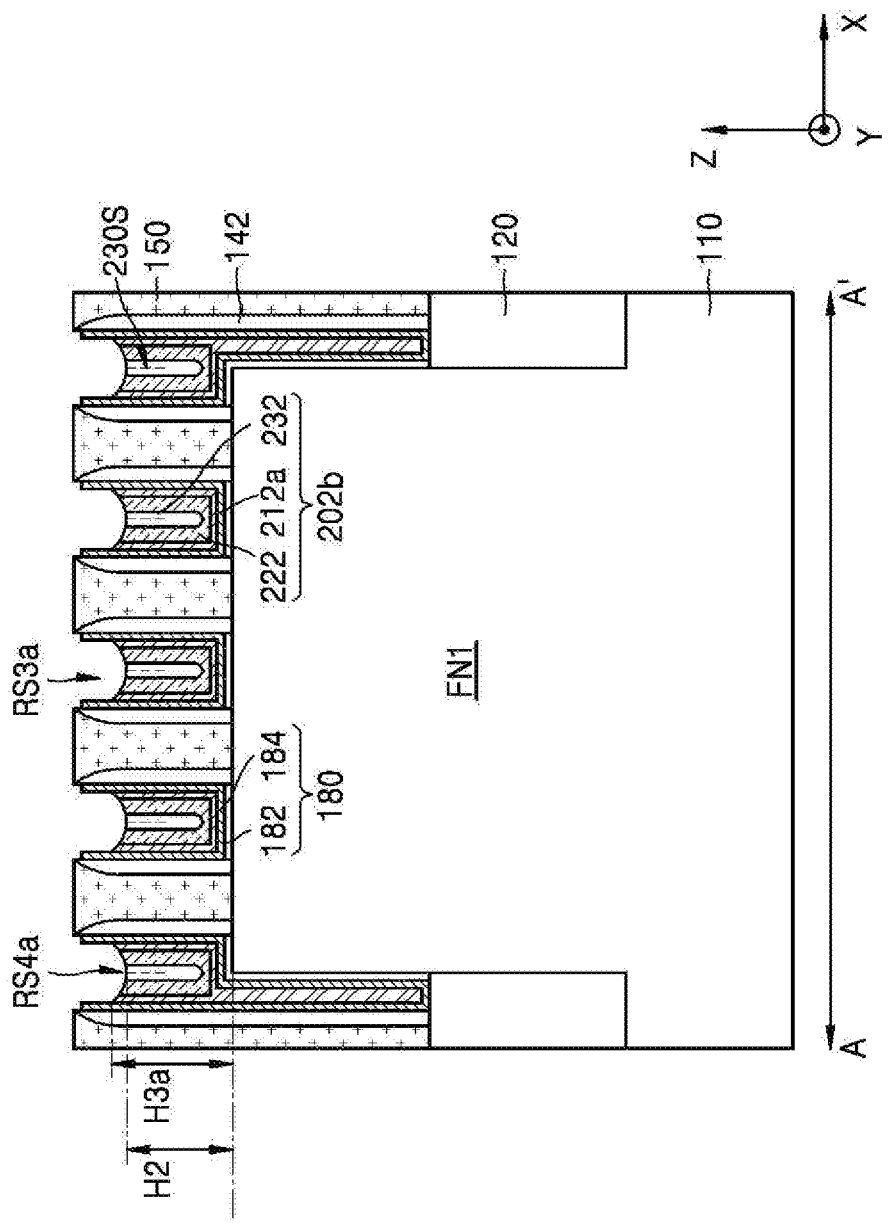
Figure 14B:
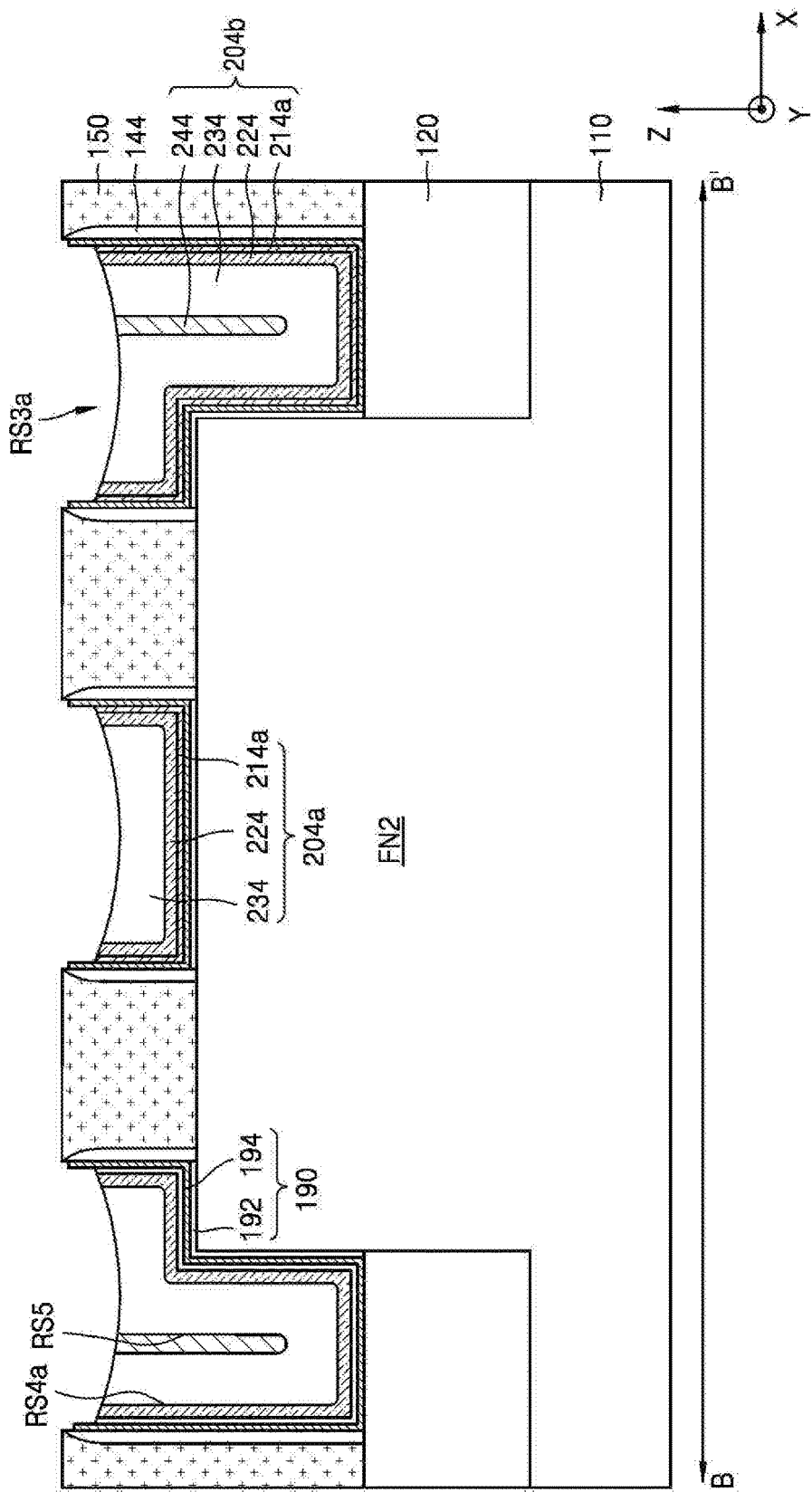
Figure 14C:
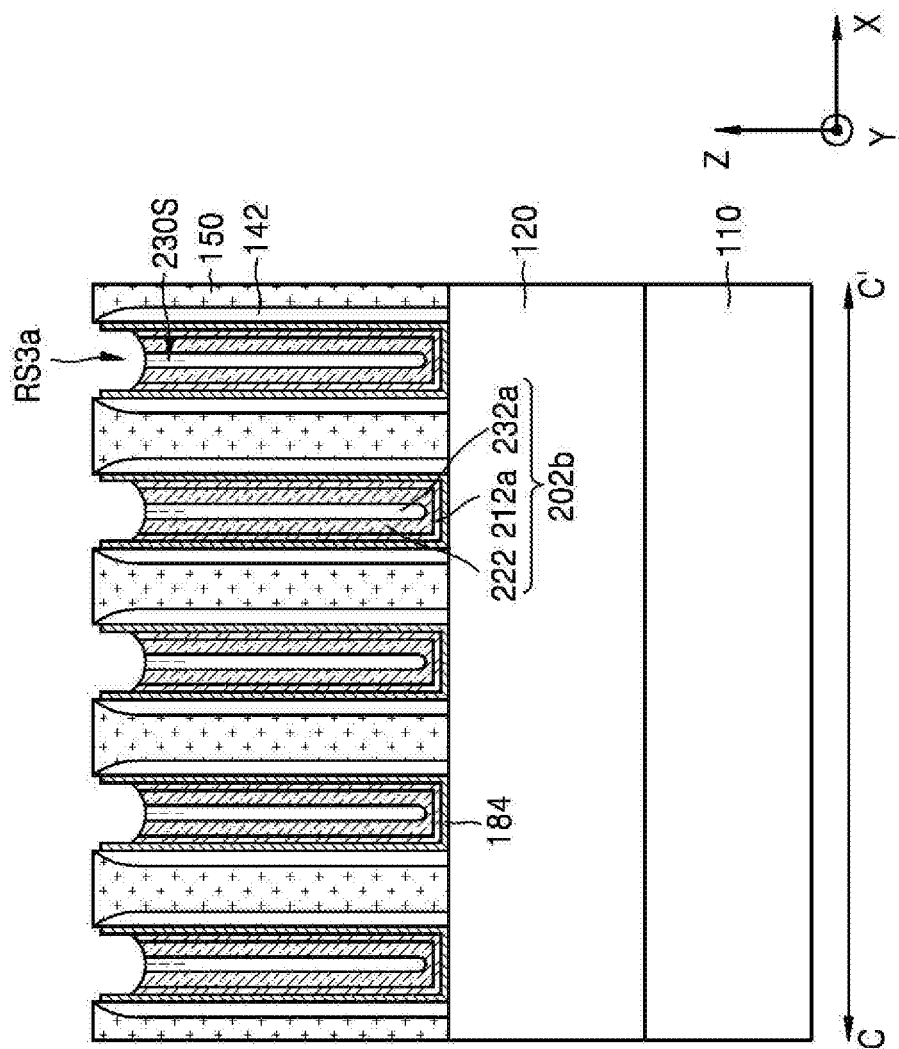
Figure 14D:
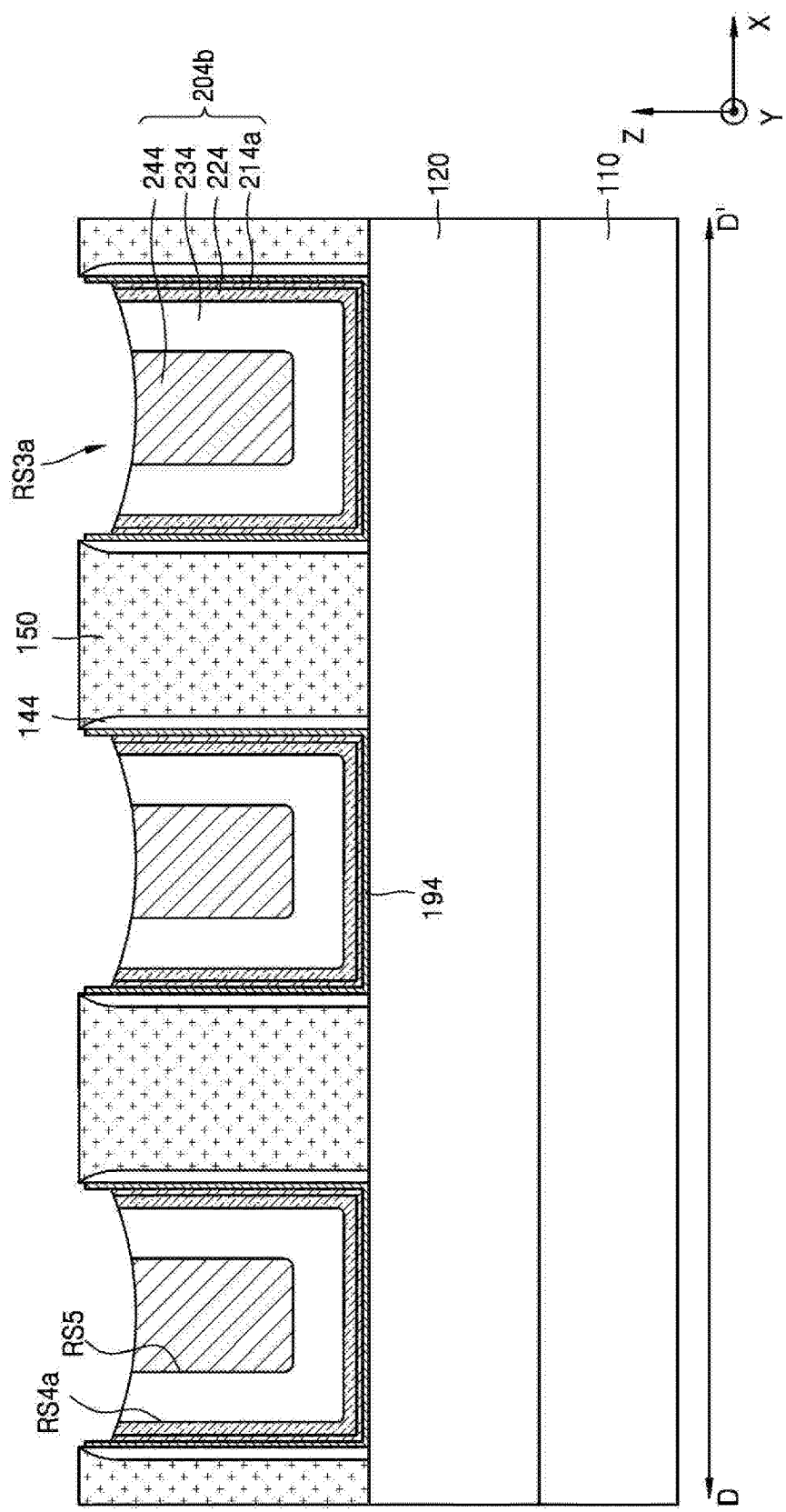
Figure 15A:
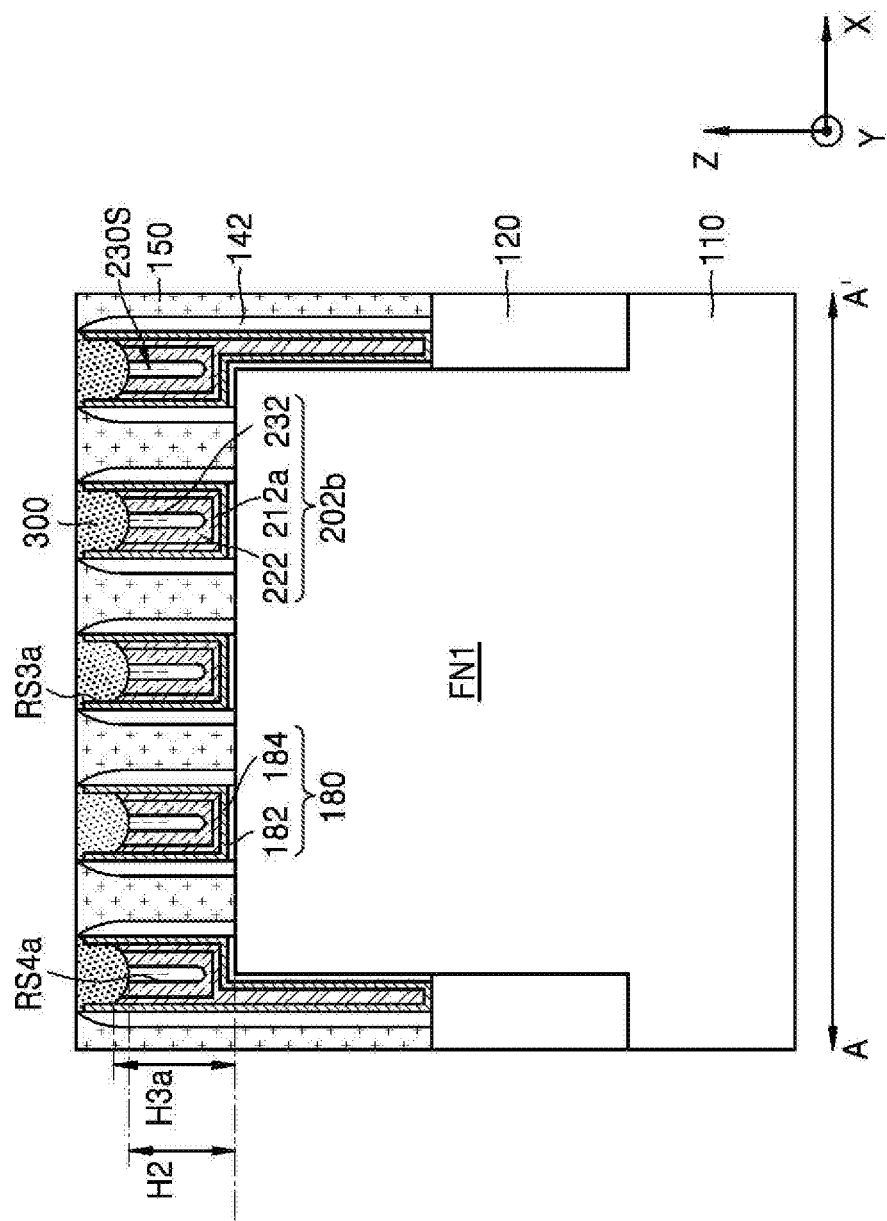
Figure 15C:
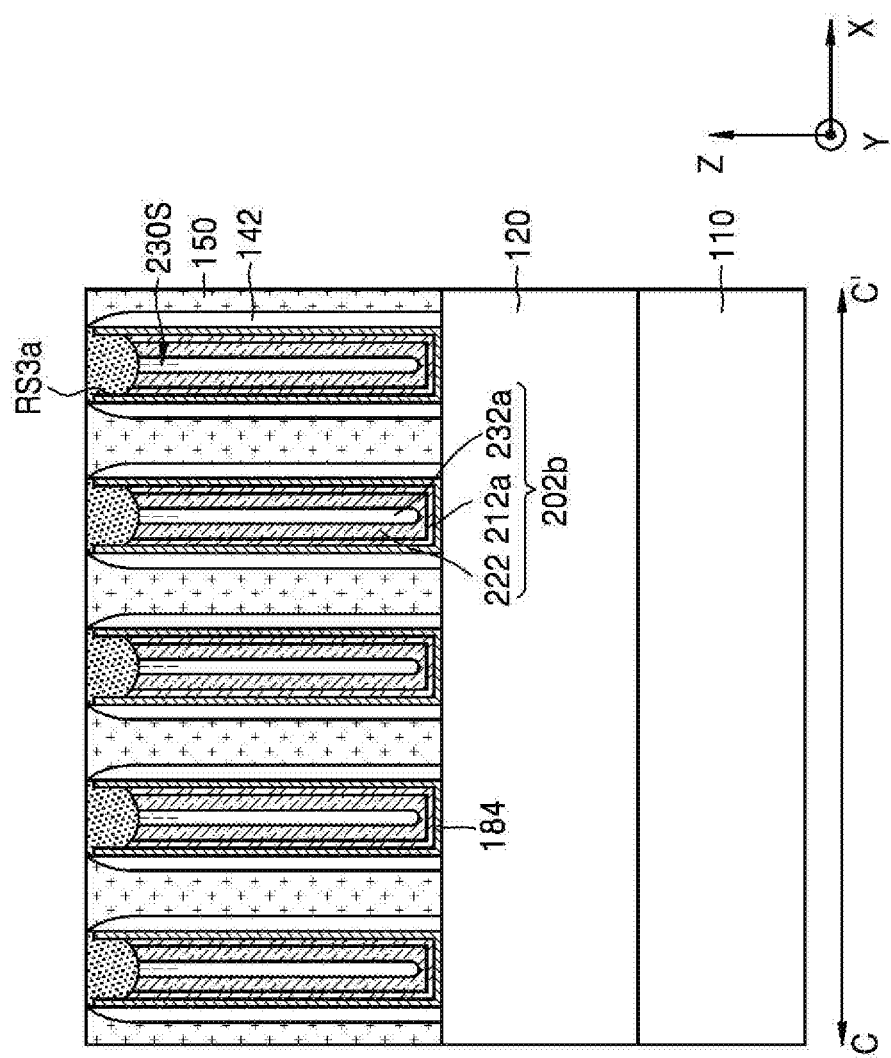
Figure 15D:
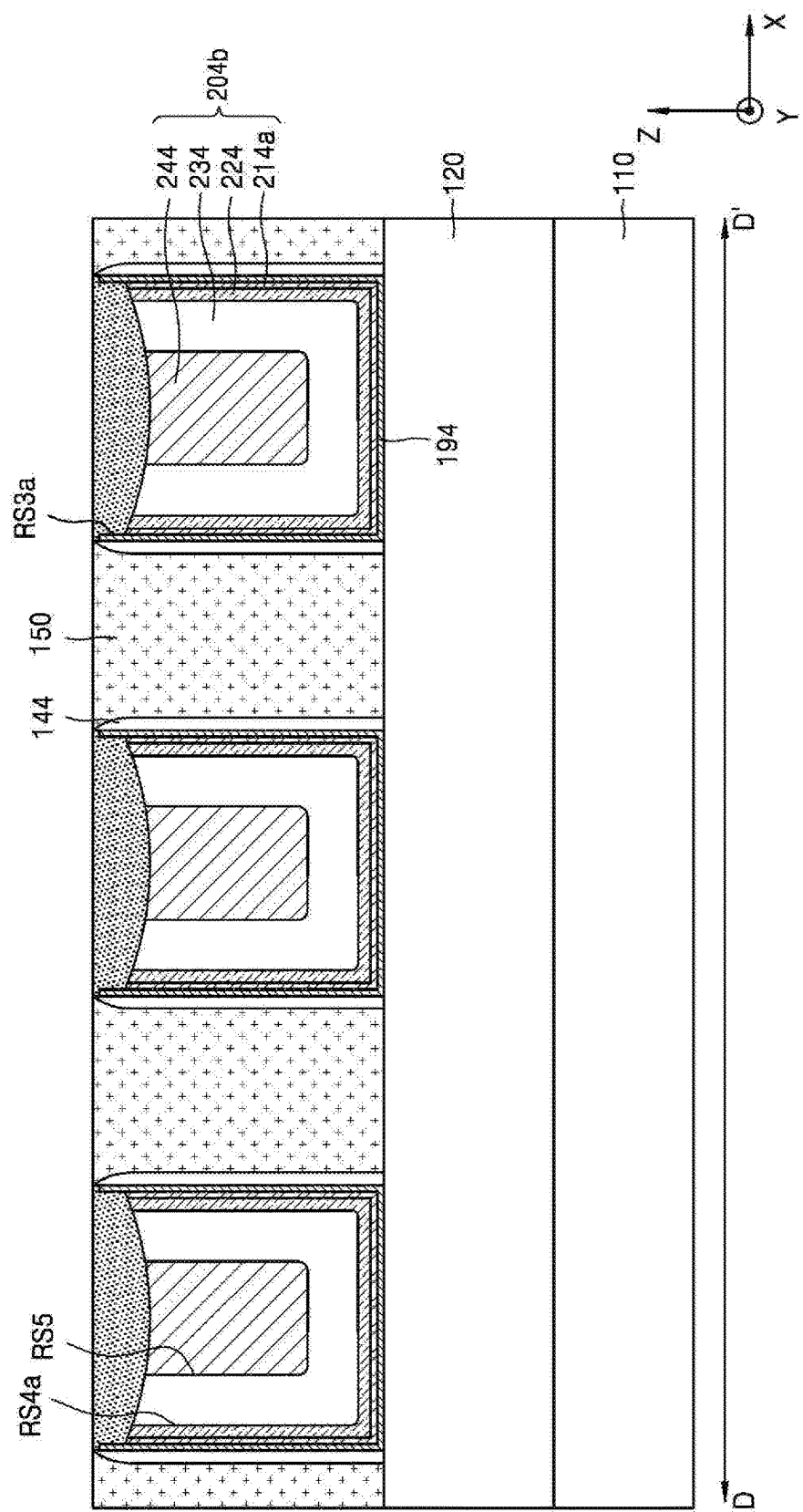

FIGS. 13A through 15D are cross-sectional views sequentially illustrating a method of manufacturing a semiconductor device, according to an exemplary embodiment of the inventive concepts. Specifically, FIGS. 13A and 15A are cross-sectional views taken along a line A-A' of FIG. 1A, FIGS. 13B and 15B are cross-sectional views taken along a line B-B' of FIG. 1B, FIGS. 13C and 15C are cross-sectional views taken along a line C-C' of FIG. 1A, and FIGS. 13D and 15D are cross-sectional views taken along a line D-D' of FIG. 1B. Accordingly, FIGS. 13A, 15A, 13C, and 15C are cross-sectional views illustrating the first region I of FIG. 1A, and FIGS. 13B, 15B, 13D, and 15D are cross-sectional views illustrating the second region II of FIG. 1B. Among descriptions of FIGS. 13A through 15D, descriptions overlapping with those of FIGS. 3A through 10D may be omitted.

FIGS. 13A through 13D are cross-sectional views illustrating a process of forming a gate material layer, according to an exemplary embodiment of the inventive concepts.

Referring to FIGS. 13A through 13D, the top of a first barrier layer 212a may have a level same as or similar to that of the top of an interlayer insulating layer 150 and/or a first gate spacer layer 142. Accordingly, the first barrier layer 212a and a second barrier layer 214 may have same or similar level.

A first gate material layer 220 may be formed to have a uniform thickness to define a first recess space RS1a in a space between a pair of gate spacer layers 142 and a space between a pair of gate spacer layers 144 while covering the substrate 110. The first recess space RS1a may extend and have a constant width from the top thereof to the bottom thereof.

A second gate material layer 230 may completely fill the first recess space RS1a in the first region I. Accordingly, the second gate material layer 230 may extend and have a relatively constant width from the top thereof to the bottom thereof within the first recess space RS1a.

FIGS. 14A through 14D are cross-sectional views illustrating a process of forming a gate line, according to an exemplary embodiment of the inventive concept.

Referring to FIGS. 14A through 14D, a first gate line 202b and second gate lines 204a, and 204b are formed by partially removing the barrier layers 212a and 214 and the first through third gate material layers 220, 230, and 240 shown in FIGS. 14A through 14D. As the barrier layers 212a and 214 and the first through third gate material layers 220, 230, and 240, shown in FIGS. 13A through 13D, are partially removed, a third recess space RS3a may be defined between a pair of gate spacer layers 192 and 194. The upper surfaces of the first and second gate lines 202b, 204a, and 204b may have a level lower than those of the tops of the pair of gate spacer layers 192 and 194. The upper surface of each of the first and second gate lines 202b, 204a, and 204b may have a concave shape at a central portion thereof.

The first gate line 202b may include a first barrier layer 212a, a first gate electrode layer 222 defining a fourth recess space RS4a, and a second gate electrode layer 232a filling the fourth recess space RS4a. The fourth recess space RS4a defined by the first gate electrode layer 222 may extend and have a relatively constant width from the top thereof to the bottom thereof. Accordingly, the second gate electrode layer 232a formed in the fourth recess space RS4a may extend and have a relatively constant width from the top thereof to the bottom thereof within the fourth recess space RS4a.

The top of the first barrier layer 212a may have a height same as or similar to that of the top of the first gate electrode layer 222.

The second gate line 204a may include a second barrier layer 214a, the first gate electrode layer 222 defining the fourth space RS4a, a second gate electrode layer 234 defining a fifth recess space RS5 while covering the inside wall of the fourth recess space RS4, and a third gate electrode layer 244 filling the fifth recess space RS5.

FIGS. 15A through 15D are cross-sectional views illustrating a process of forming a gate capping layer, according to an exemplary embodiment of the inventive concept.

Referring to FIGS. 15A through 15D, a gate capping layer 300 is formed on the gate lines 202b, 204a, and 204b. The upper surface of the gate capping layer 300 may have a level same as those of the tops of the gate spacer layers 142 and 144.

Figure 16A:
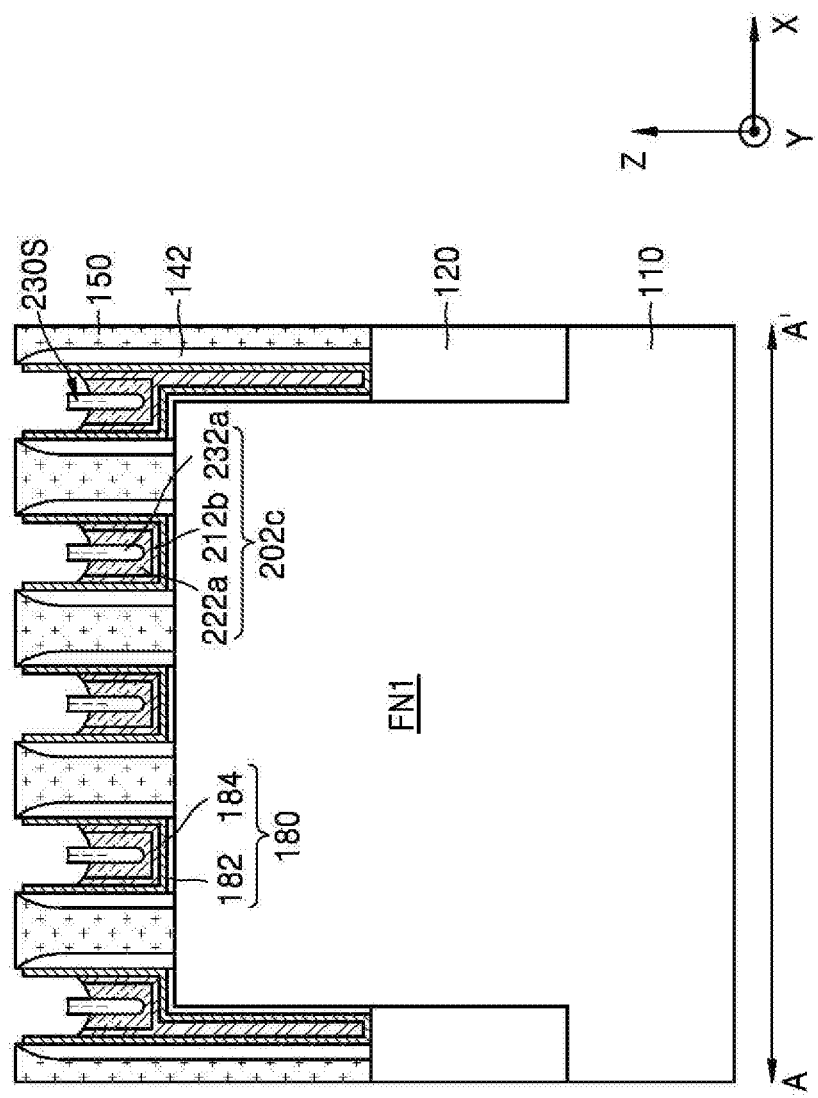
FIGS. 16A through 17D are cross-sectional views sequentially illustrating a method of manufacturing a semiconductor device, according to an exemplary embodiment of the inventive concepts.
Figure 16B:
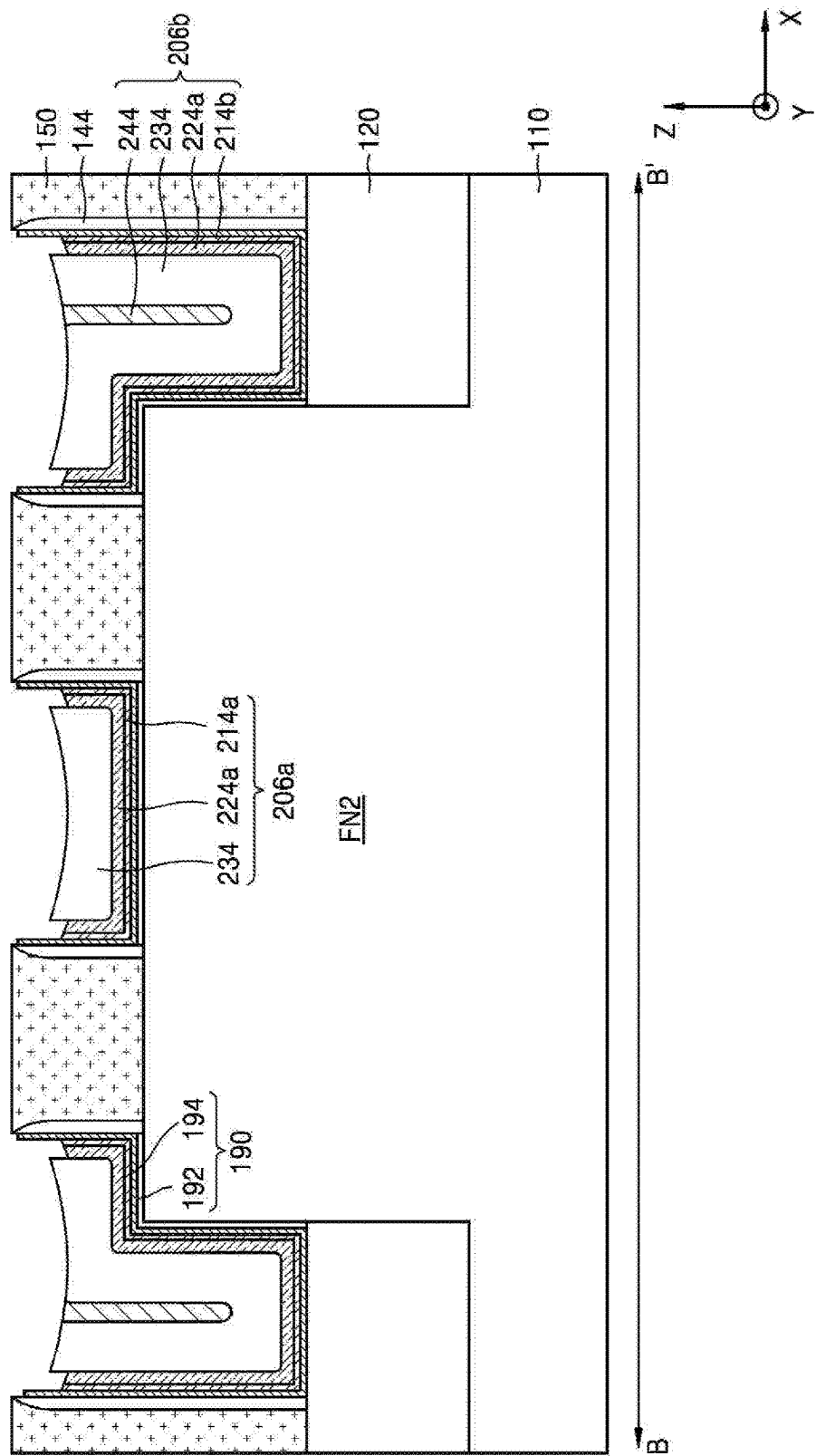
Figure 16C:
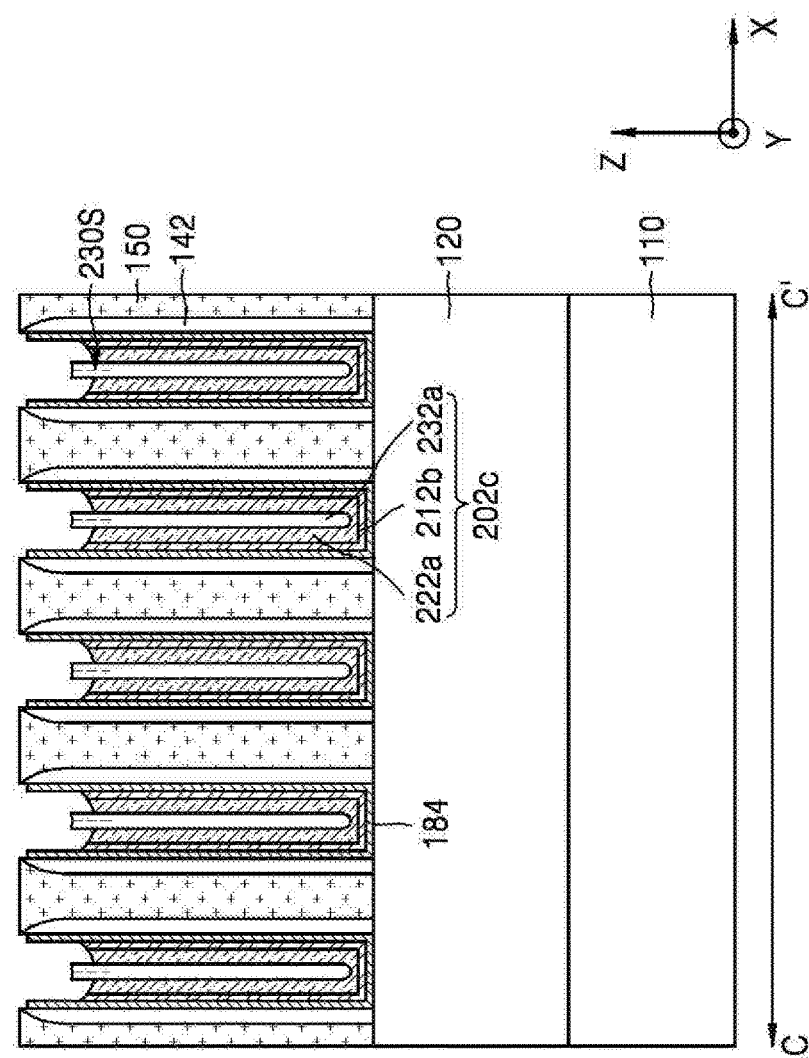
Figure 17A:
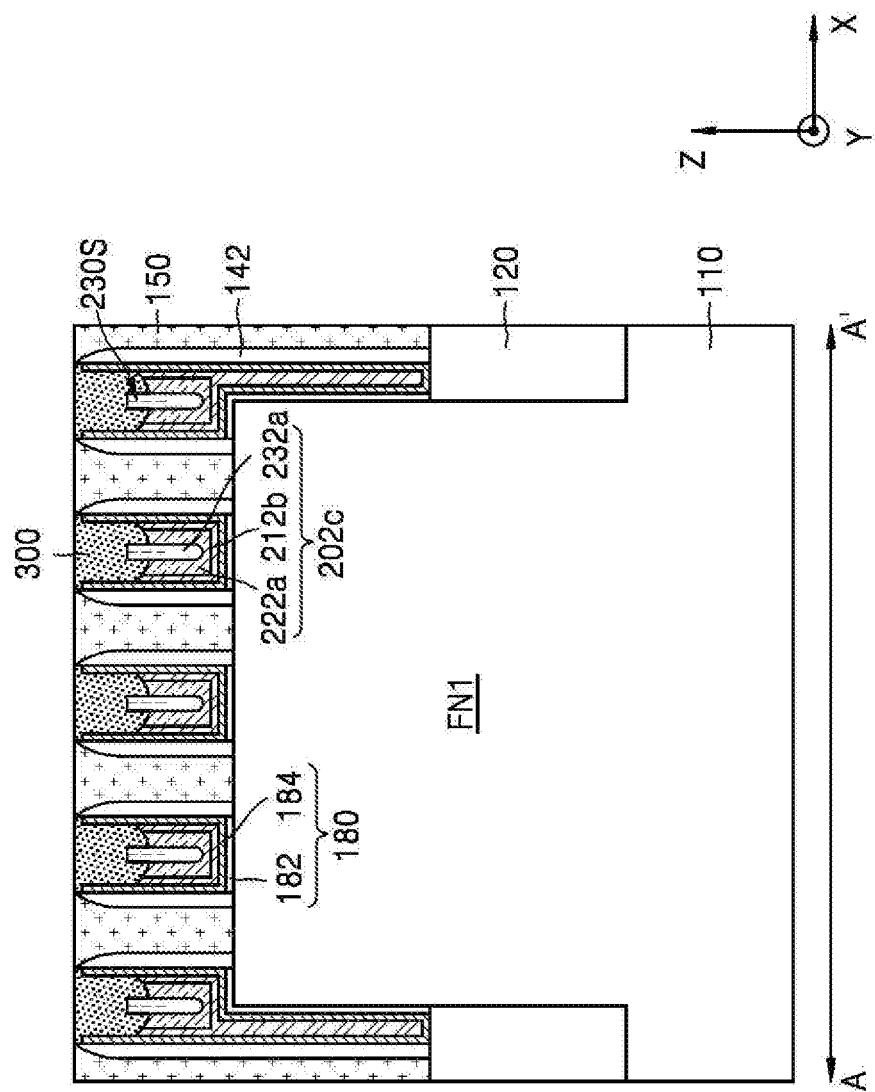
Figure 17B:
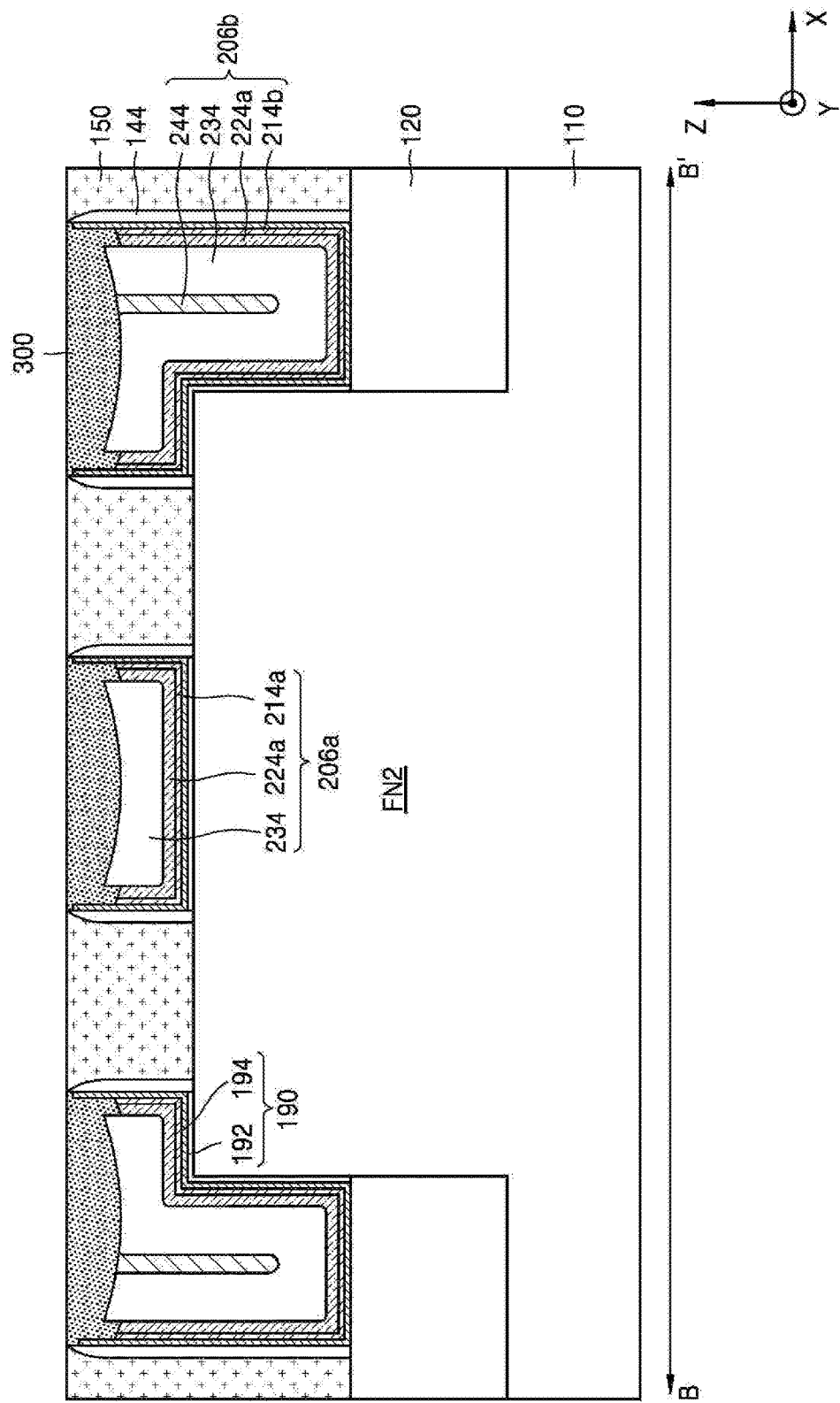
Figure 17C:
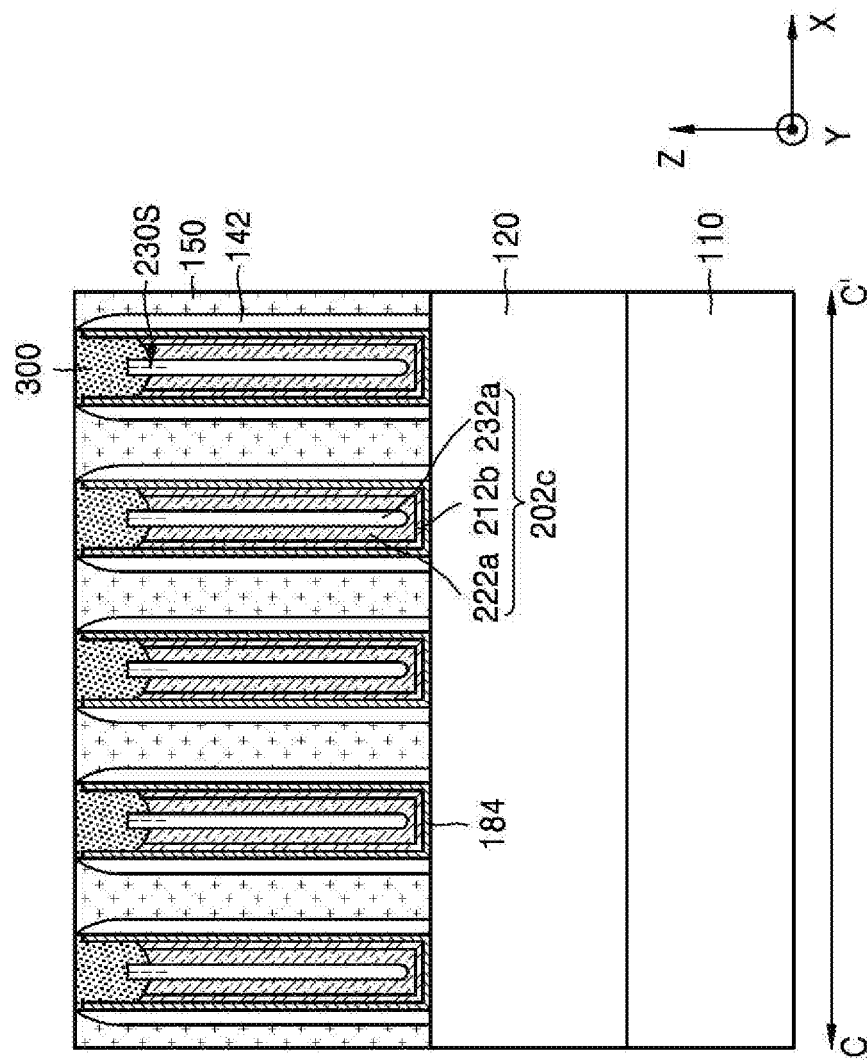

FIGS. 16A through 17D are cross-sectional views sequentially illustrating a method of manufacturing a semiconductor device, according to an exemplary embodiment of the inventive concepts. Specifically, FIGS. 16A and 17A are cross-sectional views taken along a line A-A' of FIG. 1A, FIGS. 16B and 17B are cross-sectional views taken along a line B-B' of FIG. 1B, FIGS. 16C and 17C are cross-sectional views taken along a line C-C' of FIG. 1A, and FIGS. 16D and 17D are cross-sectional views taken along a line D-D' of FIG. 1B. Accordingly, FIGS. 16A, 17A, 16C, and 17C are cross-sectional views illustrating the first region I of FIG. 1A, and FIGS. 16B, 17B, 16D, and 17D are cross-sectional views illustrating the second region II of FIG. 1B. Among descriptions of FIGS. 16A through 17D, descriptions overlapping with those of FIGS. 3A through 15D may be omitted.

FIGS. 16A through 16D are cross-sectional views illustrating a process of forming a gate line, according to an exemplary embodiment of the inventive concepts. Specifically, FIGS. 16A through 16D are cross-sectional view illustrating a process performed after the process of FIGS. 14A through 14D.

Referring to FIGS. 16A through 16D, gate lines 202c, 206a, and 206b have irregular shapes in which second gate electrode layers 232a and 234 protrude from first gate electrode layers 222a and 224a. Accordingly, the upper surfaces of the second gate electrode layers 232a and 234 may have levels higher than those of the first gate electrode layers 222a and 224a with respect to the substrate 110.

FIGS. 17A through 17D are cross-sectional views illustrating a process of forming a gate capping layer, according to an exemplary embodiment of the inventive concept.

Referring to FIGS. 17A through 17D, a gate capping layer 300 is formed on the gate lines 202c, 206a, and 206b. The upper surface of the gate capping layer 300 may have same level as the tops of gate spacer layers 142 and 144.

Figure 18:
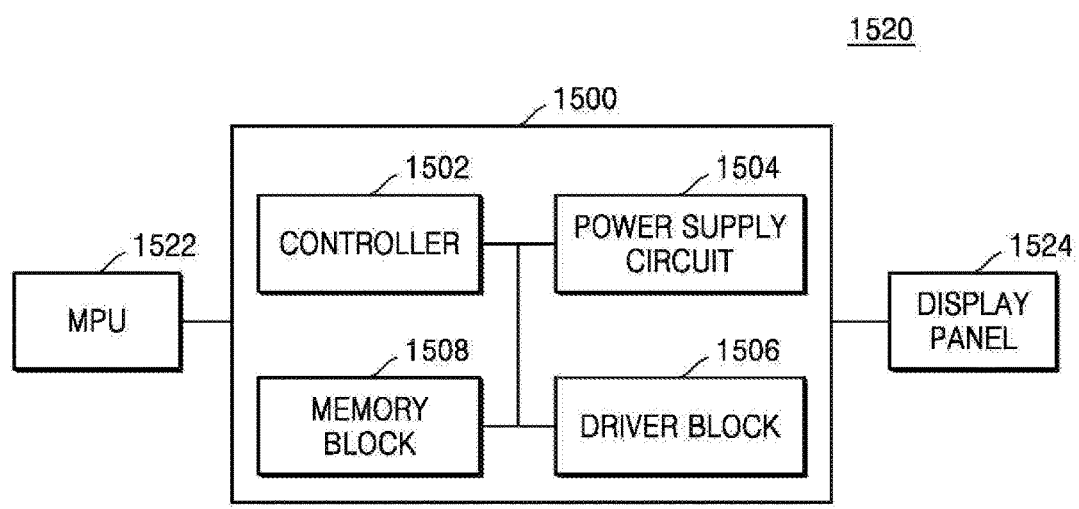
FIG. 18 is a block diagram of a displayer driver IC (DDI) and a display apparatus including the DDI, according to an exemplary embodiment of the inventive concepts.

FIG. 18 is a block diagram of a displayer driver IC (DDI) 1500 and a display apparatus 1520 including the DDI 1500, according to an exemplary embodiment of the inventive concepts.

Referring to FIG. 18, the DDI 1500 may include a controller 1502, a power supply circuit 1504, a driver block 1506, and a memory block 1508. The controller 1502 may receive and decode a command from a main processing unit (MPU) 1522, and control each block of the DDI 1500 to perform an operation according to the decoded command. The power supply circuit unit 1504 may generate a driving voltage in response to control of the controller 1502. The driver block 1506 may drive a display panel 1524 by using the driving voltage generated by the power supply circuit unit 1504 in response to the control of the controller 1502. The display panel 1524 may be a liquid crystal display panel, a plasma display panel, or an organic light emitting diode (OLED) panel. The memory block 1508 may be a block that temporarily stores the command input to the controller 1502 or control signals output from the controller 1502 or stores necessary data, and may include a memory such as random-access memory (RAM) or read-only memory (ROM). At least one selected from the power supply circuit unit 1504 and the driver block 1506 may include at least one of the semiconductor devices 1, 1a, and 1b according to the exemplary embodiments of the inventive concepts described with reference to FIGS. 1A through 17B or at least one of semiconductor devices modified or changed from the semiconductor devices 1, 1a, and 1b.

Figure 19:
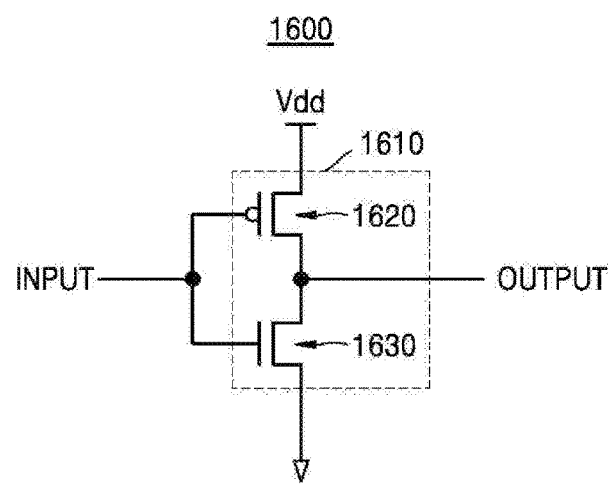
FIG. 19 is a circuit diagram of a complementary metal-oxide semiconductor (CMOS) inverter according to an exemplary embodiment of the inventive concepts.

FIG. 19 is a circuit diagram of a complementary metal-oxide semiconductor (CMOS) inverter 1600 according to an exemplary embodiment of the inventive concept.

The CMOS inverter 1600 may include a CMOS transistor 1610. The CMOS transistor 1610 may include a PMOS transistor 1620 and an NMOS transistor 1630 that are connected between a power terminal Vdd and a ground terminal. The CMOS transistor 1610 may include at least one of the semiconductor devices 1, 1a, and 1b according to the exemplary embodiments of the inventive concepts described with reference to FIGS. 1A through 17B or at least one of semiconductor devices modified or changed from the semiconductor devices 1, 1a, and 1b.

Figure 20:
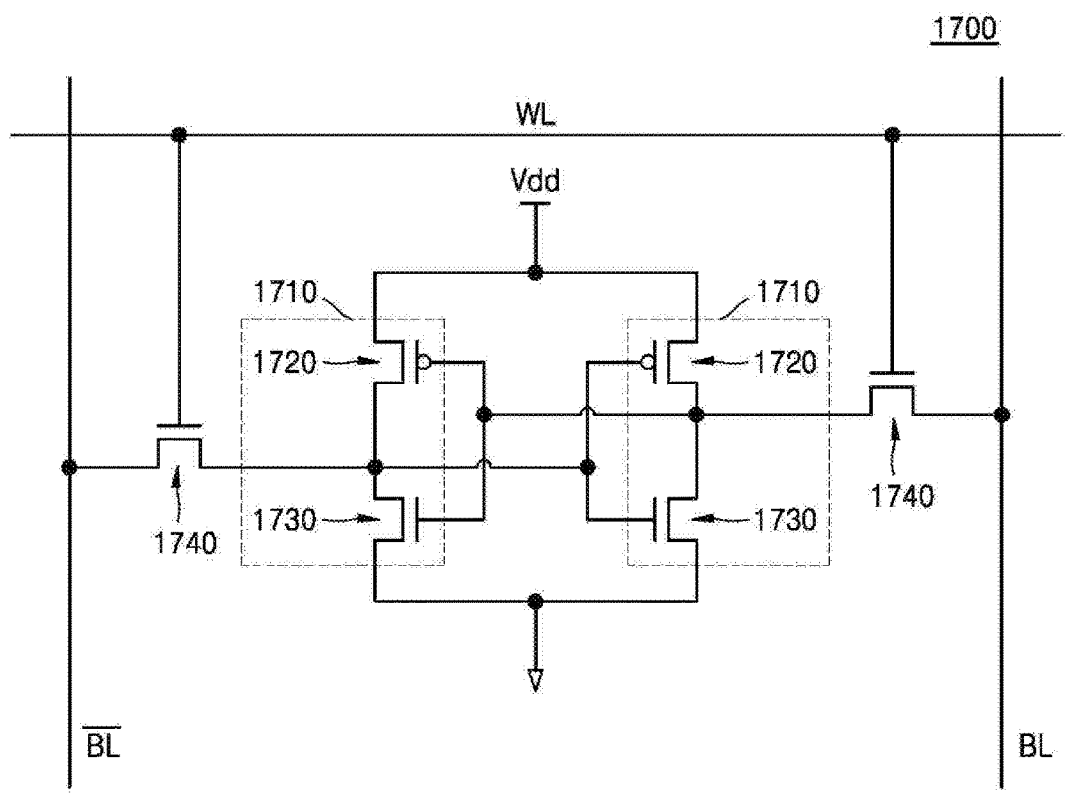
FIG. 20 is a circuit diagram of a CMOS static RAM (SRAM) device according to an exemplary embodiment of the inventive concepts.

FIG. 20 is a circuit diagram of a CMOS static RAM (SRAM) device 1700 according to an exemplary embodiment of the inventive concept.

The CMOS SRAM device 1700 may include a pair of driving transistors 1710. Each of the pair of driving transistors 1710 may include a PMOS transistor 1720 and an NMOS transistor 1730 that are connected between the power terminal Vdd and a ground terminal. The CMOS SRAM device 1700 may further include a pair of transmission transistors 1740. A source of the transmission transistors 1740 may be cross-connected to a common node of the PMOS transistor 1720 and the NMOS transistor 1730 of the driving transistor 1710. The power terminal Vdd may be connected to a source of the PMOS transistor 1720, and the ground terminal may be connected to a source of the NMOS transistor 1730. A word line WL may be connected to gates of the pair of transmission transistors 1740, and a bit line BL and an inverted bit line /BL may be respectively connected to respective drains of the pair of transmission transistors 1740.

At least one selected from the driving transistors 1710 and the transmission transistors 1740 of the CMOS SRAM device 1700 may include at least one of the semiconductor devices 1, 1a, and 1b according to the exemplary embodiments of the inventive concepts described with reference to FIGS. 1A through 17B or at least one of semiconductor devices modified or changed from the semiconductor devices 1, 1a, and 1b.

Figure 21:
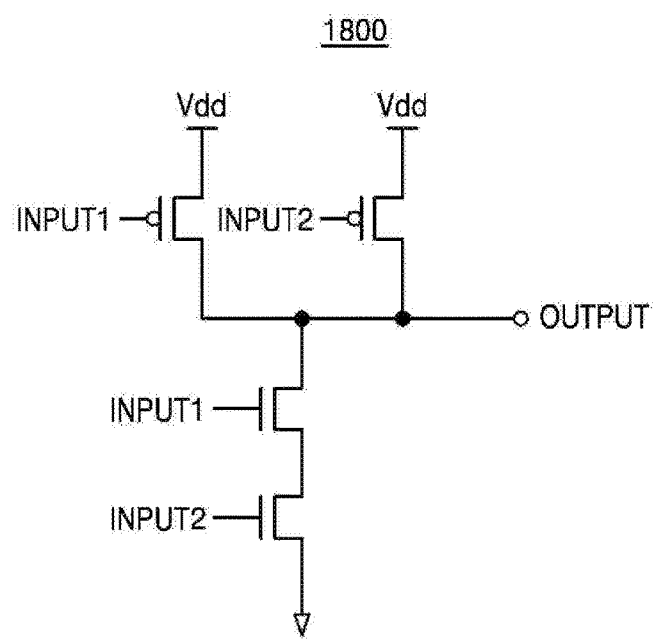
FIG. 21 is a circuit diagram of a CMOS NAND circuit according to an exemplary embodiment of the inventive concepts.

FIG. 21 is a circuit diagram of a CMOS NAND circuit 1800 according to an exemplary embodiment of the inventive concept.

The CMOS NAND circuit 1800 may include a pair of CMOS transistors to which different input signals are transmitted. The CMOS NAND circuit 1800 may include at least one of the semiconductor devices 1, 1a, and 1b according to the exemplary embodiments of the inventive concepts described with reference to FIGS. 1A through 17B or at least one of semiconductor devices modified or changed from the semiconductor devices 1, 1a, and 1b.

Figure 22:
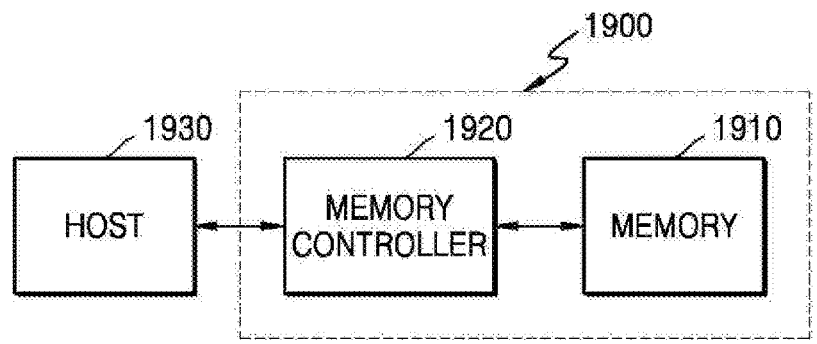
FIG. 22 is a block diagram of an electronic system according to an exemplary embodiment of the inventive concepts.
Figure 22:
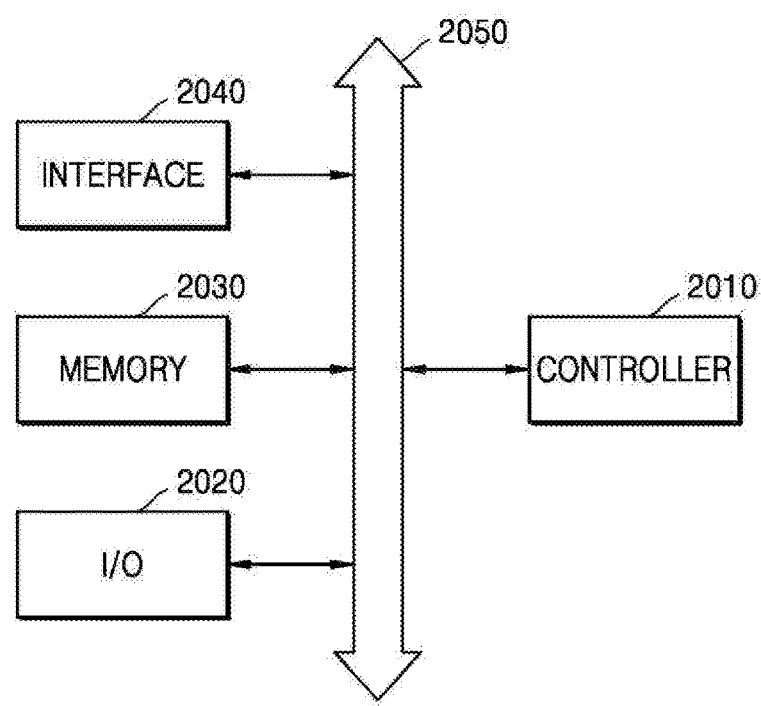

FIG. 22 is a block diagram of an electronic system 1900 according to an exemplary embodiment of the inventive concept.

The electronic system 1900 may include a memory 1910 and a memory controller 1920. The memory controller 1920 may control the memory 1910 to read and/or write data from or to the memory 1910 in response to a request of a host 1930. At least one selected from the memory 1910 and the memory controller 1920 may include at least one of the semiconductor devices 1, 1a, and 1b according to the exemplary embodiments of the inventive concept described with reference to FIGS. 1A through 17B or at least one of semiconductor devices modified or changed from the semiconductor devices 1, 1a, and 1b.

FIG. 23 is a block diagram of an electronic system 2000 according to an exemplary embodiment of the inventive concept.

The electronic system 2000 may include a controller 2010, an input/output (I/O) device 2020, a memory 2030, and an interface 2040, which are connected to one another via a bus 2050.

The controller 2010 may include at least one selected from a microprocessor, a digital signal processor, and a processor similar to the microprocessor and the digital signal processor. The I/O device 2020 may include at least one of a keypad, a keyboard, and a display. The memory 2030 may be used in storing a command executed by the controller 2010. For example, the memory 2030 may be used to store user data.

The electronic system 2000 may be a wireless communication apparatus or an apparatus capable of transmitting and/or receiving information in a wireless communication environment. In order for the electronic system 2000 to transmit or receive data over a wireless communication network, the interface 2040 may be a wireless interface. The interface 2040 may include an antenna and/or a wireless transceiver. In some embodiments, the electronic system 2000 may use a communication interface protocol of a $3^{rd}$ generation communication system such as a code division multiple access (CDMA), global system for mobile communications (GSM), North American digital cellular (NADC), extended-time division multiple access E-TDMA, and/or wide band code division multiple access (WCDMA). The electronic system 2000 may include at least one of the semiconductor devices 1, 1a, and 1b according to the exemplary embodiments of the inventive concepts described with reference to FIGS. 1A through 17B or at least one of semiconductor devices modified or changed from the semiconductor devices 1, 1a, and 1b. While the inventive concepts have been particularly shown and described with reference to exemplary embodiments thereof, it will be understood that various changes in form and details may be made herein without departing from the spirit and scope of the following claims.

What is claimed is:

1. A semiconductor device comprising:
a substrate having a fin-type active region;
a gate insulating layer that covers at least a portion of an upper surface and side portions of the fin-type active region;
a gate line that extends and intersects the fin-type active region while covering at least the portion of the upper surface and the side portions of the fin-type active region, the gate line being on the gate insulating layer; and
a pair of gate spacer layers at side portions of the gate line,
wherein the gate insulating layer extends from between the fin-type active region and the gate line to between the pair of gate spacer layers and the gate line,
wherein a central portion of an upper surface of the gate line in a cross-section perpendicular to an extending direction of the gate line has a concave shape,
wherein the gate line comprises:
a first gate electrode layer that extends while covering the upper surface and the side portions of the fin-type active region and sides of the pair of gate spacer layers, the sides of the pair of gate spacer layers facing each other and the first gate electrode layer defining a recess space; and
a second gate electrode layer that extends while filling the recess space, wherein an upper surface of the second gate electrode layer in a cross-section perpendicular to the extending direction of the gate line has a concave shape, and the second gate electrode layer is spaced apart from the gate spacer layers by the first gate electrode layer, and
wherein a level of an upper surface of the first gate electrode layer with respect to the substrate is gradually reduced such that an inner region of the upper surface of the first gate electrode layer is lower in vertical position relative to an outer region of the upper surface of the first gate electrode, and
wherein a part of an upper surface of the first gate electrode layer, the part being adjacent to the gate insulating layer, has a level higher than that of a part adjacent to the second gate electrode layer with respect to the substrate.

2. The semiconductor device of claim 1, wherein a central portion of the second gate electrode layer in a cross-section perpendicular to an extending direction of the gate line has a level lower than that of an outer portion thereof with respect to the substrate.

3. The semiconductor device of claim 1, wherein the upper surface of the first gate electrode layer and an upper surface of the second gate electrode layer form a continuous surface.

4. The semiconductor device of claim 3, wherein a level of the continuous surface with respect to the substrate is gradually reduced from a part adjacent to the gate insulating layer to a central portion of the second gate electrode layer.

5. The semiconductor device of claim 1, wherein the gate line has an irregular shape in which the second gate electrode layer protrudes in a vertical direction from the first gate electrode layer.

6. The semiconductor device of claim 5, wherein an upper surface of the second gate electrode layer has a level higher than that of an upper surface of the first gate electrode layer with respect to the substrate.

7. The semiconductor device of claim 1, wherein a central portion of the second gate electrode layer has a seam that extends from an upper surface of the second gate electrode layer to an inner region thereof.

8. The semiconductor device of claim 1, wherein the gate line further comprises a barrier layer between the first gate electrode layer and the pair of gate spacer layers.

9. The semiconductor device of claim 1, wherein the upper surface of the gate line has a level lower than those of tops of the pair of gate spacer layers,
wherein the semiconductor device further comprises an insulating gate capping layer formed on the gate line and having an upper surface whose level is same as those of the tops of the pair of gate spacer layers.

10. A semiconductor device comprising:
a substrate having a fin-type active region;
a device isolation layer on the substrate, the device isolation layer covering a lower portion of the fin-type active region;
a pair of gate spacer layers that extend while intersecting the fin-type active region, the pair of gate spacer layers being on the device isolation layer and the substrate;
a gate insulating layer that has a uniform thickness and covers at least a portion of each of sides of the pair of gate spacer layers, the pair of gate space layers facing each other, and an upper surface and both sides of the fin-type active region, the gate insulating layer being positioned between the pair of gate spacer layers; and
a gate line that extends between the pair of gate spacer layers, the gate line being on the gate insulating layer,
wherein the gate line comprises: a first gate electrode layer that extends while covering the at least a portion of the each of the sides of the pair of gate spacer layers and the upper surface and the both sides of the fin-type active region, the first gate electrode layer defining a recess space; and a second gate electrode layer that extends while filling the recess space,
wherein a central portion of the second gate electrode layer in a cross-section perpendicular to an extending direction of the gate line has a level lower than that of an outer portion thereof with respect to the substrate and an upper surface of the gate line in a cross-section perpendicular to an extending direction of the gate line has a concave shape, wherein an upper surface of the second gate electrode layer in a cross-section perpendicular to the extending direction of the gate line has a concave shape and the second gate electrode layer is spaced apart from the gate spacer layers by the first gate electrode layer, and
wherein an upper surface of the first gate electrode extends between the gate insulating layer and the second gate electrode and a part of the upper surface of the first gate electrode layer adjacent to the second gate electrode is lower in vertical position relative to a part of the upper surface of the first gate electrode layer adjacent to the gate insulating layer.

11. The semiconductor device of claim 10, wherein an upper surface of the first gate electrode layer and an upper surface of the second gate electrode layer form a continuous surface, and a top of the first gate electrode layer has a level higher than that of the top of the second gate electrode layer.

12. The semiconductor device of claim 10, wherein an upper surface of the second gate electrode layer has a level higher than that of an upper surface of the first gate electrode layer with respect to the substrate, so that the second gate electrode layer has an irregular shape protruding from the first gate electrode layer.

13. A semiconductor device comprising:
a substrate having a plurality of fin-type active regions protruding in a vertical direction relative to a primary surface of the substrate, the fin-type active regions each extending in a first horizontal direction;
a gate insulating layer that covers at least a portion of an upper surface and side portions of the fin-type active regions;
a gate line that extends in a second horizontal direction transverse the first horizontal direction, the gate line intersecting the plurality of fin-type active regions and covering the gate insulating layer on at least the portion of the upper surface and the side portions of the fin-type active region; and
gate spacer layers at side portions of the gate line,
wherein the gate line has a first portion having a first width and a second portion having a second width, the second width less than the first width, the second portion of the gate line positioned on the first portion of the gate line,
wherein an upper surface of the first portion of the gate line has a concave cross-section in the first horizontal direction so that an inner region of the upper surface of the first portion of the gate line is lower in vertical position relative to an outer edge region thereof,
wherein an upper surface of the second portion of the gate line has a concave cross-section in the first horizontal direction so that an inner region of the upper surface of the second portion of the gate line is lower in vertical position relative to an outer edge region thereof, and
wherein the gate insulating layer extends from between the fin-type active region and the gate line between the gate spacer layers, and the second portion of the gate line is spaced apart from the gate spacer layers by the first portion of the gate line.

14. The semiconductor device of claim 13, wherein the second portion of the gate line is positioned on the first portion of the gate line at a central region of the first portion of the gate line.

15. The semiconductor device of claim 13, wherein the first portion of the gate line and the second portion of the gate line have a stepped cross-section in the first horizontal direction.

16. The semiconductor device of claim 13, further comprising trench isolation structures between the plurality of fin-type active regions.

* * * * *